US012580366B2

(12) United States Patent
Hirose et al.

(10) Patent No.: US 12,580,366 B2
(45) Date of Patent: Mar. 17, 2026

(54) SEMICONDUCTOR LASER ELEMENT

(71) Applicant: HAMAMATSU PHOTONICS K.K., Hamamatsu (JP)

(72) Inventors: Kazuyoshi Hirose, Hamamatsu (JP); Hiroki Kamei, Hamamatsu (JP); Takahiro Sugiyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 443 days.

(21) Appl. No.: 18/029,141

(22) PCT Filed: Sep. 28, 2021

(86) PCT No.: PCT/JP2021/035673

§ 371 (c)(1),
(2) Date: Mar. 29, 2023

(87) PCT Pub. No.: WO2022/071330

PCT Pub. Date: Apr. 7, 2022

(65) Prior Publication Data

US 2023/0369825 A1     Nov. 16, 2023

(30) Foreign Application Priority Data

Oct. 2, 2020     (JP) ................................. 2020-167657

(51) Int. Cl.
*H01S 5/11*          (2021.01)
*H01S 5/183*        (2006.01)
*H01S 5/185*        (2021.01)

(52) U.S. Cl.
CPC ............ *H01S 5/11* (2021.01); *H01S 5/18305* (2013.01); *H01S 5/185* (2021.01)

(58) Field of Classification Search
CPC .................................. H01S 5/11; H01S 5/185
See application file for complete search history.

(56) References Cited

U.S. PATENT DOCUMENTS

| | | | |
|---|---|---|---|
| 2007/0030873 A1 | 2/2007 | Deng | |
| 2014/0348195 A1* | 11/2014 | Sakaguchi | ................ H01S 5/11 |
| | | | 372/45.01 |

(Continued)

FOREIGN PATENT DOCUMENTS

| | | |
|---|---|---|
| CN | 111158156 A | 5/2020 |
| JP | 2007-073571 A | 3/2007 |

(Continued)

OTHER PUBLICATIONS

International Preliminary Report on Patentability mailed Apr. 13, 2023 for PCT/JP2021/035673.

(Continued)

*Primary Examiner* — James A Menefee
(74) *Attorney, Agent, or Firm* — Faegre Drinker Biddle & Reath LLP

(57) ABSTRACT

A semiconductor laser element of the present disclosure reducing one-dimensional local oscillation includes a substrate, an active layer, and a phase modulation layer. The phase modulation layer includes a base layer and modified refractive index regions two-dimensionally placed on a reference surface. In a virtual square lattice on the reference surface, the gravity center of each modified refractive index region is placed away from the corresponding lattice point, and an angle of a vector connecting the corresponding lattice point to the gravity center is set individually. A lattice spacing and a light emission wavelength of the active layer satisfy a Γ-point oscillation condition. The gravity center of each modified refractive index region is placed such that the absolute value of the Fourier coefficient of an annular or a circular shape obtained by rotating each modified refractive index region with the corresponding lattice point is 0.01 or less.

40 Claims, 33 Drawing Sheets

(56)          References Cited

U.S. PATENT DOCUMENTS

| | | | | |
|---|---|---|---|---|
| 2018/0026419 A1* | 1/2018 | Hirose | .............. | H01S 5/18394 |
| | | | | 353/22 |
| 2018/0109075 A1* | 4/2018 | Kurosaka | .................. | H01S 5/42 |
| 2019/0181613 A1* | 6/2019 | Kurosaka | .................. | H01S 5/11 |
| 2019/0252856 A1* | 8/2019 | Hirose | .................... | H01S 5/187 |
| 2019/0312412 A1* | 10/2019 | Kurosaka | ............ | H01S 5/34313 |
| 2020/0106240 A1* | 4/2020 | Takiguchi | ............. | H01S 5/0286 |
| 2021/0226412 A1* | 7/2021 | Hirose | .............. | H01S 5/18305 |
| 2023/0231363 A1* | 7/2023 | Tong | .......................... | H01S 5/18 |
| | | | | 372/44.01 |
| 2025/0273930 A1* | 8/2025 | Tong | ................. | H01S 5/18308 |

FOREIGN PATENT DOCUMENTS

| | | |
|---|---|---|
| JP | 2014-236127 A | 12/2014 |
| JP | 2017-188697 A | 10/2017 |
| JP | 2019-106398 A | 6/2019 |
| WO | WO-2018/030523 A1 | 2/2018 |
| WO | WO-2019/189244 A1 | 10/2019 |
| WO | WO-2020/045453 A1 | 3/2020 |

OTHER PUBLICATIONS

Kurosaka, Y. et al., "Effects of non-lasing band in two-dimensional photonic-crystal lasers clarified using omnidirectional band structure," Opt. Express, 20, 2012, pp. 21773-21783.

Liang, Y. et al., "Three-dimensional coupled-wave analysis for square-lattice photonic crystal surface emitting lasers with; transverse-electric polarization: finite-size effect," Optics Express 20, 2012, pp. 15945-15961.

Liang, Yong et al., "Three-dimensional coupled-wave model for square-lattice photonic crystal lasers with transverse electric polarization: A general approach," Physical Review B 84, 195119 (2011), pp. 195119-1-195119-11.

Yoshida, Masahiro et al., "Double-lattice photonic-crystal resonators enabling high-brightness semiconductor lasers with symmetric narrow-divergence beams," Nature Materials, Dec. 17, 2018, vol. 18, pp. 121-128.

* cited by examiner

25A

ROUT    RIN

ORIGINAL IMAGE

| A4 | A3 |
|---|---|
| ROTATED A2 | ROTATED A1 |
| A1 | A2 |
| ROTATED A3 | ROTATED A4 |

OBTAINED BEAM PATTERN

*Fig.32*

SEMICONDUCTOR LASER ELEMENT

TECHNICAL FIELD

The present disclosure relates to a semiconductor laser element.

The present application claims priority based on Japanese Patent Application No. 2020-167657 filed on Oct. 2, 2020, is reliant on the contents, and the entire contents of this application are incorporated into the present specification by reference.

BACKGROUND ART

Patent Document 1 discloses a technology regarding a light-emitting device. This light-emitting device is an S-iPM (Static-integrable Phase Modulating) laser, and includes a light emission portion and a phase modulation layer optically coupled with the light emission portion. The phase modulation layer includes a base layer and a plurality of modified refractive index regions. The plurality of modified refractive index regions has a refractive index different from a refractive index of the base layer, and is distributed in a two-dimensional shape on a surface perpendicular to the thickness direction of the phase modulation layer. When a virtual square lattice is set on the surface, the center of gravity of each modified refractive index region is arranged away from the corresponding lattice point. For each modified refractive index region, the angle of a vector connecting the corresponding lattice point to the center of gravity with respect to the virtual square lattice is individually set. A lattice spacing a of the virtual square lattice and a light emission wavelength $\lambda$ of the light emission portion satisfy the condition for M-point oscillation. On a reciprocal lattice space of the phase modulation layer, in-plane wavenumber vectors in four directions each including a wavenumber spread corresponding to the angular spread of an optical image is formed, and the magnitude of at least one in-plane wavenumber vector is smaller than $2\pi/\lambda$.

Non-Patent Document 1 discloses a $\Gamma$-point oscillation photonic crystal laser having a double-hole structure. The technology described in this Non-Patent Document 1 selectively suppresses coupling coefficients $\kappa(\pm2, 0)$ and $\kappa(0, \pm2)$ proportional to the $(\pm2, 0)$-order and $(0, \pm2)$-order Fourier coefficients contributing to one-dimensional oscillation by adjusting the hole spacing and depth of the double-hole structure.

CITATION LIST

Patent Literature

Patent Document 1: WO No. 2020/045453

Non-Patent Literature

Non-Patent Document 1: Masahiro Yoshida et al., "Double-lattice photonic-crystal resonators enabling high-brightness semiconductor lasers with symmetric narrow-divergence beams Nature Materials", Vol. 18, pp. 121-128 (2019).
Non-Patent Document 2: Y. Kurosaka et al., "Effects of non-lasing band in two-dimensional photonic-crystal lasers clarified using omnidirectional band structure", Opt. Express 20, 21773-21783 (2012).
Non-Patent Document 3: Y. Liang et al., "Three-dimensional coupled-wave analysis for square-lattice photonic crystal surface emitting lasers with transverse-electric polarization: finite-size effect", Optics Express 20, 15945-15961 (2012).
Non-Patent Document 4: Yong Liang et al., "Three-dimensional coupled-wave model for square-lattice photonic crystal lasers with transverse electric polarization A general approach", Physical Review, B84, 195119 (2011).

SUMMARY OF INVENTION

Technical Problem

As a result of examining the above-described conventional technology, the inventors have discovered the following problems. That is, a semiconductor laser element is known that is provided with a resonant mode layer such as a photonic crystal layer or a phase modulation layer and includes a base layer and a plurality of modified refractive index regions distributed two-dimensionally with a refractive index different from a refractive index of the base layer. For example, the photonic crystal laser outputs a laser beam in the thickness direction of the photonic crystal layer. In the S-iPM (Static-integrable Phase Modulating) laser, when a virtual square lattice is set on a plane perpendicular to the thickness direction of the phase modulation layer, the angle of a vector connecting a lattice point of the virtual square lattice to the center of gravity of each modified refractive index region with respect to the virtual square lattice is independently set for each modified refractive index region according to a desired optical image. The S-iPM laser can output an optical image having a spatially arbitrary shape including the thickness direction of the phase modulation layer and a direction inclined to the thickness direction.

One-dimensional local oscillation may occur in the photonic crystal layer or phase modulation layer of these semiconductor laser elements. One-dimensional local oscillation causes phenomena such as mode localization due to one-dimensional diffraction and flat band diffraction. These phenomena make light intensity distribution uneven and limit the area of an optical image that can be outputted in a single mode. At this time, image quality of the optical image deteriorates, such as part of a design pattern is missing due to localization of the optical image, or the optical image becomes blurred due to the increase in diffraction spread associated with localization.

The present disclosure has been made to solve the problems described above, and an object of the present disclosure is to provide a semiconductor laser element that can reduce one-dimensional local oscillation.

Solution to Problem

A semiconductor laser element of the present disclosure includes, as a structure to solve the above problem, for example, a substrate having a main surface and a light-emitting layer and a phase modulation layer provided on the substrate in a state of being laminated along a normal direction of the main surface. The phase modulation layer includes a base layer and a plurality of modified refractive index regions. The plurality of modified refractive index regions each has a refractive index different from a refractive index of the base layer and is arranged in a two-dimensional shape on a reference surface orthogonal to the normal direction. In a virtual square lattice set on the reference surface, the plurality of modified refractive index regions is associated one-to-one with lattice points of the virtual square lattice. Each of the plurality of modified refractive index regions is arranged in a state where a center of gravity is physically separated from a corresponding lattice point out of the lattice points of the virtual square lattice. An angle of a vector connecting the corresponding lattice point to the center of gravity with respect to the virtual square lattice is set individually for each of the plurality of modified refractive index regions. A lattice spacing a of the virtual square lattice and a light emission wavelength λ of the light-emitting layer satisfy a condition for Γ-point oscillation. An annular shape or a circular shape is obtained by virtually rotating each of the plurality of modified refractive index regions by one lap with the corresponding lattice point as a rotation center. A (m1, n1)-order Fourier coefficient of the annular shape or the circular shape depending on a size of the annular shape or the circular shape includes (−2,0)-order, (+2,0)-order, (0,−2)-order, and (0,+2)-order four Fourier coefficients. Under this condition, a position of the center of gravity of each of the plurality of modified refractive index regions is set to make an absolute value of the (m1, n1)-order Fourier coefficient of the annular shape or the circular shape 0.01 or less, or 20% or less of a maximum peak value the (m1, n1)-order Fourier coefficient of the circular shape is able to take.

Advantageous Effects of Invention

The present disclosure makes it possible to provide a semiconductor laser element that can reduce one-dimensional local oscillation.

BRIEF DESCRIPTION OF DRAWINGS

Figure 32:
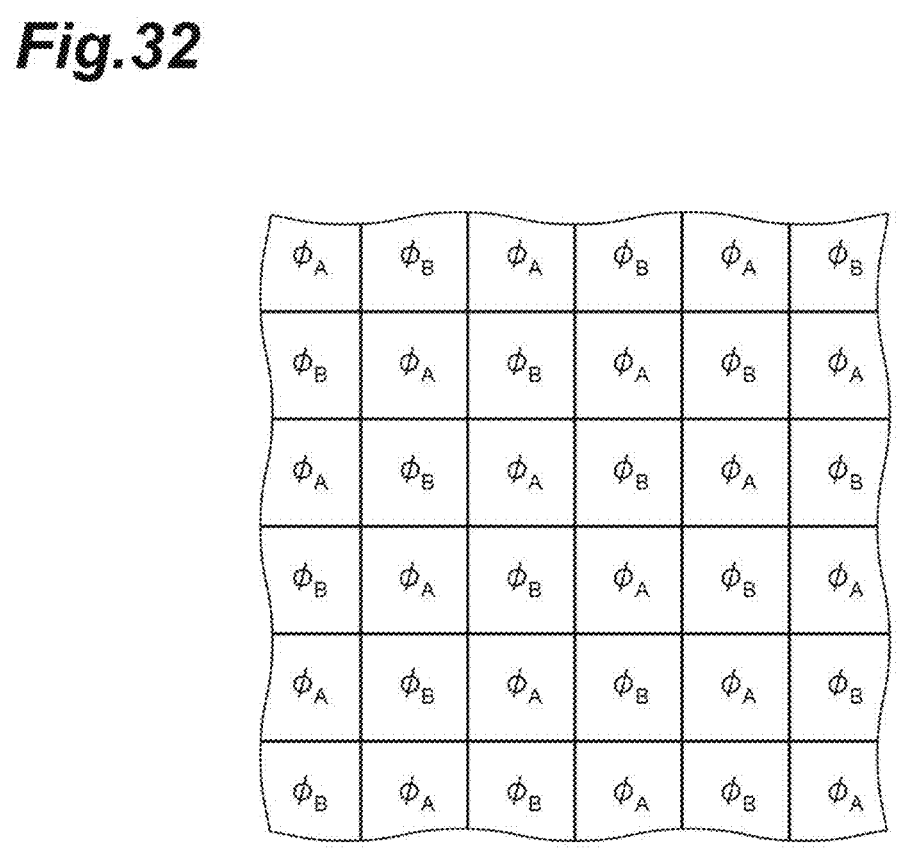

FIG. 32 is a diagram conceptually showing one example of angular distribution $\theta_2(x, y)$.

DESCRIPTION OF EMBODIMENTS

Figure 1:
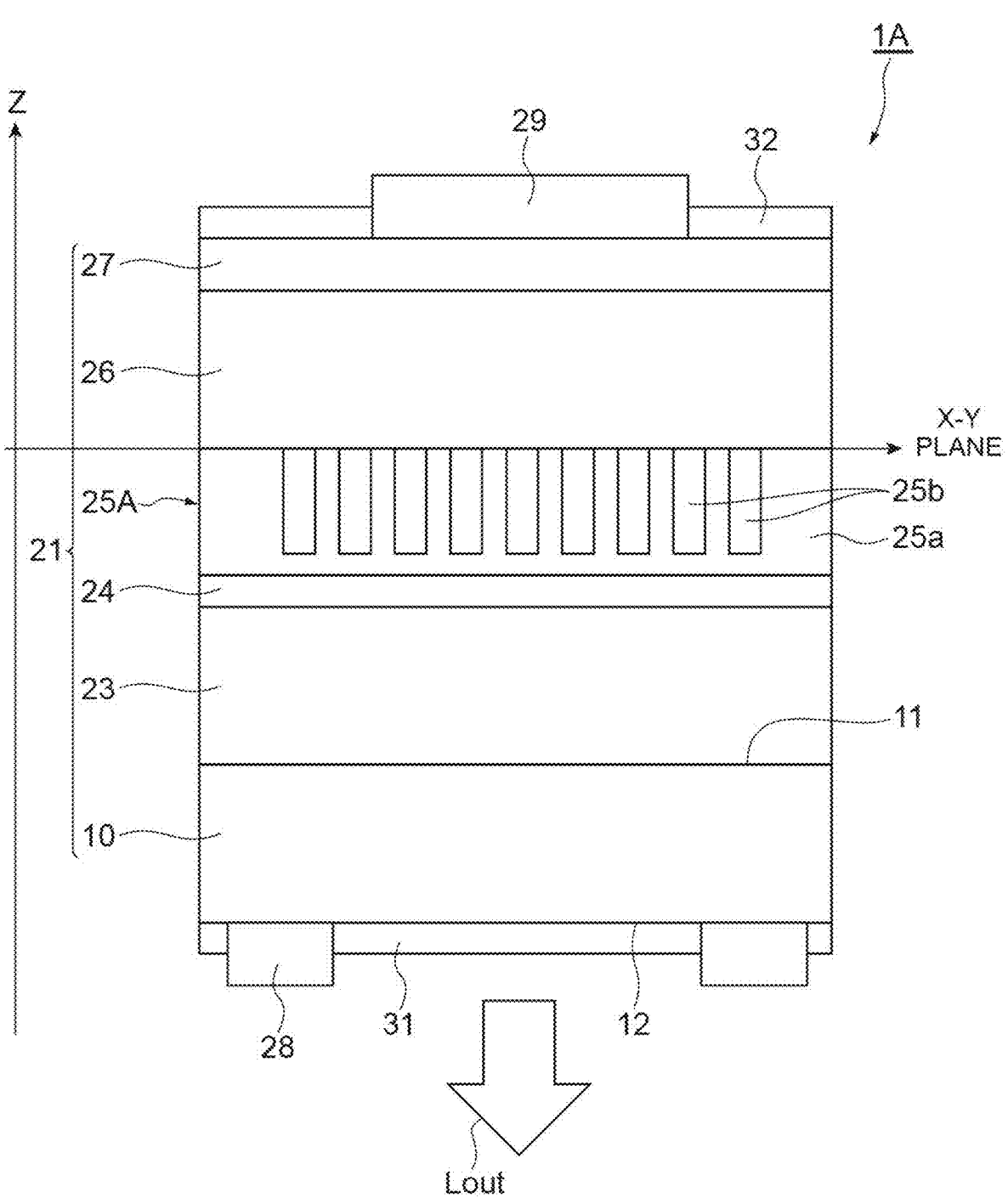
FIG. 1 is a diagram schematically showing a laminated structure of a semiconductor laser element according to a first embodiment of the present disclosure.

Description of Embodiments of the Present Invention

To begin with, details of embodiments of the present invention will be enumerated and described individually.

(1) A first semiconductor laser element of the present disclosure includes, as one aspect, a substrate having a main surface and a light-emitting layer and a phase modulation layer provided on the substrate in a state of being laminated along a normal direction of the main surface. The phase modulation layer includes a base layer and a plurality of modified refractive index regions. The plurality of modified refractive index regions each has a refractive index different from a refractive index of the base layer and is arranged in a two-dimensional shape on a reference surface orthogonal to the normal direction. In a virtual square lattice set on the reference surface, the plurality of modified refractive index regions is associated one-to-one with lattice points of the virtual square lattice. Each of the plurality of modified refractive index regions is arranged in a state where a center of gravity is physically separated from a corresponding lattice point out of the lattice points of the virtual square lattice. An angle of a vector connecting the corresponding lattice point to the center of gravity with respect to the virtual square lattice is set individually for each of the plurality of modified refractive index regions. A lattice spacing a of the virtual square lattice and a light emission wavelength $\lambda$ of the light-emitting layer satisfy a condition for $\Gamma$-point oscillation. An annular shape or a circular shape is obtained by virtually rotating each of the plurality of modified refractive index regions by one lap with the corresponding lattice point as a rotation center. A (m1, n1)-order Fourier coefficient of the annular shape or the circular shape depending on a size of the annular shape or the circular shape includes (−2,0)-order, (+2,0)-order, (0,−2)-order, and (0,+2)-order four Fourier coefficients. Under this condition, a position of the center of gravity of each of the plurality of modified refractive index regions is set to make an absolute value of the (m1, n1)-order Fourier coefficient of the annular shape or the circular shape 0.01 or less, or 20% or less of a maximum peak value the (m1, n1)-order Fourier coefficient of the circular shape is able to take.

Note that in this specification, the Fourier coefficient including the (−2,0)-order, (+2,0)-order, (0,−2)-order, and (0,+2)-order four Fourier coefficients is represented as the (m1, n1)-order Fourier coefficient, or (±2, 0)-order and (0, ±2)-order Fourier coefficient.

(2) A second semiconductor laser element of the present disclosure includes, as one aspect, a substrate having a main surface and a light-emitting layer and a photonic crystal layer provided on the substrate in a state of being laminated along a normal direction of the main surface. The photonic crystal layer includes a base layer and a plurality of modified refractive index regions. The plurality of modified refractive index regions each has a refractive index different from a refractive index of the base layer and is arranged in a two-dimensional shape on a reference surface orthogonal to the normal direction. In a virtual square lattice set on the reference surface, each of the plurality of modified refractive index regions is arranged such that the center of gravity is located on a corresponding lattice point out of lattice points of the virtual square lattice. A lattice spacing a of the virtual square lattice and a light emission wavelength $\lambda$ of the light-emitting layer satisfy a condition for $\Gamma$-point oscillation. Each of the plurality of modified refractive index regions has an annular shape or a circular shape with the corresponding lattice point as a center. A (m1, n1)-order Fourier coefficient of the annular shape or the circular shape depending on a size of the annular shape or the circular shape includes (−2,0)-order, (+2,0)-order, (0,−2)-order, and (0,+2)-order four Fourier coefficients. Under this condition, a position of the center of gravity of each of the plurality of modified refractive index regions is set to make an absolute value of the (m1, n1)-order Fourier coefficient of the annular shape or the circular shape 0.01 or less, or 20% or less of a maximum peak value the (m1, n1)-order Fourier coefficient of the circular shape is able to take.

In these first and second semiconductor laser elements, each modified refractive index region has an annular shape or a circular shape with the corresponding lattice point as a center, or an annular shape or a circular shape is obtained by virtually rotating each modified refractive index region by one lap with the corresponding lattice point as a rotation center. The absolute value of the (m1, n1)-order Fourier coefficient of the annular shape or the circular shape (here, (m1, n1)=(±2, 0) and (0, ±2)) is 0.01 or less, or 20% or less of a maximum peak value the (m, n)-order Fourier coefficient of the circular shape is able to take. In this way, for $\Gamma$-point oscillation, since the (±2,0)-order and (0,±2)-order Fourier coefficient ((m1, n1)-order Fourier coefficient) of each modified refractive index region has an extremely small value, one-dimensional diffraction is suppressed and one-dimensional local oscillation can be reduced. Therefore, these first and second semiconductor laser elements can suppress phenomena such as mode localization due to one-dimensional diffraction and flat band diffraction. Therefore, since it is possible to make the light intensity distribution close to uniform and increase the area of the region where output is possible in a single mode, it is possible to improve the resolution and image quality of the emitted optical image.

(3) As one aspect of the present embodiment, in the first and second semiconductor laser elements, the (m1, n1)-order Fourier coefficient of the annular shape or the circular shape may be zero. In this case, the above effect can be achieved more remarkably.

(4) As one aspect of the present embodiment, in the first and second semiconductor laser elements, a ratio ($F_2/F_1$) of a (m1, n1)-order Fourier coefficient $F_1$ of an inner circle that defines the annular shape to a (m1, n1)-order Fourier coefficient $F_2$ of an outer circle that defines the annular shape may be 0.99 or more and 1.01 or less. The Fourier coefficient of the annular shape is calculated as a difference between the Fourier coefficient of the outer circle that defines the annular shape and the Fourier coefficient of the inner circle that defines the annular shape. Therefore, since the Fourier coefficient of the outer circle and the Fourier coefficient of the inner circle have values close to each other, the Fourier coefficient of the annular shape can be close to zero, and as a result, one-dimensional local oscillation can be reduced more effectively.

(5) As one aspect of the present embodiment, in the first and second semiconductor laser elements, the Fourier coefficient $F_1$ and the Fourier coefficient $F_2$ may be equal to each other. In this case, since the Fourier coefficient of the annular shape is sufficiently small, the above effect can be achieved.

(6) As one aspect of the present embodiment, in the first and second semiconductor laser elements, a radius of the inner circle may be smaller than 0.19 times the lattice spacing a, and a radius of the outer circle may be greater than 0.19 times the lattice spacing a. As one aspect of the present embodiment, in the first and second semiconductor laser elements, a radius of the inner circle may be smaller than 0.44 times the lattice spacing a, and a radius of the outer circle may be greater than 0.44 times the lattice spacing a. For the $\Gamma$-point oscillation structure, the Fourier coefficient of the circular shape has an extreme value when the radius is 0.19 times or 0.44 times the lattice spacing a. Therefore, since the radius of the inner circle is smaller than 0.19 times (or 0.44 times) the lattice spacing a, and the radius of the outer circle is greater than 0.19 times (or 0.44 times) the lattice spacing a, it is easy to bring the Fourier coefficient of the inner circle and the Fourier coefficient of the outer circle closer to each other.

(7) As one aspect of the present embodiment, in the first and second semiconductor laser elements, a radius of the circular shape may be 0.30 times or more and 0.31 times or less of the lattice spacing a. For the Γ-point oscillation structure, the Fourier coefficient of the circular shape is zero when the radius has a certain value in a range from 0.30 times to 0.31 times the lattice spacing a. Therefore, in this case, the Fourier coefficient of the planar shape of the modified refractive index region can be brought close to zero, and one-dimensional local oscillation can be reduced more effectively.

(8) A third semiconductor laser element of the present disclosure includes, as one aspect, a substrate having a main surface and a light-emitting layer and a phase modulation layer provided on the substrate in a state of being laminated along a normal direction of the main surface. The phase modulation layer includes a base layer and a plurality of modified refractive index regions. The plurality of modified refractive index regions each has a refractive index different from a refractive index of the base layer and is arranged in a two-dimensional shape on a reference surface orthogonal to the normal direction. In a virtual square lattice set on the reference surface, the plurality of modified refractive index regions is associated one-to-one with lattice points of the virtual square lattice. Each of the plurality of modified refractive index regions is arranged in a state where a center of gravity is physically separated from a corresponding lattice point out of the lattice points of the virtual square lattice. An angle of a vector connecting the corresponding lattice point to the center of gravity with respect to the virtual square lattice is set individually for each of the plurality of modified refractive index regions. A lattice spacing a of the virtual square lattice and a light emission wavelength λ of the light-emitting layer satisfy a condition for M-point oscillation. An annular shape or a circular shape is obtained by virtually rotating each of the plurality of modified refractive index regions by one lap with the corresponding lattice point as a rotation center. A (m2, n2)-order Fourier coefficient of the annular shape or the circular shape depending on a size of the annular shape or the circular shape includes (−1,−1)-order, (+1,−1)-order, (−1,+1)-order, and (+1,+1)-order four Fourier coefficients. Under this condition, a position of the center of gravity of each of the plurality of modified refractive index regions is set to make an absolute value of the (m2, n2)-order Fourier coefficient of the annular shape or the circular shape 0.01 or less, or 10% or less of a maximum peak value the (m2, n2)-order Fourier coefficient of the circular shape is able to take.

(9) A fourth semiconductor laser element of the present disclosure includes, as one aspect, a substrate having a main surface and a light-emitting layer and a photonic crystal layer provided on the substrate in a state of being laminated along a normal direction of the main surface. The photonic crystal layer includes a base layer and a plurality of modified refractive index regions. The plurality of modified refractive index regions each has a refractive index different from a refractive index of the base layer and is arranged in a two-dimensional shape on a reference surface orthogonal to the normal direction. In a virtual square lattice set on the reference surface, each of the plurality of modified refractive index regions is arranged such that the center of gravity is located on a corresponding lattice point out of lattice points of the virtual square lattice. A lattice spacing a of the virtual square lattice and a light emission wavelength λ of the light-emitting layer satisfy a condition for M-point oscillation. Each of the plurality of modified refractive index regions has an annular shape or a circular shape with the corresponding lattice point as a center. A (m2, n2)-order Fourier coefficient of the annular shape or the circular shape depending on a size of the annular shape or the circular shape includes (−1, −1)-order, (+1, −1)-order, (−1, +1)-order, and (+1,+1)-order four Fourier coefficients. Under this condition, a position of the center of gravity of each of the plurality of modified refractive index regions is set to make an absolute value of the (m2, n2)-order Fourier coefficient of the annular shape or the circular shape 0.01 or less, or 10% or less of a maximum peak value the (m2, n2)-order Fourier coefficient of the circular shape is able to take.

Note that in this specification, the (−1, −1)-order, (+1, −1)-order, (−1, +1)-order, and (+1, +1)-order four Fourier coefficients are represented as a (m2, n2)-order Fourier coefficient, or (±1, ±1)-order Fourier coefficient.

In these third and fourth semiconductor laser elements, each modified refractive index region has an annular shape or a circular shape with the corresponding lattice point as a center, or an annular shape or a circular shape is obtained by virtually rotating each modified refractive index region by one lap with the corresponding lattice point as a rotation center. The absolute value of the (m2, n2)-order Fourier coefficient of the annular shape or the circular shape (here, (m2, n2)=(±1, ±1)) is 0.01 or less, or 10% or less of a maximum peak value the (m2, n2)-order Fourier coefficient of the circular shape is able to take. In this way, for M-point oscillation, since the (±1, ±1)-order Fourier coefficient ((m2, n2)-order Fourier coefficient) of each modified refractive index region has an extremely small value, one-dimensional local oscillation can be suppressed. Therefore, these third and fourth semiconductor laser elements can suppress phenomena such as mode localization due to one-dimensional diffraction and flat band diffraction. Therefore, since it is possible to make the light intensity distribution close to uniform and increase the area of the region where output is possible in a single mode, it is possible to improve the resolution and image quality of the emitted optical image.

(10) As one aspect of the present embodiment, in the third semiconductor laser element, angular distribution on the reference surface defined by the angle set individually for the plurality of modified refractive index regions may satisfy a condition for light to be outputted in a direction intersecting the plane perpendicular to the thickness direction of the phase modulation layer (reference surface). In this semiconductor laser element, the lattice spacing a of the virtual square lattice and the light emission wavelength λ satisfy the condition for M-point oscillation. Since the light propagating in the optical diffraction layer is normally totally reflected in the standing wave state of the M-point oscillation, light outputted in a direction intersecting the plane perpendicular to the thickness direction is suppressed. However, in this semiconductor laser element, the center of gravity of each of the plurality of modified refractive index regions is placed away from the corresponding lattice point of the virtual square lattice. For each modified refractive index region, the angle of a vector connecting the corresponding lattice point to the center of gravity with respect to the virtual square lattice is individually set. The angular distribution satisfies the condition for light to be outputted in a direction intersecting the plane perpendicular to the thickness direction (reference surface). Such a structure can implement the surface-emitting semiconductor laser element.

(11) As one aspect of the present embodiment, in the third semiconductor laser element, the condition may be that the magnitude of at least the four-direction in-plane wavenumber vectors each including the wavenumber spread due to angular distribution is smaller than $2\pi/\lambda$ (light line) on the reciprocal lattice space of the phase modulation layer. When the magnitude of at least one in-plane wavenumber vector is smaller than $2\pi/\lambda$ (light line), the in-plane wavenumber vector has the component of the thickness direction of the phase modulation layer, and total reflection does not occur at the interface with the air, and therefore light can be outputted in the direction intersecting the plane perpendicular to the thickness direction (reference surface).

(12) As one aspect of the present embodiment, in the third and fourth semiconductor laser elements, the (m2, n2)-order Fourier coefficient of the annular shape or the circular shape may be zero. In this case, the above effect can be achieved more remarkably.

(13) As one aspect of the present embodiment, in the third and fourth semiconductor laser elements, a ratio $(F_2/F_1)$ of a (m2, n2)-order Fourier coefficient $F_1$ of an inner circle that defines the annular shape to a (m2, n2)-order Fourier coefficient $F_2$ of an outer circle that defines the annular shape may be 0.99 or more and 1.01 or less. As described above, the Fourier coefficient of the annular shape is calculated as a difference between the Fourier coefficient of the outer circle that defines the annular shape and the Fourier coefficient of the inner circle that defines the annular shape. Therefore, since the Fourier coefficient of the outer circle and the Fourier coefficient of the inner circle have values close to each other, the Fourier coefficient of the annular shape can be close to zero, and as a result, one-dimensional local oscillation can be reduced more effectively.

(14) As one aspect of the present embodiment, in the third and fourth semiconductor laser elements, the Fourier coefficient $F_1$ and the Fourier coefficient $F_2$ may be equal to each other. In this case, since the Fourier coefficient of the annular shape is sufficiently small, the above effect can be achieved.

(15) As one aspect of the present embodiment, in the third and fourth semiconductor laser elements, a radius of the inner circle may be smaller than 0.27 times the lattice spacing a, and a radius of the outer circle may be greater than 0.27 times the lattice spacing a. For M-point oscillation, the Fourier coefficient of the circular shape has an extreme value when the radius is 0.27 times the lattice spacing a. Therefore, since the radius of the inner circle is smaller than 0.27 times the lattice spacing a, and the radius of the outer circle is greater than 0.27 times the lattice spacing a, it is easy to bring the Fourier coefficient of the inner circle and the Fourier coefficient of the outer circle closer to each other.

(16) As one aspect of the present embodiment, in the third and fourth semiconductor laser elements, a radius of the circular shape may be 0.43 times or more and 0.44 times or less of the lattice spacing a. For M-point oscillation, the Fourier coefficient of the circular shape is zero when the radius has a certain value in the range from 0.43 times to 0.44 times the lattice spacing a. Therefore, in this case, the Fourier coefficient of the planar shape of the modified refractive index region can be brought close to zero, and one-dimensional local oscillation can be reduced more effectively.

(17) As one aspect of the present embodiment, in the first and third semiconductor laser elements, a planar shape of each modified refractive index region may be a C shape with the corresponding lattice point as a center of inner and outer arcs. In this case, the angle of the vector connecting the center of gravity of each modified refractive index region to the lattice point can be arbitrarily set by changing the circumferential position of the opening of the C shape. When the C shape is virtually rotated by one lap with the lattice point as a rotation center, the annular shape is suitably obtained. Since the C shape is close to the annular shape, the Fourier coefficient of the planar shape of each modified refractive index region can be brought closer to the Fourier coefficient of the annular shape with high precision. Since the modified refractive index region is formed within a range of a predetermined certain annular ring, there is also an advantage of making it difficult for the modified refractive index regions adjacent to each other to merge.

(18) As one aspect of the present embodiment, in the first and third semiconductor laser elements, a planar shape of each modified refractive index region may be a circular shape with the corresponding lattice point located outside. In this case as well, when the circular shape is virtually rotated by one lap with the lattice point as a rotation center, the annular shape is suitably obtained.

(19) As one aspect of the present embodiment, in the first and third semiconductor laser elements, a planar shape of each modified refractive index region may be a polygon with the corresponding lattice point located outside. In this case as well, when the polygon is virtually rotated by one lap with the lattice point as a rotation center, the annular shape is suitably obtained.

(20) As one aspect of the present embodiment, in the first and third semiconductor laser elements, a planar shape of each modified refractive index region may be a fan shape with the corresponding lattice point as a center of an arc, and the arc may be a major arc. In this case, the angle of the vector connecting the center of gravity of each modified refractive index region to the lattice point (angle with respect to virtual square lattice) can be arbitrarily set by changing the circumferential position of the fan-shaped notch. When the fan shape is virtually rotated by one lap with the lattice point as a rotation center, the circular shape is suitably obtained. Since the fan shape having a major arc is close to a circular shape, the Fourier coefficient of the planar shape of each modified refractive index region can be brought closer to the Fourier coefficient of the circular shape with high precision.

(21) As one aspect of the present embodiment, in the first and third semiconductor laser elements, a planar shape of each modified refractive index region may be a circular shape with the corresponding lattice point located inside. In this case as well, when the circular shape is virtually rotated by one lap with the lattice point as a rotation center, the circular shape is suitably obtained.

(22) As one aspect of the present embodiment, in the first and third semiconductor laser elements, a planar shape of each modified refractive index region may be a polygon with the corresponding lattice point located inside. In this case as well, when the circular shape is virtually rotated by one lap with the lattice point as a rotation center, the circular shape is suitably obtained.

As described above, each aspect listed in the column of [Description of Embodiments of the Present Invention] is applicable to each of all remaining aspects or to a combination of all these remaining aspects.

Details of Embodiments of the Present Invention

The specific structure of a semiconductor laser element according to the present embodiment will be described in detail below with reference to the accompanying drawings. Note that the present invention is not limited to these examples, but is indicated by the claims, and all changes in the claims and the meaning and scope of equivalents are intended to be included. In the description of drawings, the same elements are denoted with the same reference sign, and duplicate descriptions are omitted.

First Embodiment

FIG. 1 is a diagram schematically showing a laminated structure of a semiconductor laser element 1A according to a first embodiment of the present disclosure. Note that in FIG. 1, the lamination direction of the semiconductor laser element 1A (that agrees with the normal direction of a main surface of a substrate) is the Z-axis direction, and a coordinate system is defined in which the X-axis direction, Y-axis direction, and Z-axis direction are orthogonal to each other. The semiconductor laser element 1A is an S-iPM laser that forms a standing wave (in-plane wave) along the X-Y plane and outputs a phase-controlled plane wave in the Z-axis direction, and outputs a spatially arbitrary-shaped optical image including a direction perpendicular to a main surface 11 of a substrate 10 (that is, Z-axis direction), a direction inclined thereto, or both, as will be described later.

As shown in FIG. 1, the semiconductor laser element 1A includes the substrate 10, a semiconductor laminated part 21, and electrodes 28 and 29. The substrate 10 is comprised of a material that can grow crystals in each semiconductor layer constituting the semiconductor laminated part 21. In one example, the substrate 10 is a semiconductor substrate of the first conductivity type (for example, n-type). The substrate 10 includes the flat main surface 11, which is a crystal growth surface, and a back surface 12, which is parallel to the main surface 11 and opposite to the main surface 11. The main surface 11 and the back surface 12 are parallel to the X-Y plane.

The semiconductor laminated part 21 includes a lower cladding layer 23, an active layer 24, a phase modulation layer 25A, an upper cladding layer 26, and a contact layer 27, which are laminated in order in the Z-axis direction. The lower cladding layer 23 is provided on the main surface 11. The active layer 24 is provided on the lower cladding layer 23. The active layer 24 corresponds to the light-emitting layer in the present disclosure. The phase modulation layer 25A is provided on the active layer 24. The upper cladding layer 26 is provided on the phase modulation layer 25A. That is, the active layer 24 is located between the lower cladding layer 23 and the upper cladding layer 26, and the phase modulation layer 25A is located between the active layer 24 and the upper cladding layer 26. Note that the present invention is not limited to this embodiment, and the phase modulation layer 25A may be located between the lower cladding layer 23 and the active layer 24. The contact layer 27 is provided on the upper cladding layer 26.

The lower cladding layer 23 has a first conductivity type. The upper cladding layer 26 has a second conductivity type. The thickness and refractive index of the upper cladding layer 26 may be equal to or different from those of the lower cladding layer 23. The active layer 24 is comprised of a material with a smaller energy band gap and larger refractive index than the lower cladding layer 23 and the upper cladding layer 26. The contact layer 27 has a second conductivity type. The thickness direction of the substrate 10, the lower cladding layer 23, the active layer 24, the phase modulation layer 25A, the upper cladding layer 26, and the contact layer 27 agrees with the Z-axis direction. The semiconductor laminated part 21 includes a compound semiconductor, for example, GaAs-based semiconductor, InP-based semiconductor, or III-V nitride-based semiconductor.

The phase modulation layer 25A includes a base layer 25a comprised of a first refractive index medium, and a plurality of modified refractive index regions 25b that is comprised of a second refractive index medium with a refractive index different from a refractive index of the first refractive index medium and exists within the base layer 25a. The plurality of modified refractive index regions 25b includes a substantially periodic structure on the X-Y plane that agrees with one surface (reference surface) of the phase modulation layer 25A. When the equivalent refractive index of a mode is n, the wavelength $\lambda_0$ selected by the phase modulation layer 25A is included in the light emission wavelength range of the active layer 24. The phase modulation layer 25A can select and externally output a band-edge wavelength near a wavelength $\lambda_0$ out of the light emission wavelength of the active layer 24. The light incident in the phase modulation layer 25A forms a predetermined mode within the phase modulation layer 25A according to the arrangement of the modified refractive index regions 25b, and is emitted externally from the surface of the semiconductor laser element 1A as a laser beam Lout with a predetermined pattern. At this time, the laser beam Lout is emitted in a spatially arbitrary direction including a direction perpendicular to the main surface 11 and a direction inclined thereto. The laser beam Lout is formed mainly by zero-order light, +1st-order order light, and −1st-order light. The zero-order light is emitted in a direction perpendicular to the X-Y plane (Z-axis direction). The +1st-order light and −1st-order light are emitted in a direction inclined to the direction perpendicular to the X-Y plane (Z-axis direction).

The electrode 28 is a first conductivity type electrode provided on the back surface 12 of the substrate 10 and forming an ohmic contact with the back surface 12. The electrode 29 is a second conductivity type electrode provided on the contact layer 27 and forming an ohmic contact with the contact layer 27. The electrode 28 includes an opening for passing the laser beam Lout. The region of the back surface 12 that is not covered with the electrode 28 is covered with an insulating anti-reflective film 31. The region of the contact layer 27 that is not covered with the electrode 29 is covered with an insulating protective film 32. Note that the region of the contact layer 27 that is not covered with the electrode 29 may be removed. In this case, since the region into which a current is injected can be limited, the semiconductor laser element 1A can be driven efficiently. The anti-reflective film 31 located outside the electrode 28 (that is, other region excluding the opening) may be removed.

When a drive current is supplied between the electrodes 28 and 29, recombination of electrons and holes occurs within the active layer 24, causing the active layer 24 to emit light. Electrons and holes that contribute to this light emission and the generated light is effectively confined between the lower cladding layer 23 and the upper cladding layer 26.

The light emitted from the active layer 24 enters the inside of the phase modulation layer 25A to form a predetermined mode according to the lattice structure inside the phase modulation layer 25A. The laser beam Lout emitted from the phase modulation layer 25A is outputted directly from the back surface 12 through the opening of the electrode 28 to the outside of the semiconductor laser element 1A, or is reflected by the electrode 29, and then is outputted from the back surface 12 through the opening of the electrode 28 to the outside of the semiconductor laser element 1A. At this time, a signal light included in the laser beam Lout is emitted in a spatially arbitrary direction including the direction perpendicular to the main surface 11 and a direction inclined thereto. A desired optical image is formed by the signal light. The signal light is mainly the +1st-order light and the −1st-order light.

In one example, the substrate 10 is a GaAs substrate, and the lower cladding layer 23, the active layer 24, the phase modulation layer 25A, the upper cladding layer 26, and the contact layer 27 mainly include a GaAs-based compound semiconductor. Specifically, the lower cladding layer 23 is an AlGaAs layer. The active layer 24 has a multiple quantum well structure (barrier layer: AlGaAs/well layer: InGaAs). The base layer 25a of the phase modulation layer 25A is comprised of AlGaAs. The modified refractive index regions 25b are empty holes. The upper cladding layer 26 is an AlGaAs layer. The contact layer 27 is a GaAs layer.

In the above case, the thickness of the substrate 10 is 50 μm or more and 300 μm or less, and is 150 μm in one example. The thicknesses of the lower cladding layer 23 and the upper cladding layer 26 are 0.5 μm or more and 10 μm or less, and is 2.0 μm in one example. The thickness of the active layer 24 is 100 nm or more and 300 nm or less, and is 200 nm in one example. The thickness of the phase modulation layer 25A is 100 nm or more and 500 nm or less, and is 300 nm in one example. The thickness of the contact layer 27 is 50 nm or more and 500 nm or less, and is 100 nm in one example.

In AlGaAs, by changing the composition ratio of Al, the energy bandgap and refractive index can be easily changed. In $Al_xGa_{1-x}As$, when the composition ratio x of Al, which has a relatively small atomic radius, is decreased (increased), the energy bandgap, which positively correlates with this, decreases (increases). For InGaAs, which is GaAs mixed with In having a large atomic radius, the energy bandgap is small. That is, the Al composition ratio of the lower cladding layer 23 and the upper cladding layer 26 is higher than the Al composition ratio of the barrier layer of the active layer 24 (AlGaAs). The Al composition ratio of the lower cladding layer 23 and the upper cladding layer 26 is set to, for example, 0.20 to 1.00, and is 0.50 in one example. The Al composition ratio of the barrier layer of the active layer 24 is set to, for example, 0.00 to 0.30, and is 0.15 in one example.

In another example, the substrate 10 is an InP substrate, and the lower cladding layer 23, the active layer 24, the phase modulation layer 25A, the upper cladding layer 26, and the contact layer 27 mainly include, for example, an InP-based compound semiconductor. Specifically, the lower cladding layer 23 is an InP layer. The active layer 24 has a multiple quantum well structure (barrier layer: GaInAsP/well layer: GaInAsP). The base layer 25a of the phase modulation layer 25A is an InP layer or GaInAsP layer. The modified refractive index regions 25b are empty holes. The upper cladding layer 26 is an InP layer. The contact layer 27 is a GaInAsP layer, a GaInAs layer, or an InP layer.

In still another example, the lower cladding layer 23 is an InP layer. The active layer 24 has a multiple quantum well structure (barrier layer: AlGaInAs/well layer: AlGaInAs). The base layer 25a of the phase modulation layer 25A is an InP layer or AlGaInAs layer. The modified refractive index regions 25b are empty holes. The upper cladding layer 26 is an InP layer. The contact layer 27 is a GaInAs layer or an InP layer. This material system and the material system using GaInAsP/InP described in the previous paragraph are applicable to the optical communication wavelength in the 1.3/1.55 μm band, and can also emit light with an eye-safe wavelength longer than 1.4 μm.

In still another example, the substrate 10 is a GaN substrate, and the lower cladding layer 23, the active layer 24, the phase modulation layer 25A, the upper cladding layer 26, and the contact layer 27 mainly include, for example, a nitride-based compound semiconductor. In one example, the lower cladding layer 23 is an AlGaN layer. The active layer 24 has a multiple quantum well structure (barrier layer: InGaN/well layer: InGaN). The base layer 25a of the phase modulation layer 25A is GaN. The modified refractive index regions 25b are empty holes. The upper cladding layer 26 is an AlGaN layer. The contact layer 27 is a GaN layer.

The lower cladding layer 23 has the same conductivity type as the substrate 10, and the upper cladding layer 26 and the contact layer 27 have the opposite conductivity type to the substrate 10. In one example, the substrate 10 and the lower cladding layer 23 are n-type, and the upper cladding layer 26 and the contact layer 27 are p-type. The phase modulation layer 25A has the opposite conductivity type to the substrate 10 when provided between the active layer 24 and the upper cladding layer 26, and has the same conductivity type as the substrate 10 when provided between the lower cladding layer 23 and the active layer 24. The impurity concentration is, for example, from $1 \times 10^{16}$ cm$^{-3}$ to $1 \times 10^{21}$ cm$^{-3}$. The active layer 24 is intrinsic (i-type) with no impurity intentionally added, and the impurity concentration is equal to or lower than $1 \times 10^{16}$/cm$^3$.

In the structure described above, the modified refractive index regions 25b are empty holes, but the modified refractive index regions 25b may be formed by a semiconductor different from the base layer 25a in refractive index being embedded within the empty holes. In that case, for example, the empty holes of the base layer 25a may be formed by etching, and a semiconductor may be embedded within the empty holes by using a metalorganic vapor phase growth method, a sputtering method, or an epitaxial method. For example, if the base layer 25a is comprised of GaAs, the modified refractive index regions 25b may include AlGaAs. After the modified refractive index regions 25b are formed by embedding a semiconductor within the empty holes of the base layer 25a, a semiconductor identical to the modified refractive index regions 25b may be further deposited on the modified refractive index regions. Note that if the modified refractive index regions 25b are empty holes, the empty holes may be filled with inert gases such as argon or nitrogen, or gas such as hydrogen or air.

The anti-reflective film 31 is comprised of, for example, a dielectric single layer film such as silicon nitride (for example, SiN) and silicon oxide (for example, $SiO_2$), or a dielectric multilayer film. As the dielectric multilayer film, a film in which two or more types of dielectric layers selected from the following dielectric layer group are laminated can be used, for example, titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$). For example, a film having a thickness of λ/4, which is an optical film thickness for light of wavelength λ, is laminated. The protective film 32 is an insulating film, for example, silicon nitride (for example, SiN) and silicon oxide (for example, $SiO_2$). When the substrate 10 and the contact layer 27 are comprised of a GaAs-based semiconductor, the electrode 29 can include a material containing Au and at least one of Cr, Ti, and Pt, and has, for example, a laminated structure of Cr layers and Au layers. The electrode 28 can include a material containing Au and at least one of AuGe and Ni, and has, for example, a laminated structure of AuGe layers and Au layers. Note that the material of the electrodes 28 and 29 is not limited to these ranges as long as the material can achieve ohmic contact.

Note that the electrode shape can be modified to emit the laser beam Lout from the surface of the contact layer 27. That is, when the electrode 28 is not provided with an opening and the electrode 29 is opened on the surface of the contact layer 27, the laser beam Lout is emitted externally from the surface of the contact layer 27. In this case, the anti-reflective film is provided inside and around the opening of the electrode 29.

Figure 2:
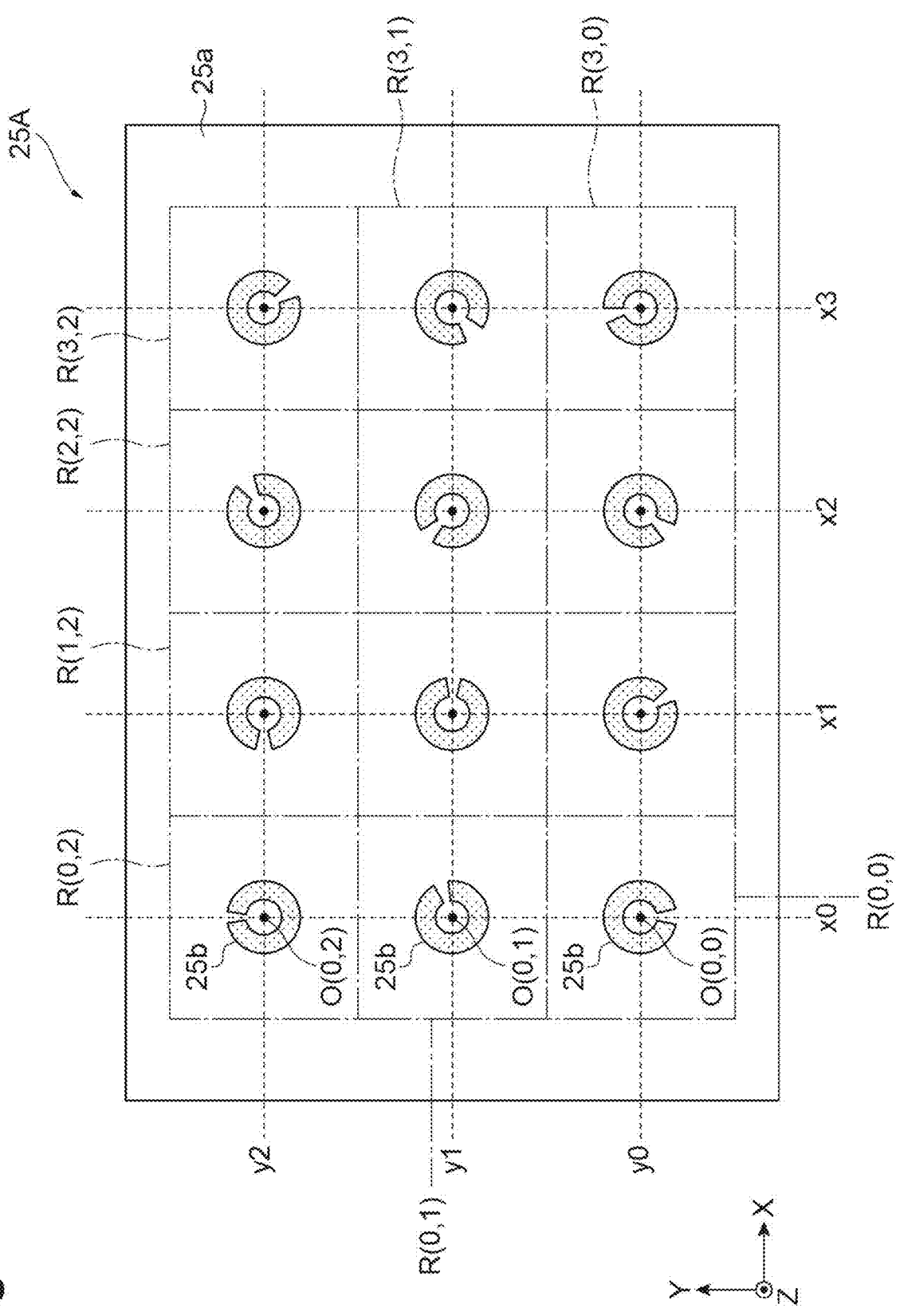
FIG. 2 is a plan view of a phase modulation layer.

FIG. 2 is a plan view of the phase modulation layer 25A. The phase modulation layer 25A has a configuration as an S-iPM laser that oscillates at a Γ point. The phase modulation layer 25A includes the base layer 25$a$ comprised of the first refractive index medium, and the plurality of modified refractive index regions 25$b$ that are comprised of the second refractive index medium with a refractive index different from a refractive index of the first refractive index medium. Here, virtual square lattices are set on one surface of the phase modulation layer 25A (X-Y plane). The intersections of the lines y0 to y2 (y component) parallel to the X axis and the lines x0 to x3 (x component) parallel to the Y axis are lattice points of the square lattices. Square regions with the lattice points as centers are unit constituent regions R(x, y).

At this time, the square unit constituent regions R(x, y) with the lattice points O(x, y) of the square lattices as centers can be set in the two-dimensional shape across a plurality of columns along the X axis (lines y0 to y2) and a plurality of rows along the Y axis (lines x0 to x3). Assuming that the XY coordinates of each unit constituent region R(x, y) are given by the position of the center of gravity of each unit constituent region R(x, y), this position of center of gravity agrees with the lattice point O(x, y) of the virtual square lattice. For example, one of the plurality of modified refractive index regions 25$b$ is provided in each unit constituent region R(x, y).

Figure 3:
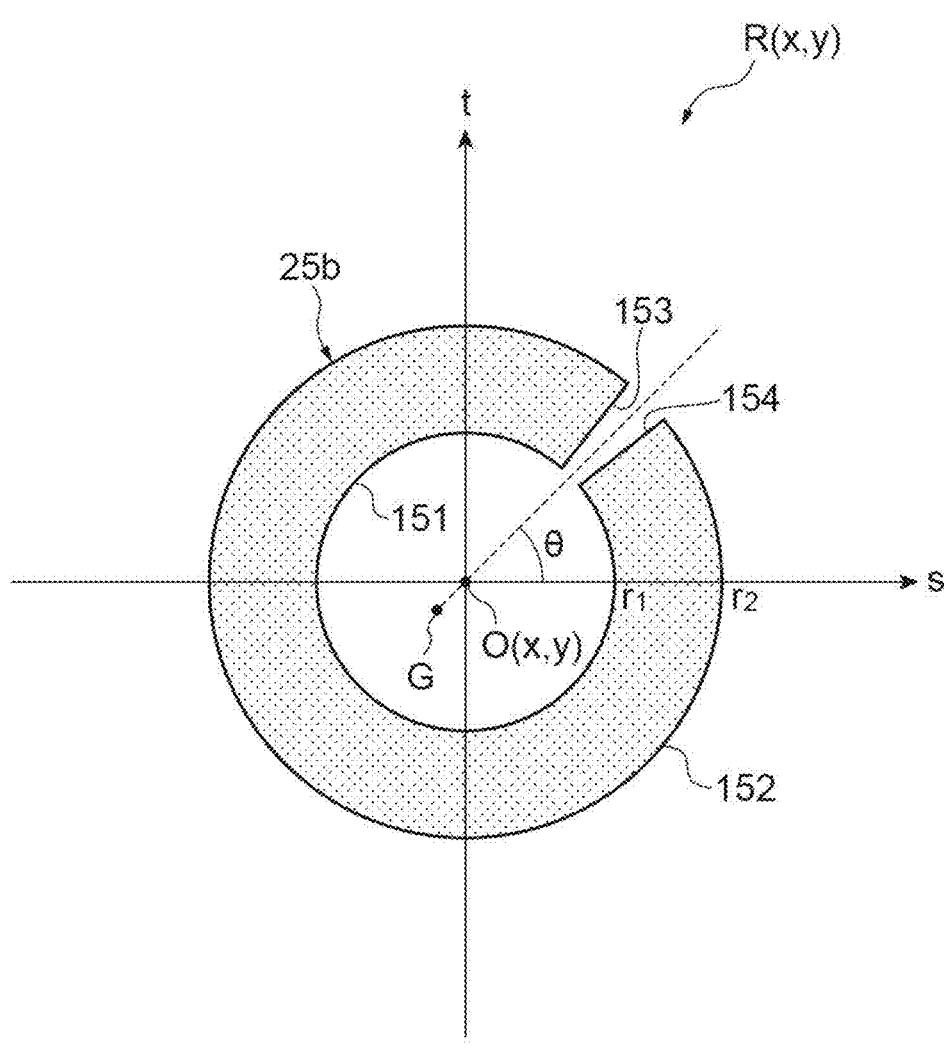
FIG. 3 is an enlarged view of one unit constituent region.

FIG. 3 is an enlarged view of one unit constituent region R(x, y). Coordinates in the unit constituent region R(x, y) are defined by the s-axis parallel to the X-axis and the t-axis parallel to the Y-axis. As shown in FIG. 3, the planar shape of the modified refractive index region 25$b$ is, for example, a C shape with the lattice point O(x, y) as a center of inner and outer arcs. Specifically, the planar shape of the modified refractive index region 25$b$ is defined by an arc 151 on the inner circumferential side, an arc 152 on the outer circumferential side, a line segment 153 connecting one end of the arc 151 to one end of the arc 152, and a line segment 154 connecting the other end of the arc 151 to the other end of the arc 152. The arcs 151 and 152 are major arcs. In other words, the central angle of the arcs 151 and 152 is greater than 180°. The central angle of the arc 151 and the central angle of the arc 152 are equal to each other. The central angle of the arcs 151 and 152 is, for example, 300° or more and less than 360°. The line segments 153 and 154 extend along the radial direction of the arcs 151 and 152.

Each of the modified refractive index regions 25$b$ has center of gravity G. Here, the angle formed between the vector from the lattice point O(x, y) to the center of the opening of the C shape and the X axis is θ. x indicates the position of the x-th (x0 to x3) lattice point on the X axis, and y indicates the position of the y-th (y0 to y2) lattice point on the Y axis. Note that the angle 0 that is individually set within the unit constituent region R(x, y) may be represented by O(x,y). When 180° is added to the angle θ(x,y), this angle agrees with the angle formed between the vector from the lattice point O(x, y) to the center of gravity G and the X axis. Therefore, in the following calculation, the angle θ(x,y) is regarded as corresponding to the angle formed between the vector from the lattice point O(x, y) to the center of gravity G and the X axis. The distance between the lattice point O(x, y) and the center of gravity G is constant regardless of x and y (across the phase modulation layer 25A). Note that since adding a constant to the phase angle does not change the obtained optical image, the phase angle may be designed without adding 180°.

As shown in FIG. 3, the angle θ(x,y) is set individually for each lattice point θ(x, y) according to a phase pattern according to a desired output beam pattern in the laser beam Lout. The phase pattern or distribution of the angle θ(x,y) has a specific value for each position determined by the x and y values, but is not necessarily represented by a specific function. That is, the distribution of the angle θ(x, y) is determined by extracting phase distribution out of complex amplitude distribution obtained by performing inverse Fourier transform on the desired output beam pattern in the laser beam Lout. Note that when obtaining the complex amplitude distribution from the desired output beam pattern, reproducibility of the beam pattern is improved by applying iterative algorithm such as the Gerchberg-Saxton (GS) method commonly used when computing hologram generation.

Figure 4:
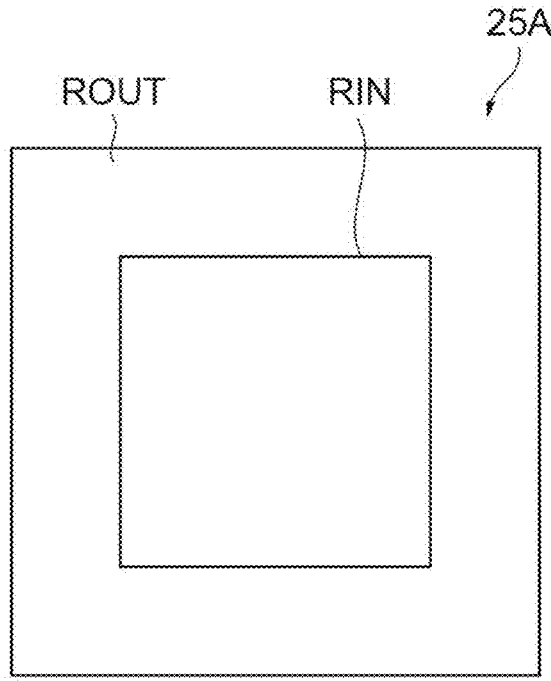
FIG. 4 is a plan view showing an example in which substantially periodic refractive index structure of FIG. 2 is applied only to a specific region of the phase modulation layer.
Figure 4:
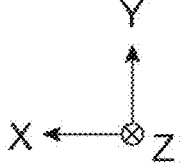

FIG. 4 is a plan view showing an example in which substantially periodic refractive index structure of FIG. 2 is applied only to a specific region of the phase modulation layer 25A. In the example shown in FIG. 4, the substantially periodic structure (for example, structure in FIG. 2) is formed to emit the target beam pattern inside a square inner region RIN. Meanwhile, modified refractive index regions each having a perfect circle where the position of the lattice point of the square lattice agrees with the center of gravity are arranged in an outer region ROUT surrounding the inner region RIN. Both inside the inner region RIN and outer region ROUT, the lattice spacing of the square lattice set virtually is the same. This structure has the advantage of being able to suppress generation of high-frequency noise (so-called window function noise) produced by the abrupt change in light intensity at the periphery of the inner region RIN by distributing light inside the outer region ROUT as well. In addition, light leakage in the in-plane direction (direction defined on the plane) can be suppressed, and reduction in a threshold value and an improvement in optical output efficiency can be expected.

Figure 5:
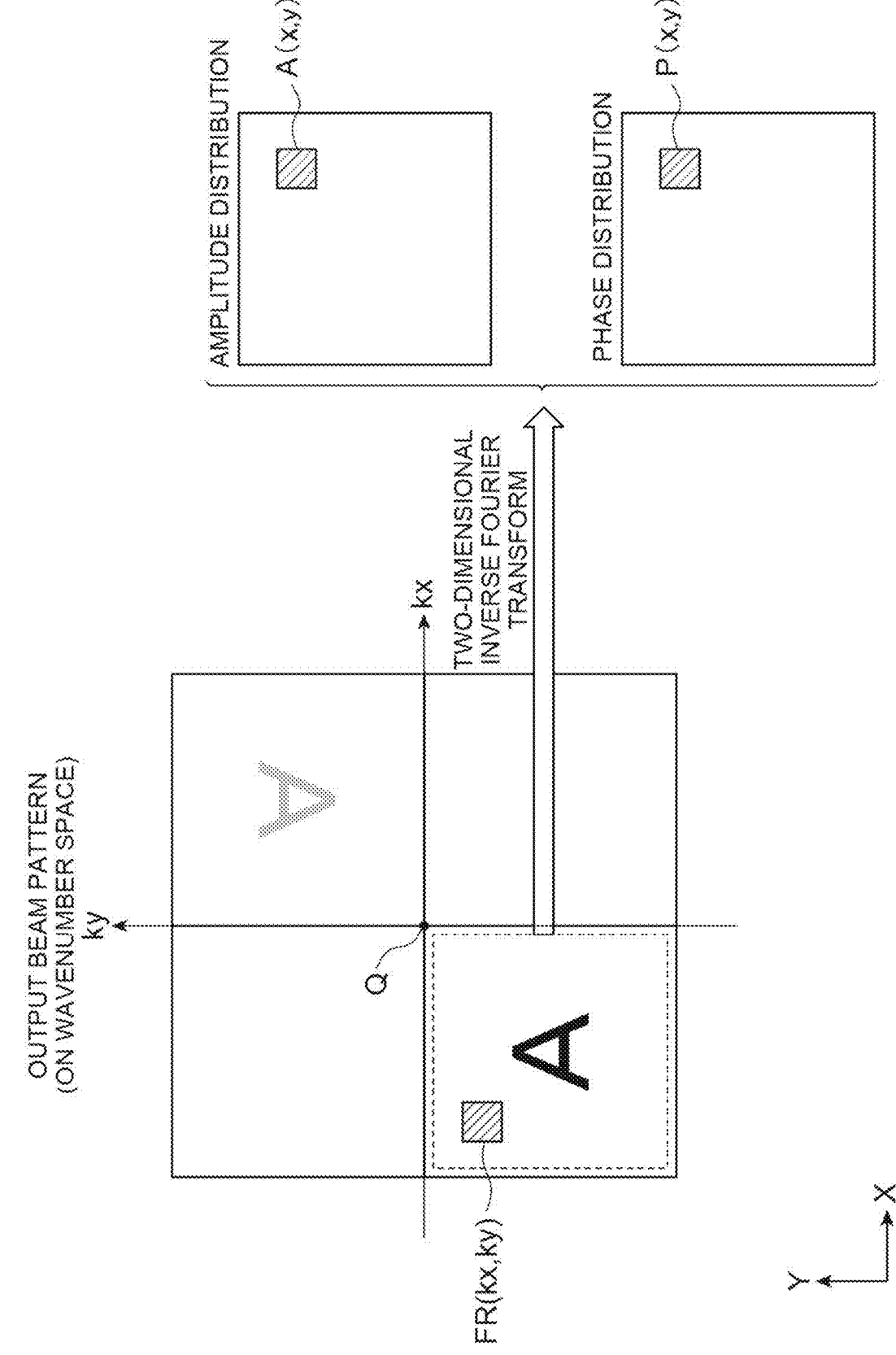
FIG. 5 is a diagram for describing the relationship between an optical image obtained by forming an image of an output beam pattern of the semiconductor laser element and angular distribution in the phase modulation layer.

FIG. 5 is a diagram for describing the relationship between an optical image obtained by forming an image of the output beam pattern of the semiconductor laser element 1A and distribution of the angle θ(x, y) in the phase modulation layer 25A. Note that the center Q of the output beam pattern is not necessarily located in the Z-axis direction with respect to the main surface 11 of the substrate 10, but can also be placed in the Z-axis direction with respect to the main surface 11. Here, for the purpose of description, it is assumed that the center Q is in the Z-axis direction with respect to the main surface 11. FIG. 5 shows four quadrants with the center Q as an origin. FIG. 5 shows the case where optical images are obtained in the first and third quadrants as an example, but it is also possible to obtain images in the second and fourth quadrants or in all quadrants. In the present embodiment, as shown in FIG. 5, optical images point-symmetrical with respect to the origin is obtained. FIG. 5 shows the case where the character "A" is obtained in the third quadrant and a pattern is obtained by rotating the character "A" by 180 degrees in the first quadrant as an example. Note that rotationally symmetric optical images (for example, cross, circle, double circle, and the like) are superimposed and observed as one optical image.

The optical image of the output beam pattern of the semiconductor laser element 1A may include at least one of a spot, a straight line, a cross, a line drawing, a lattice pattern, a photograph, a striped pattern, computer graphics (CG), and a character. Here, in order to obtain the desired optical image, the angular distribution θ(x, y) of the modified refractive index region 25b of the phase modulation layer 25A is determined by the following procedure.

To begin with, as a first precondition, in the Cartesian coordinate system defined by the Z-axis that agrees with the normal direction of the main surface 11 of the substrate 10 and the X-Y plane including mutually orthogonal X and Y axes that agrees with one surface of the phase modulation layer 25A including the plurality of modified refractive index regions 25b, the virtual square lattices including M1×N1 unit constituent regions R each having a square shape are set on the X-Y plane (M1 and N1 are integers greater than or equal to 1).

Figure 6:
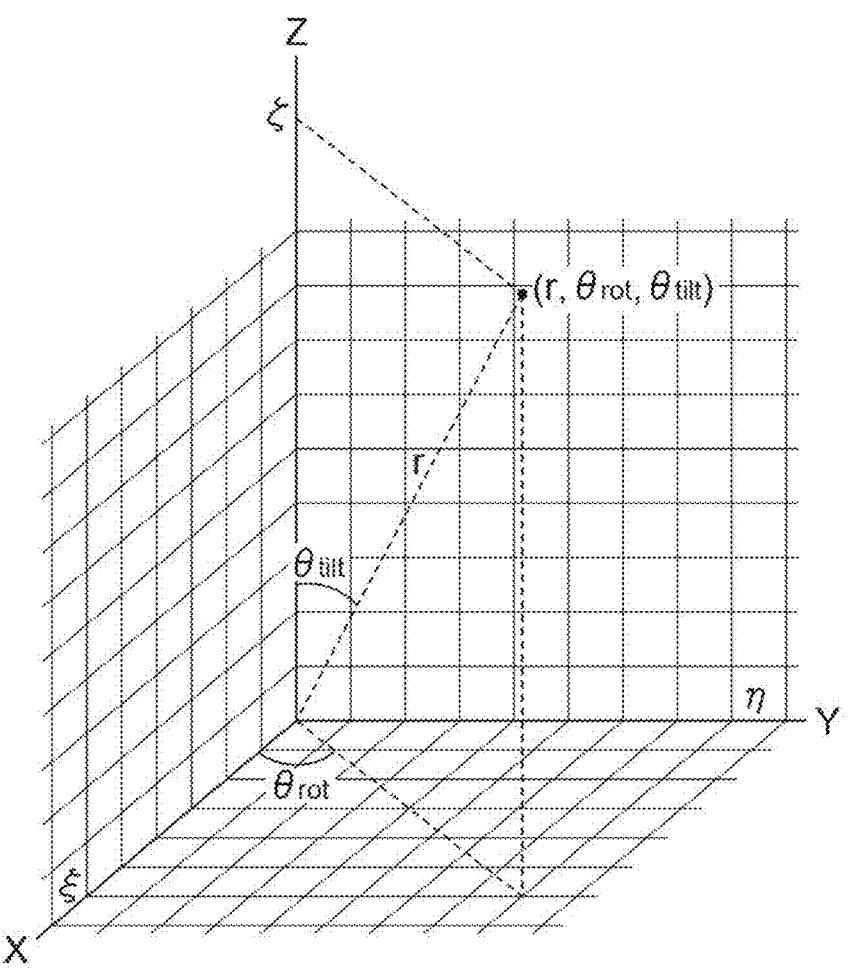
FIG. 6 is a diagram for describing coordinate conversion from spherical coordinates (r, $\theta_{rot}$, $\theta_{tilt}$) to coordinates (ξ, η, ζ).

As a second precondition, as shown in FIG. 6, it is assumed that coordinates (ξ, η, ζ) in this Cartesian coordinate system satisfy the relationship shown in the following Formulas (1) to (3) with respect to the spherical coordinates (r, θ$_{rot}$, θ$_{tilt}$) defined by a length r of a radial diameter, a tilt angle θ$_{tilt}$ from the Z axis, and a rotation angle θ$_{rot}$ from the X axis specified on the X-Y plane. Note that FIG. 6 is a diagram for describing coordinate conversion from the spherical coordinates (r, θ$_{rot}$, θ$_{tilt}$) to the coordinates (ξ, η, ζ). The beam pattern in design on a predetermined plane set in the Cartesian coordinate system, which is the real space, is represented by the coordinates (ξ, η, ζ). When the beam pattern outputted from the semiconductor laser element 1A is a set of bright spots pointing in the direction defined by the angles θ$_{tilt}$ and θ$_{rot}$, the angles θ$_{tilt}$ and θ$_{rot}$ are converted into a coordinate value k$_x$ that is the normalized wavenumber defined by the following Formula (4) on the Kx axis corresponding to the X axis, and a coordinate value k$_y$ that is the normalized wavenumber defined by the following Formula (5) on the Ky axis corresponding to the Y axis and orthogonal to the Kx axis. The normalized wavenumber means a wavenumber normalized by setting the wavenumber 2π/a corresponding to the lattice spacing a of the virtual square lattice to 1.0. At this time, in the wavenumber space defined by the Kx and Ky axes, the specific wavenumber range including the beam pattern includes M2×N2 image regions FR each having a square shape (M2 and N2 are integers equal to or greater than 1). Note that the integer M2 does not need to agree with the integer M1. Similarly, the integer N2 does not need to agree with the integer N1. Formulas (4) and (5) are disclosed, for example, in Non-Patent Document 2 described above.

$$\xi = r\sin\theta_{tilt}\cos\theta_{rot} \qquad (1)$$

$$\eta = r\sin\theta_{tilt}\sin\theta_{rot} \qquad (2)$$

$$\zeta = r\cos\theta_{tilt} \qquad (3)$$

$$k_x = \frac{a}{\lambda}\sin\theta_{tilt}\cos\theta_{rot} \qquad (4)$$

$$k_y = \frac{a}{\lambda}\sin\theta_{tilt}\sin\theta_{rot} \qquad (5)$$

a: lattice spacing of virtual square lattice (lattice constant)
λ: light emission wavelength of active layer 24

As a third precondition, in the wavenumber space, a complex amplitude F(x,y) obtained by performing two-dimensional inverse discrete Fourier transform on each image region FR(k$_x$, k$_y$) specified by the Kx-axis coordinate component k$_x$ (integer equal to or greater than 0 and equal to or less than M2−1) and the Ky-axis coordinate component k$_y$ (integer equal to or greater than 0 and equal to or less than N2−1) to the unit constituent region R(x, y) on the X-Y plane specified by the X-axis coordinate component x (integer equal to or greater than 0 and equal to or less than M1−1) and the Y-axis coordinate component y (integer equal to or greater than 0 and equal to or less than N1−1) is given by the following Formula (6) with j as an imaginary unit. This complex amplitude F(x, y) is defined by the following Formula (7) when the amplitude term is A(x, y) and the phase term is P(x, y). Furthermore, as a fourth precondition, the unit constituent region R(x, y) is defined by the s-axis and t-axis parallel to the X-axis and Y-axis respectively and orthogonal at the lattice point O(x, y) that is the center of the unit constituent region R(x, y).

$$F(x, y) = \sum_{k_x=0}^{M2-1} \sum_{k_y=0}^{N2-1} FR(k_x, k_y)\exp\left[j2\pi\left(\frac{k_x}{M2}x + \frac{k_y}{N2}y\right)\right] \qquad (6)$$

$$F(x, y) = A(x, y) \times \exp[jP(x, y)] \qquad (7)$$

Under the first to fourth preconditions, the phase modulation layer 25A is configured to satisfy the following first and second conditions. That is, the first condition is that the center of gravity G is placed away from the lattice point O(x, y) in the unit constituent region R(x, y). The second condition is that, in a state where the line segment length r(x, y) from the lattice point O(x, y) to the corresponding center of gravity G is set to a common value for each of M1×N1 unit constituent regions R, the corresponding modified refractive index region 25b is arranged within the unit constituent region R(x, y) such that the angle θ(x, y) formed between the line segment connecting the lattice point O(x, y) to the corresponding center of gravity G and the s axis satisfies the following relationship:

$$\theta(x,y)=C\times P(x,y)+B$$

C: constant of proportionality, for example, 180°/π
B: arbitrary constant, for example, 0.

As a method for obtaining intensity distribution and phase distribution from the complex amplitude distribution obtained by the Fourier transform, for example, the amplitude distribution A(x, y) can be calculated by using the abs function of numerical analysis software MATLAB of The MathWorks, Inc., and the phase distribution P(x, y) can be calculated by using the angle function of MATLAB.

Figures 7A, 7B:
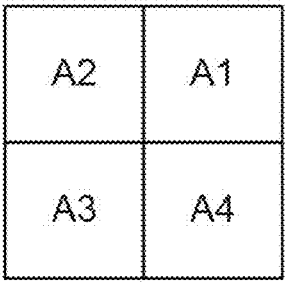
FIGS. 7A and 7B are diagrams for describing points to be noticed when performing calculation using a general discrete Fourier transform (or fast Fourier transform) when determining arrangement of each modified refractive index region.

Here, points to be noted in a case of obtaining the angular distribution θ(x, y) from the Fourier transform result of the output beam pattern, and in a case of performing calculation using a general discrete Fourier transform (or fast Fourier transform) when determining arrangement of each modified refractive index region 25b will be described. When the optical image before Fourier transform is divided into four quadrants A1, A2, A3, and A4 as shown in FIG. 7A, the resulting beam pattern is as shown in FIG. 7B. That is, a superimposed pattern of a pattern obtained by rotating the pattern in the first quadrant of FIG. 7A by 180 degrees and a pattern in the third quadrant of FIG. 7A appears in the first quadrant of the beam pattern. A superimposed pattern of a pattern obtained by rotating the pattern in the second quadrant of FIG. 7A by 180 degrees and a pattern in the fourth quadrant of FIG. 7A appears in the second quadrant of the beam pattern. A superimposed pattern of a pattern obtained by rotating the pattern in the third quadrant of FIG. 7A by 180 degrees and a pattern in the first quadrant of FIG. 7A appears in the third quadrant of the beam pattern. A super-imposed pattern of a pattern obtained by rotating the pattern in the fourth quadrant of FIG. 7A by 180 degrees and a pattern in the second quadrant of FIG. 7A appears in the fourth quadrant of the beam pattern.

Therefore, when the beam pattern having values only in the first quadrant is used as the output beam pattern before Fourier transform (original image), the first quadrant of the original optical image appears in the third quadrant of the beam pattern obtained, and a pattern appears in which the first quadrant of the original optical image is rotated 180 degrees in the first quadrant of the beam pattern obtained.

In this way, in the phase modulation layer 25A, the desired beam pattern is obtained by phase-modulating the wave front. This beam pattern is not only one pair of unimodal beams (spots), but can be a vector beam in which the character shape, 2 or more same shape spot groups, or phase and intensity distribution are spatially uneven.

Note that the diffraction intensity changes as the magni-tude of each modified refractive index region 25b changes. This diffraction efficiency is proportional to the optical coupling coefficient represented as a coefficient when the shape of the modified refractive index region 25b undergoes Fourier transform. The optical coupling coefficient is described, for example, in Non-Patent Document 3 described above.

Next, the features of the phase modulation layer 25A of the present embodiment will be described in detail. In the present embodiment, the lattice spacing a of the virtual square lattice and the light emission wavelength λ of the active layer 24 satisfy the condition for Γ-point oscillation.

To begin with, for comparison, the photonic crystal layer of PCSEL in which circular modified refractive index regions are provided on the lattice points of the virtual square lattices (that is, modified refractive index regions are arranged periodically) will be described. The photonic crys-tal layer of PCSEL outputs a laser beam in a direction perpendicular to the main surface of the substrate while forming a standing wave with an oscillation wavelength according to the arrangement cycle of the modified refrac-tive index region on a surface perpendicular to the thickness direction (reference surface). The photonic crystal layer of PCSEL is usually designed to oscillate at the Γ point. For Γ-point oscillation, the lattice spacing a of the virtual square lattice, the wavelength λ of light inputted to the photonic crystal layer, and the mode equivalent refractive index n preferably satisfy the condition λ=na.

Figure 8:
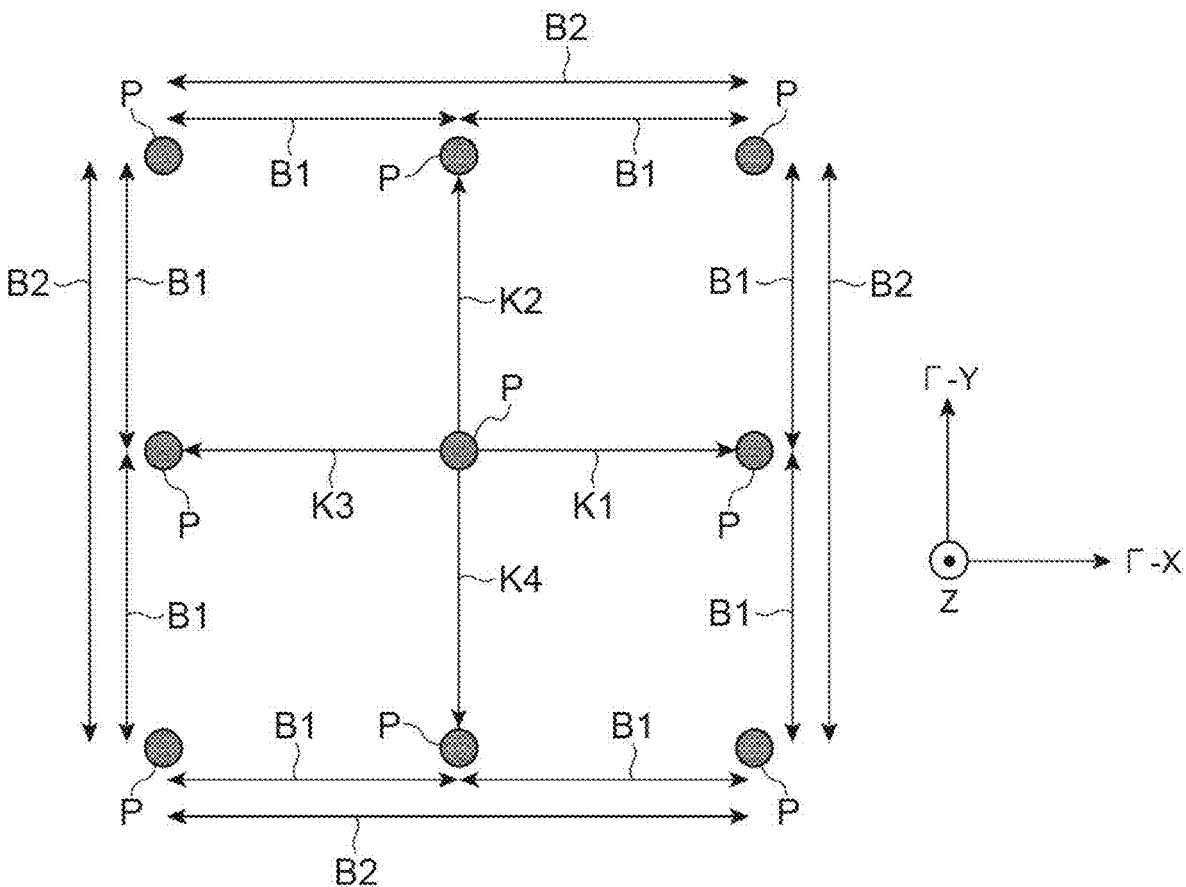
FIG. 8 is a plan view showing a reciprocal lattice space regarding a photonic crystal layer that oscillates at a Γ point.

FIG. 8 is a plan view showing a reciprocal lattice space regarding the photonic crystal layer that oscillates at the Γ point. FIG. 8 shows a case where the plurality of modified refractive index regions is located on the lattice points of the square lattices, and a point P in FIG. 8 represents a reciprocal lattice point. In FIG. 8, an arrow B1 represents a basic reciprocal lattice vector, and each arrow B2 represents a reciprocal lattice vector that is twice the basic reciprocal lattice vector B1. Arrows K1, K2, K3, and K4 represent four in-plane wavenumber vectors. The four in-plane wavenum-ber vectors K1, K2, K3, and K4 are combined with each other via 90° and 180° diffraction to form a standing wave state. Here, a Γ-X axis and a Γ-Y axis that are orthogonal to each other in the reciprocal lattice space are defined. The Γ-X axis is parallel to one side of the square lattice, and the Γ-Y axis is parallel to the other side of the square lattice. The in-plane wavenumber vectors are vectors obtained by pro-jecting the wavenumber vectors onto the Γ-X-Γ-Y plane. That is, the in-plane wavenumber vector K1 points in a positive direction on the Γ-X axis, the in-plane wavenumber vector K2 points in a positive direction on the Γ-Y axis, the in-plane wavenumber vector K3 points in a negative direc-tion on the Γ-X axis, and the in-plane wavenumber vector K4 points in a negative direction on the Γ-Y axis. As is apparent from FIG. 8, in the photonic crystal layer oscillat-ing at the Γ point, the magnitudes of the in-plane wavenum-ber vectors K1 to K4 (that is, magnitude of the standing wave in the in-plane direction) are equal to the magnitude of the basic reciprocal lattice vector B1. Note that if the magnitudes of the in-plane wavenumber vectors K1 to K4 are k, the relationship of the following Formula (8) holds.

$$k = |B1| = \frac{2\pi}{a} \tag{8}$$

Figure 9:
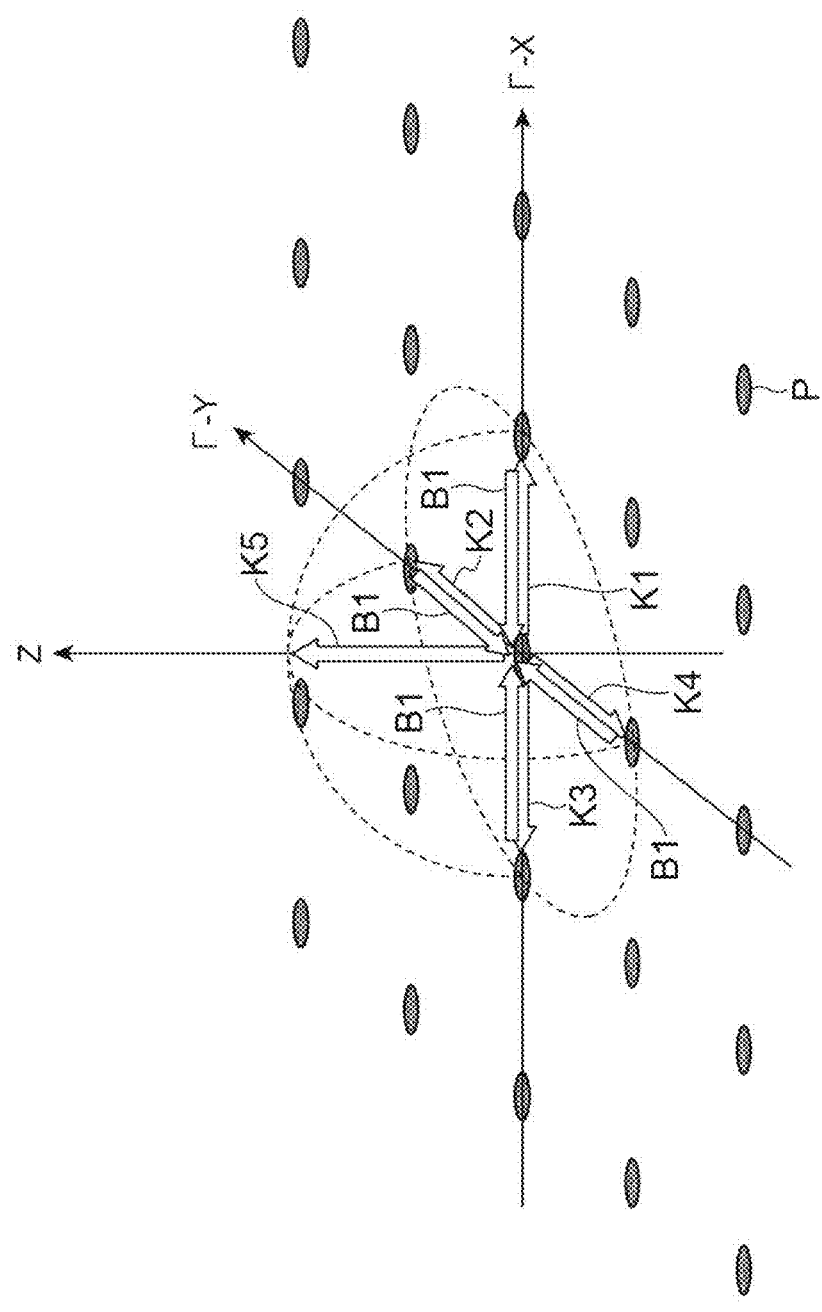
FIG. 9 is a three-dimensional perspective view of the reciprocal lattice space shown in FIG. 8.

FIG. 9 is a three-dimensional perspective view of the reciprocal lattice space shown in FIG. 8. FIG. 9 shows the Z-axis orthogonal to the directions of the Γ-X axis and the Γ-Y axis. This Z-axis is the same as the Z-axis shown in FIG. 1. As shown in FIG. 9, in the photonic crystal layer oscil-lating at the Γ point, the wavenumber in the in-plane direction becomes 0 due to diffraction, and diffraction occurs in a direction perpendicular to the plane (Z-axis direction) (arrow K5 in the drawing). Therefore, the laser beam Lout is basically outputted in the Z-axis direction.

Figure 10:
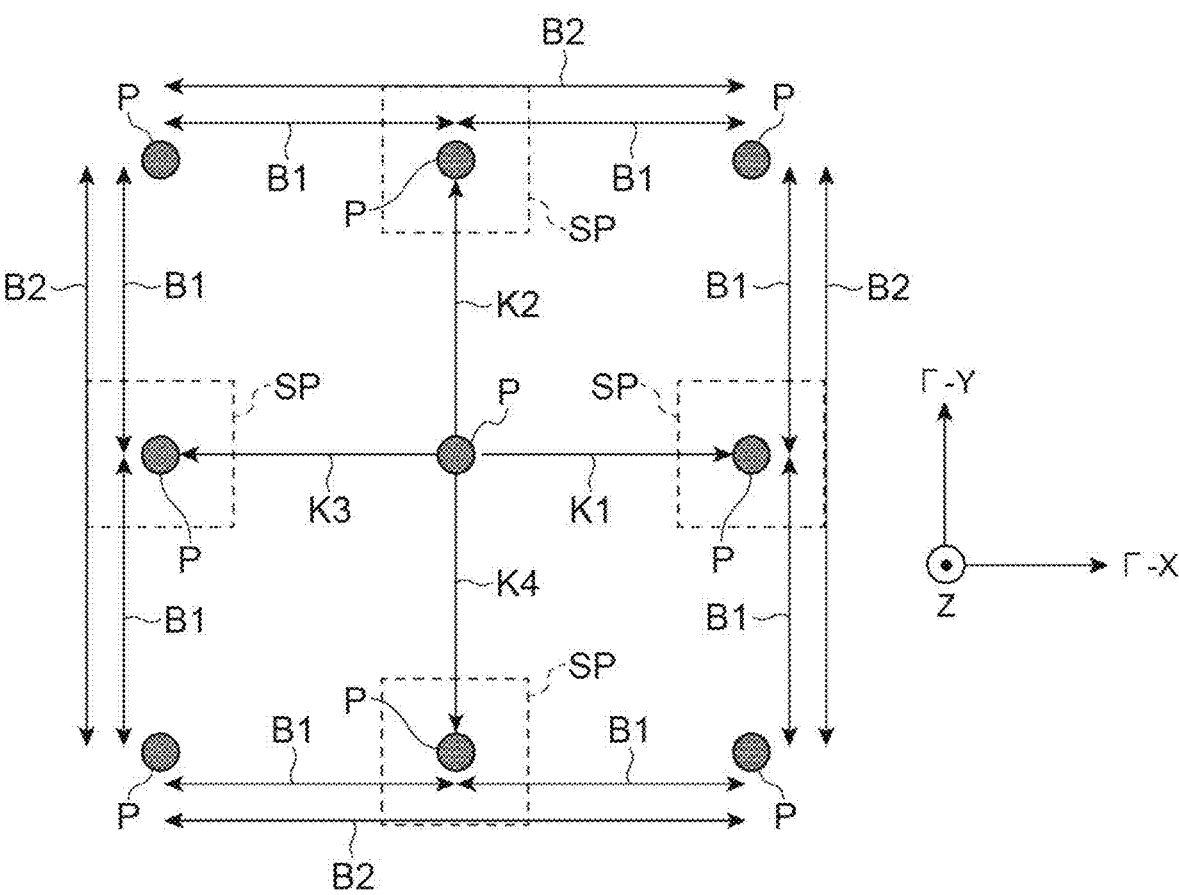
FIG. 10 is a plan view showing a reciprocal lattice space regarding an optical diffraction layer that oscillates at the Γ point.

Next, oscillating the phase modulation layer 25A having the substantially periodic structure shown in FIG. 2 at the Γ point is considered. The condition for Γ-point oscillation is the same as in the PCSEL described above. FIG. 10 is a plan view showing the reciprocal lattice space regarding the optical diffraction layer that oscillates at the F point. The basic reciprocal lattice vector B1 is similar to the PCSEL with Γ-point oscillation (see FIG. 8). The in-plane wav-enumber vectors K1 to K4 undergo phase modulation by the angular distribution θ(x,y), and each have a wavenumber spread SP corresponding to the spread angle of the output beam pattern. The wavenumber spread SP can be repre-sented as a rectangular region with lengths of sides in the X and Y directions being $2\Delta kx_{max}$ and $2\Delta ky_{max}$ respectively with a tip of each of the in-plane wavenumber vectors K1 to K4 in the PCSEL with Γ-point oscillation as a center. With such a wavenumber spread SP, respective in-plane wav-enumber vectors K1 to K4 spread over a rectangular range of (Kix+Δkx, Kiy+Δky) (i=1 to 4, Kix is an X-axis compo-nent of vector Ki, Kiy is a Y-axis component of vector Ki). Here, $-\Delta kx_{max} \leq \Delta kx \leq \Delta kx_{max}$ and $-\Delta ky_{max} \leq \Delta ky \leq \Delta ky_{max}$. The magnitudes of $\Delta kx_{max}$ and $\Delta ky_{max}$ are determined according to the spread angle of the output beam pattern.

Figure 11:
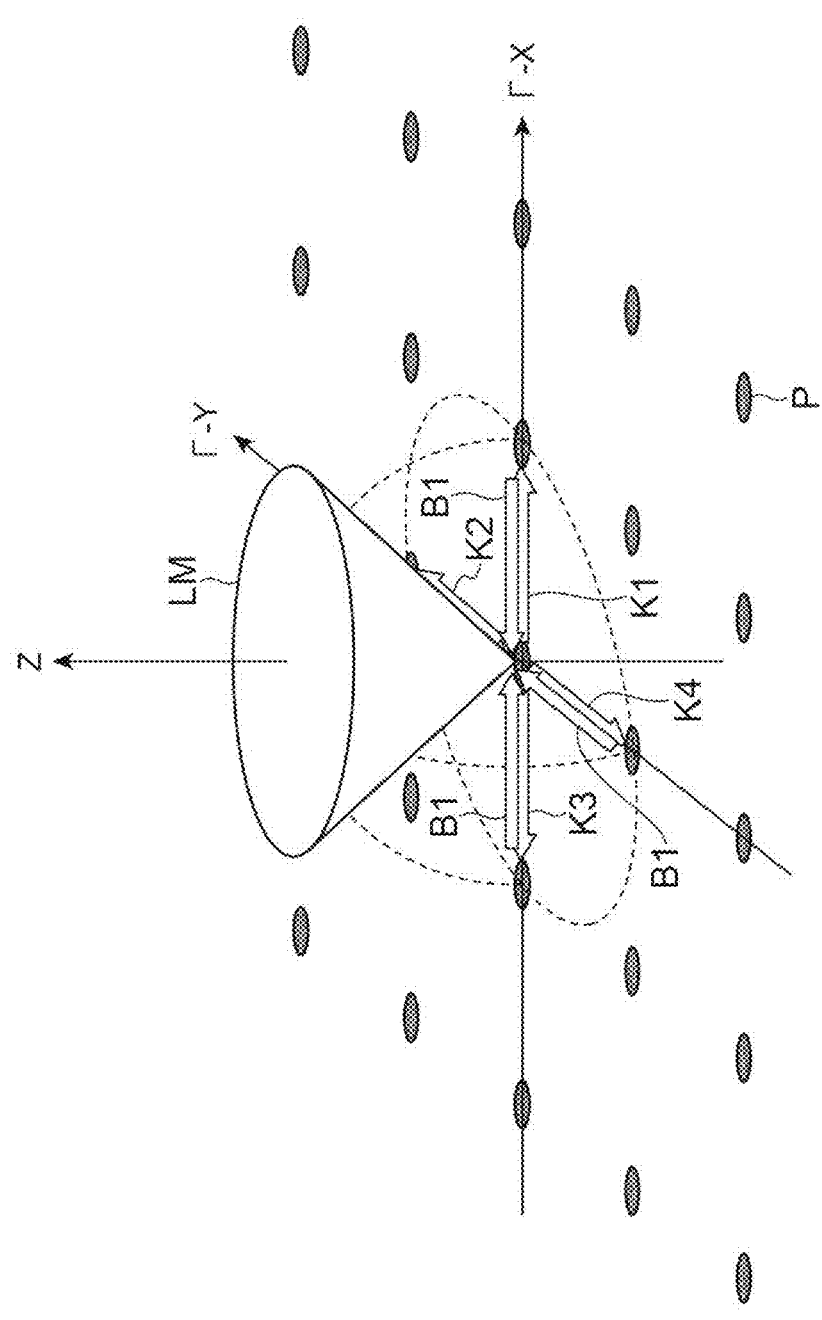
FIG. 11 is a three-dimensional perspective view of the reciprocal lattice space shown in FIG. 10.

FIG. 11 is a three-dimensional perspective view of the reciprocal lattice space shown in FIG. 10. FIG. 11 shows the Z-axis orthogonal to the directions of the Γ-X axis and the Γ-Y axis. This Z-axis is the same as the Z-axis shown in FIG. 1. As shown in FIG. 11, for the phase modulation layer 25A oscillating at the Γ point, a beam pattern LM having spatial spread including zero-order light in the direction perpen-dicular to the plane (Z-axis direction) and +1st-order light and −1st-order light in a direction inclined to the Z-axis direction are outputted.

Figure 12A:
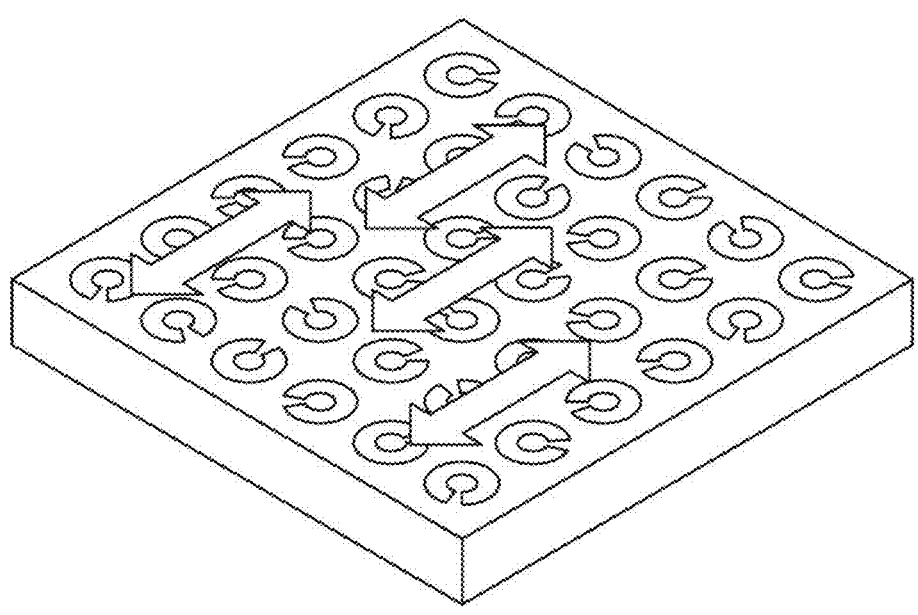
FIG. 12A is a diagram conceptually showing a state where localization of oscillation modes advances and local one-dimensional oscillation competes with each other.
Figure 12B:
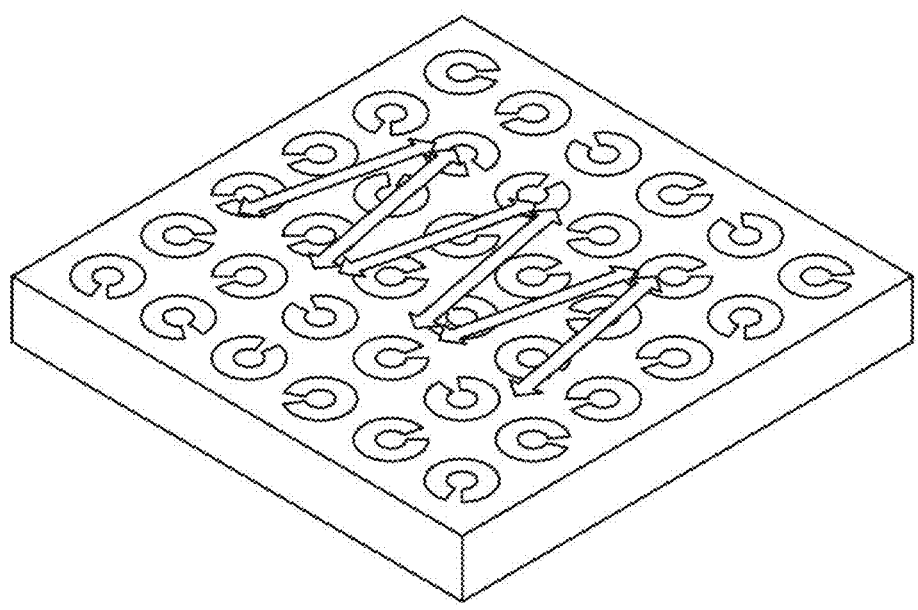
FIG. 12B is a diagram conceptually showing a state where flat band oscillation occurs and flat band competition occurs.
Figure 13A:
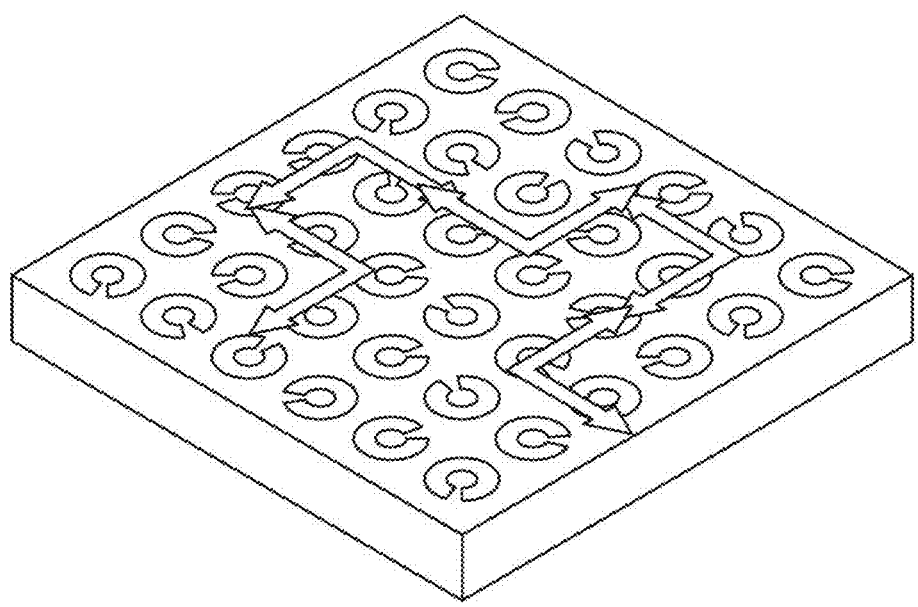
FIG. 13A is a diagram conceptually showing a state where two-dimensional diffraction is promoted.
Figure 13B:
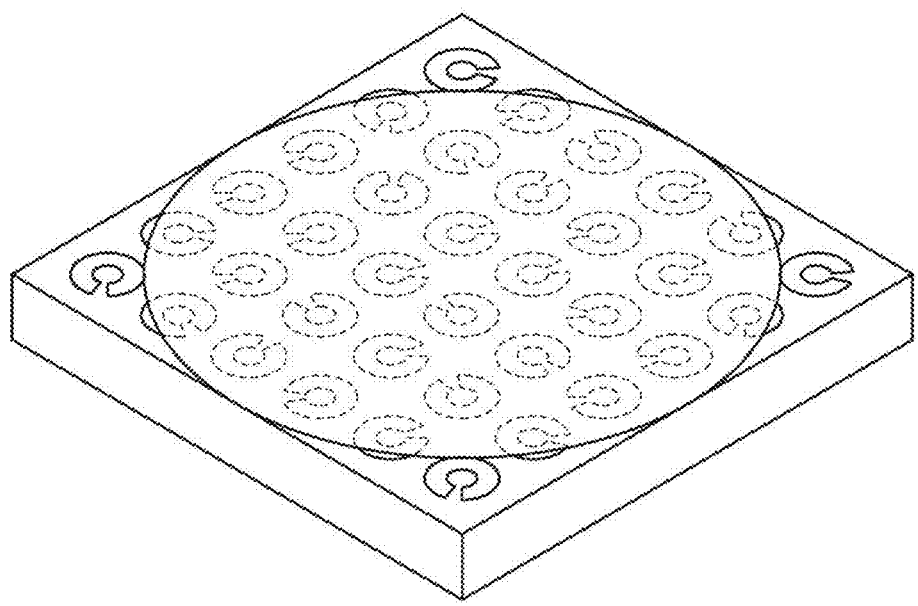
FIG. 13B is a diagram conceptually showing a state where modes are widely distributed over the entire region of the phase modulation layer.

The feature of each modified refractive index region 25b included in the phase modulation layer 25A of the present embodiment will be further described. When the phase modulation layer 25A has large one-dimensional diffraction (diffraction in 180° direction), as conceptually shown in FIG. 12A, localization of the oscillation mode progresses and local oscillation occurs, and competition of local one-dimensional oscillation occurs. This contributes to the formation of a higher mode. As conceptually shown in FIG. 12B, flat band oscillation occurs and flat band competition occurs. Note that in FIGS. 12A and 12B, arrows represent the diffraction direction of light. Here, the flat band oscillation is a phenomenon in which a standing wave is formed and oscillates in a flat region of the photonic band in the Γ-X direction near the band edge for the Γ point, and in the Γ-M direction near the band edge for the M point, and is in a zigzag resonance state as shown in FIG. 12B. At this time, the emitted beam becomes elongated, resulting in an optical image extending with respect to the design pattern. Competition may occur at the same time as the band-edge oscillation to cause flat band competition in which flat band oscillation occurs. These phenomena make the light intensity distribution in the phase modulation layer 25A uneven, leading to degradation of image quality of the optical image with respect to the design pattern. In contrast, when one-dimensional local oscillation is suppressed, two-dimensional diffraction is promoted as shown in FIG. 13A. Therefore, since localization of the oscillation mode is suppressed and the formation of higher mode becomes difficult, the threshold gain difference between the basic mode and higher mode can be increased. In addition, flat band competition can be suppressed by suppressing flat band oscillation. Furthermore, as shown in FIG. 13B, the mode can be widely distributed across the phase modulation layer 25A. Therefore, since it is possible to make the light intensity distribution of the output beam pattern uniform and increase the area of the region where output is possible in a single mode, it is possible to improve the resolution and image quality of the emitted optical image.

Therefore, conditions for reducing the one-dimensional diffraction in the phase modulation layer 25A will be examined. According to the inventor's findings, for Γ-point oscillation, as the (±2, ±0)-order and (±0, ±2)-order Fourier coefficient of the basic wave approaches zero, the one-dimensional diffraction in the 180° direction of the light incident on the phase modulation layer 25A is further suppressed. That is, the diffraction between optical waves is represented by the coupling coefficient κ of the three-dimensional coupled wave theory shown in the following paper, which is proportional to the Fourier coefficient. If the above-described Fourier coefficient is zero, κ that contributes to coupling in the 180° direction of Γ-point oscillation is 0, and direct coupling of the optical wave in the 180° direction does not occur. However, indirect coupling through higher-order diffraction exists (see Non-Patent Document 4). Note that (±2,±0)-order and (±0,±2)-order Fourier coefficient approaching zero means that the (+2,0)-order, (−2,0)-order, (0,+2)-order, and (0,−2)-order four Fourier coefficients approach zero.

The planar shape of the modified refractive index region 25b of the present embodiment is a C shape with the lattice point O(x, y) as a center of inner and outer arcs, as shown in FIG. 3. Virtually rotating the modified refractive index region 25b having such a planar shape by one lap with the corresponding lattice point O(x, y) as a rotation center provides an annular shape. The inside radius of the annular shape is equal to the radius $r_1$ of the inner circle, and the outside radius is equal to the radius $r_2$ of the outer circle. In the following description, in considering diffraction action in the phase modulation layer 25A, each modified refractive index region 25b is approximately regarded as a two-dimensional photonic crystal having this annular shape.

The relationship between the Fourier coefficient and the radius of a circle is generally represented by the following Formula (9). Here, p is an absolute value of the Fourier order, $J_1$ is a first-order Bessel function, R is a radius of the circle, and circ(r) is a function represented by the following Formula (10). Note that the radius R is a value normalized by the lattice spacing a.

$$F(\rho) = FT\left[circ(r/R)\right] = RJ_1(2\pi R\rho)/\rho \qquad (9)$$

$$circ(r) = \begin{cases} 1 & r < 1 \\ 0.5 & r = 1 \\ 0 & r > 1 \end{cases} \qquad (10)$$

The Fourier coefficient of an annular shape is a value obtained by subtracting the Fourier coefficient of the inner circle from the Fourier coefficient of the outer circle. That is, the Fourier coefficient of the annular shape is represented by the following Formula (11). Here, $R_1$ is the radius of the inner circle (=$r_1$) and $R_2$ is the radius of the outer circle $r_2$).

$$F(\rho)=FT[circ(r/R_2)-circ(r/R_1)]=\{R_2J_1(2\pi R_2\rho)-R_1J_1$$
$$(2\pi R_1\rho)\}/\rho \qquad (11)$$

When the phase modulation layer 25A is oscillated at the Γ point, the lattice spacing a is determined such that the wavenumber of the basic wave is $k=2\pi/\lambda=2\pi/a$. Therefore, the Fourier coefficient of the circle shown in Formula (9) is represented by the following Formula (12) because in the case of Γ-point oscillation, ρ=2 for the (±2, 0)-order or (0, ±2)-order that contributes to the one-dimensional diffraction. Here, r is the radius of the circle. Note that the radius r is a value normalized by the lattice spacing a.

$$rJ_1(4\pi r)/2 \qquad (12)$$

Figure 14:
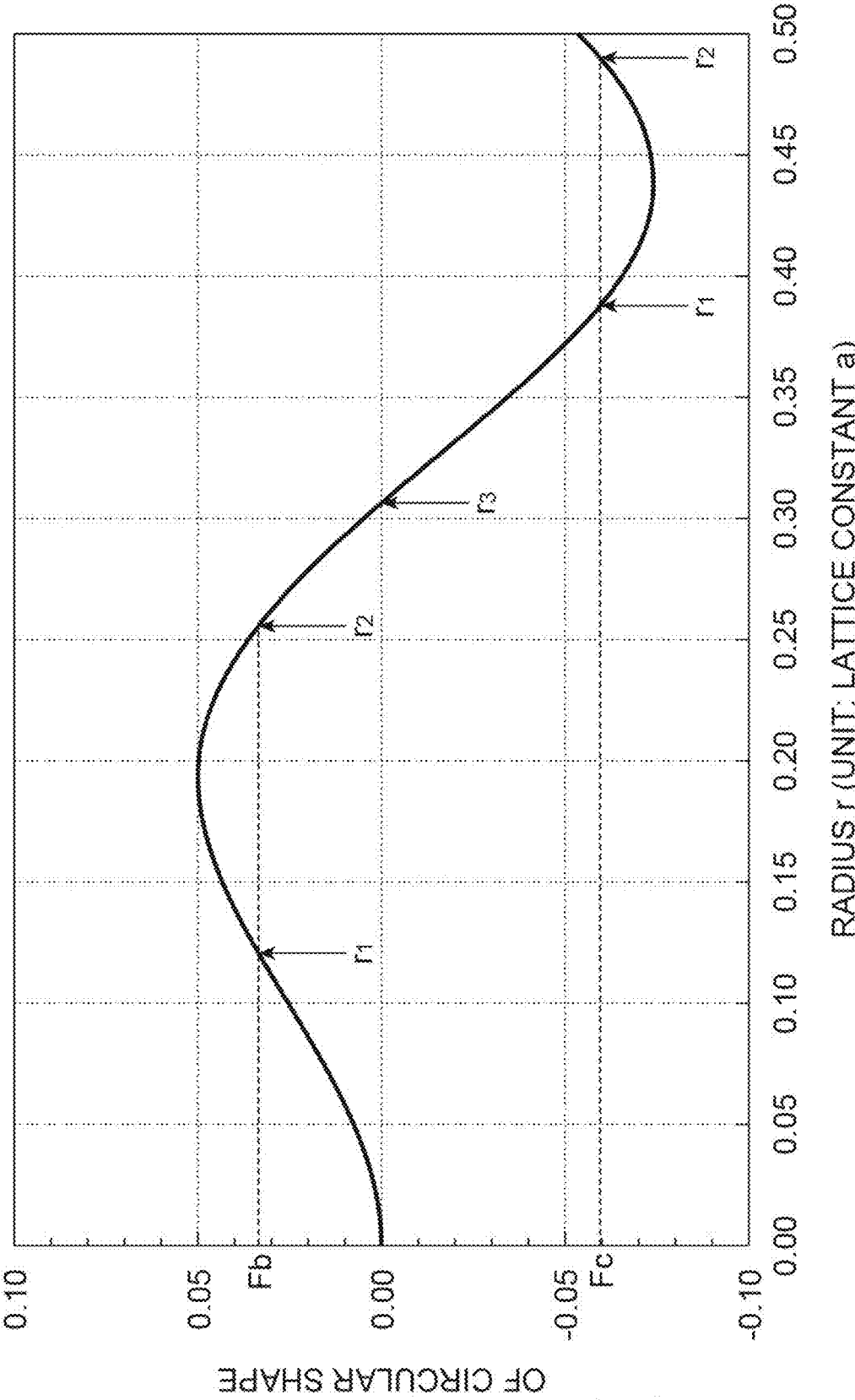
FIG. 14 is a graph showing the relationship of Formula (12).

FIG. 14 is a graph showing the relationship of Formula (12). In FIG. 14, the vertical axis represents the Fourier coefficient, and the horizontal axis represents the magnification of the radius of the circle with respect to the lattice spacing a. As shown in FIG. 14, the Fourier coefficient in the Γ-point oscillation has a maximum value (0.05) when the radius of the circle is 0.19 times the lattice spacing a. The Fourier coefficient increases and decreases with almost same inclination before and after the maximum value. The Fourier coefficient in the Γ-point oscillation has a minimum value (−0.075) when the radius of the circle is 0.44 times the lattice spacing a. The Fourier coefficient decreases and increases with almost the same inclination before and after the minimum value.

If the Fourier coefficient of the inner circle and the Fourier coefficient of the outer circle are equal to each other, the Fourier coefficient of the annular shape is zero. Therefore, in order to make the Fourier coefficient of the annular shape zero, as shown in FIG. 14, two radii corresponding to a certain Fourier coefficient Fb is preferably set to the inner radius $r_1$ and the outer radius $r_2$. In this case, the inner radius $r_1$ is smaller than 0.19 times the lattice spacing a, and the outer radius $r_2$ is larger than 0.19 times the lattice spacing a. Alternatively, two radii corresponding to a certain Fourier coefficient Fc may be set to the inner radius $r_1$ and the outer radius $r_2$. In this case, the inner radius $r_1$ is smaller than 0.44 times the lattice spacing a, and the outer radius $r_2$ is larger than 0.44 times the lattice spacing a.

In the above description, by setting the Fourier coefficient to zero, one-dimensional local oscillation is suppressed, but even if the Fourier coefficient is not strictly zero, it is possible to suppress one-dimensional local oscillation by setting the absolute value to an extremely small value. Specifically, when the absolute value of the ($\pm$2, 0)-order and (0,$\pm$2)-order Fourier coefficient of the annular shape obtained by virtually rotating the modified refractive index region 25$b$ by one lap with the lattice point O (x, y) as a rotation center is 0.01 or less, or 20% or less of the maximum peak value (0.05 in the example in FIG. 14) of the ($\pm$2, 0)-order and (0,$\pm$2)-order Fourier coefficient of the circular shape, the one-dimensional local oscillation can be suppressed effectively. When the ratio ($F_2/F_1$) of the ($\pm$2,0)-order and (0,$\pm$2)-order Fourier coefficient $F_1$ of the inner circle that defines the annular shape to the ($\pm$2,0)-order and (0,$\pm$2)-order Fourier coefficient $F_2$ of the outer circle is 0.99 or more and 1.01 or less, the one-dimensional local oscillation can be suppressed effectively. In one example, the inner radius $r_1$ is 0.085 times the lattice spacing a, and the outer radius $r_2$ is 0.28 times the lattice spacing a. In another example, the inner radius $r_1$ is 0.41 times the lattice spacing a, and the outer radius $r_2$ is 0.47 times the lattice spacing a.

Note that in the semiconductor laser element 1A of the present embodiment, when the active layer 24 and the phase modulation layer 25A are provided, the material of each layer, the thickness of the layer, and the layer structure can be changed. Here, a scaling law holds for the so-called square lattice photonic crystal laser when perturbation from the virtual square lattice is zero. That is, when the wavelength is multiplied by a constant $\alpha$, a similar standing wave state can be obtained by multiplying the entire square lattice structure by a. Similarly, in the present embodiment as well, it is possible to determine the structure of the phase modulation layer 25A by the scaling law according to the wavelength. Therefore, by using the active layer 24 that emits light in blue, green, red, and the like, and applying the scaling law according to the wavelength, it is also possible to implement the semiconductor laser element 1A that outputs visible light.

When manufacturing the semiconductor laser element 1A, metal organic chemical vapor deposition (MOCVD) or molecular beam epitaxy (MBE) is used to grow each compound semiconductor layer. When manufacturing the semiconductor laser element 1A using AlGaAs, the growth temperature is from 500° C. to 850° C., 550 to 700° C. is adopted in an experiment, TMA (trimethylaluminum) can be used as a raw material for Al during growth, TMG (trimethylgallium) and TEG (triethylgallium) can be used as a raw material for gallium, $AsH_3$ (arsine) can be used as a raw material for As, $Si_2H_6$ (disilane) can be used as a raw material for n-type impurities, and DEZn (diethyl zinc) can be used as a raw material for p-type impurities. The insulating film may be formed by sputtering a target using its constituent material as a raw material, or by the PCVD (plasma CVD) method.

When manufacturing the semiconductor laser element 1A, to begin with, the lower cladding layer 23, the active layer 24, and the base layer 25$a$ of the phase modulation layer 25A are epitaxially grown in sequence using the metal organic chemical vapor deposition (MOCVD) method on the main surface 11 of the substrate 10. Next, a resist is applied onto the base layer 25$a$, a two-dimensional fine pattern is drawn on the resist with an electron beam drawing device, and the two-dimensional fine pattern is formed on the resist by development. After that, using the resist as a mask, the two-dimensional fine pattern is transferred onto the base layer 25$a$ by dry etching, and after holes are formed, the resist is removed. Note that a SiN layer or $SiO_2$ layer may be formed on the base layer 25$a$ by the PCVD method before forming the resist, a resist mask may be formed thereon, a fine pattern may be transferred to the SiN layer or $SiO_2$ layer by using reactive ion etching (RIE), and dry etching may be performed after the resist is removed. In this case, resistance to dry etching can be enhanced. These holes are defined as the modified refractive index regions 25$b$, or in these holes, a compound semiconductor (for example, AlGaAs) that will be the modified refractive index regions 25$b$ is regrown to a depth greater than that of the holes. When the holes are the modified refractive index regions 25$b$, the holes may be filled with a gas such as air, nitrogen, hydrogen, or argon. Subsequently, the upper cladding layer 26 and the contact layer 27 are epitaxially grown in sequence on the base layer 25$a$ by using the MOCVD method. After that, the electrodes 28 and 29 are formed by vapor deposition or sputtering. The anti-reflective film 31 and the protective film 32 are formed by sputtering, PCVD, or the like as necessary.

Effects obtained by the semiconductor laser element 1A of the present embodiment described above will be described. In this semiconductor laser element 1A, the annular shape is obtained by virtually rotating each modified refractive index region 25$b$ by one lap with the corresponding lattice point O(x, y) as a rotation center. The absolute value of the ($\pm$2,0)-order and (0,$\pm$2)-order Fourier coefficient of the annular shape is 0.01 or less, or 20% or less of the maximum peak value of the ($\pm$2,0)-order and (0,$\pm$2)-order Fourier coefficient of the circular shape. In this way, since the ($\pm$2,0)-order and (0,$\pm$2)-order Fourier coefficient of each modified refractive index region 25$b$ has an extremely small value, one-dimensional local oscillation can be reduced. Therefore, this semiconductor laser element 1A can suppress phenomena such as mode localization due to one-dimensional diffraction and flat band diffraction. Therefore, two-dimensional diffraction makes the light intensity distribution more uniform, and the area of the optical image that is outputted in a single mode can be increased. Therefore, this can contribute to improvement in the output light amount, high resolution, improvement in image quality of the two-dimensional beam pattern, and the like.

As described above, the ($\pm$2,0)-order and (0,$\pm$2)-order Fourier coefficient of the annular shape obtained by virtually rotating the modified refractive index region 25$b$ by one lap with the lattice point O(x, y) as a rotation center may be zero. In this case, the above effect can be achieved more remarkably.

As described above, the ratio ($F_2/F_1$) of the ($\pm$2,0)-order and (0,$\pm$2)-order Fourier coefficient $F_1$ of the inner circle defining the annular shape obtained by virtually rotating the modified refractive index region 25$b$ by one lap with the lattice point O(x, y) as a rotation center to the ($\pm$2,0)-order and (0,$\pm$2)-order Fourier coefficient $F_2$ of the outer circle may be 0.99 or more and 1.01 or less. As described above, the Fourier coefficient of the annular shape is calculated as a difference between the Fourier coefficient $F_2$ of the outer circle that defines the annular shape and the Fourier coefficient $F_1$ of the inner circle that defines the annular shape. Therefore, since the Fourier coefficient $F_2$ of the outer circle and the Fourier coefficient $F_1$ of the inner circle have values close to each other, the Fourier coefficient of the annular shape can be close to zero, and therefore one-dimensional local oscillation can be reduced more effectively.

As described above, the ($\pm$2,0)-order and (0,$\pm$2)-order Fourier coefficient $F_1$ of the inner circle defining the annular shape obtained by virtually rotating the modified refractive index region 25$b$ by one lap with the lattice point O(x, y) as a rotation center and the (±2,0)-order and (0,±2)-order Fourier coefficient $F_2$ of the outer circle may be equal to each other. In this case, since the Fourier coefficient of the annular shape is sufficiently small, the above effect can be achieved.

As described above, in the annular shape obtained by virtually rotating the modified refractive index region 25b by one lap with the lattice point O(x, y) as a rotation center, the radius $r_1$ of the inner circle may be smaller than 0.19 times the lattice spacing a, and the radius $r_2$ of the outer circle may be greater than 0.19 times the lattice spacing a. Alternatively, the radius $r_1$ of the inner circle may be smaller than 0.44 times the lattice spacing a, and the radius $r_2$ of the outer circle may be greater than 0.44 times the lattice spacing a. As shown in FIG. 14, in the Γ-point oscillation structure, the Fourier coefficient of the circular shape has an extreme value when the radius is 0.19 or 0.44 times the lattice spacing a. Therefore, since the radius $r_1$ of the inner circle is smaller than 0.19 times (or 0.44 times) the lattice spacing a, and the radius $r_2$ of the outer circle is greater than 0.19 times (or 0.44 times) the lattice spacing a, it is easy to bring the Fourier coefficient $F_1$ of the inner circle and the Fourier coefficient $F_2$ of the outer circle closer to each other.

First Modification

Figure 15:
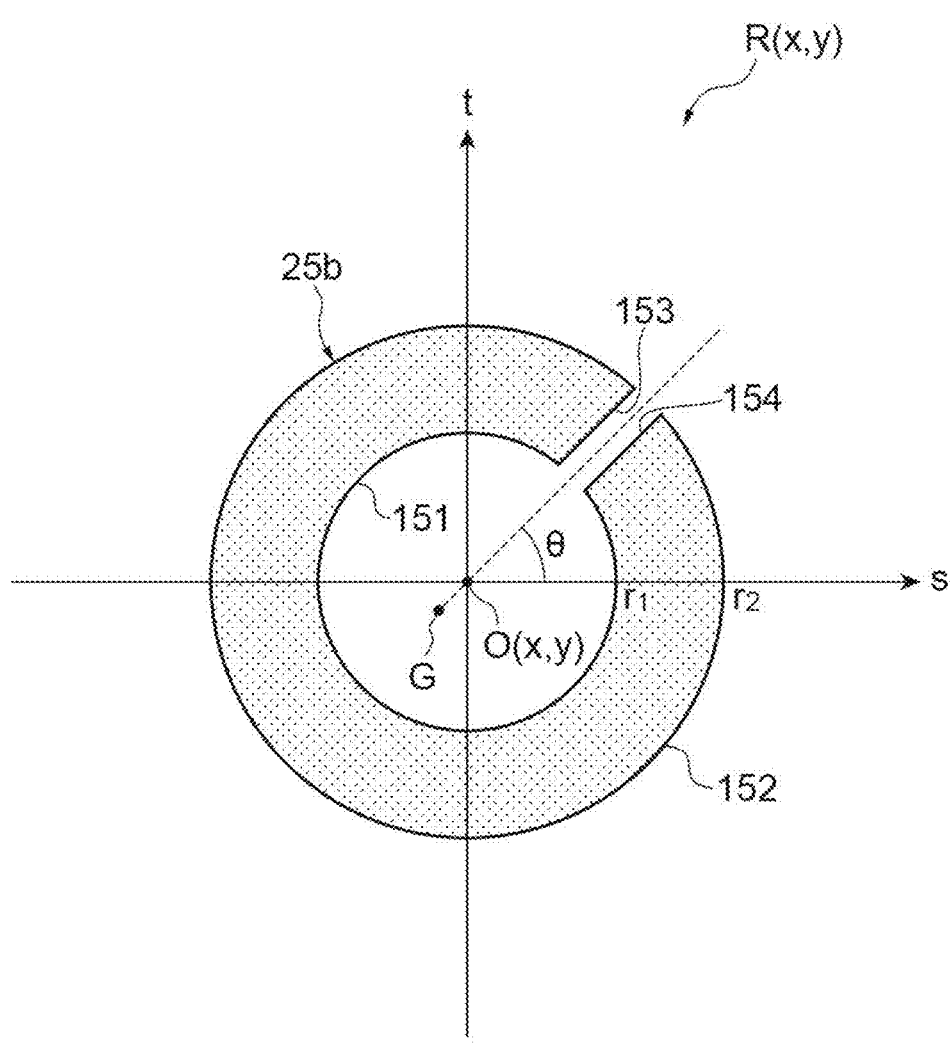
FIG. 15 is a diagram showing an example of a planar shape of the modified refractive index region in the first embodiment.
Figure 16:
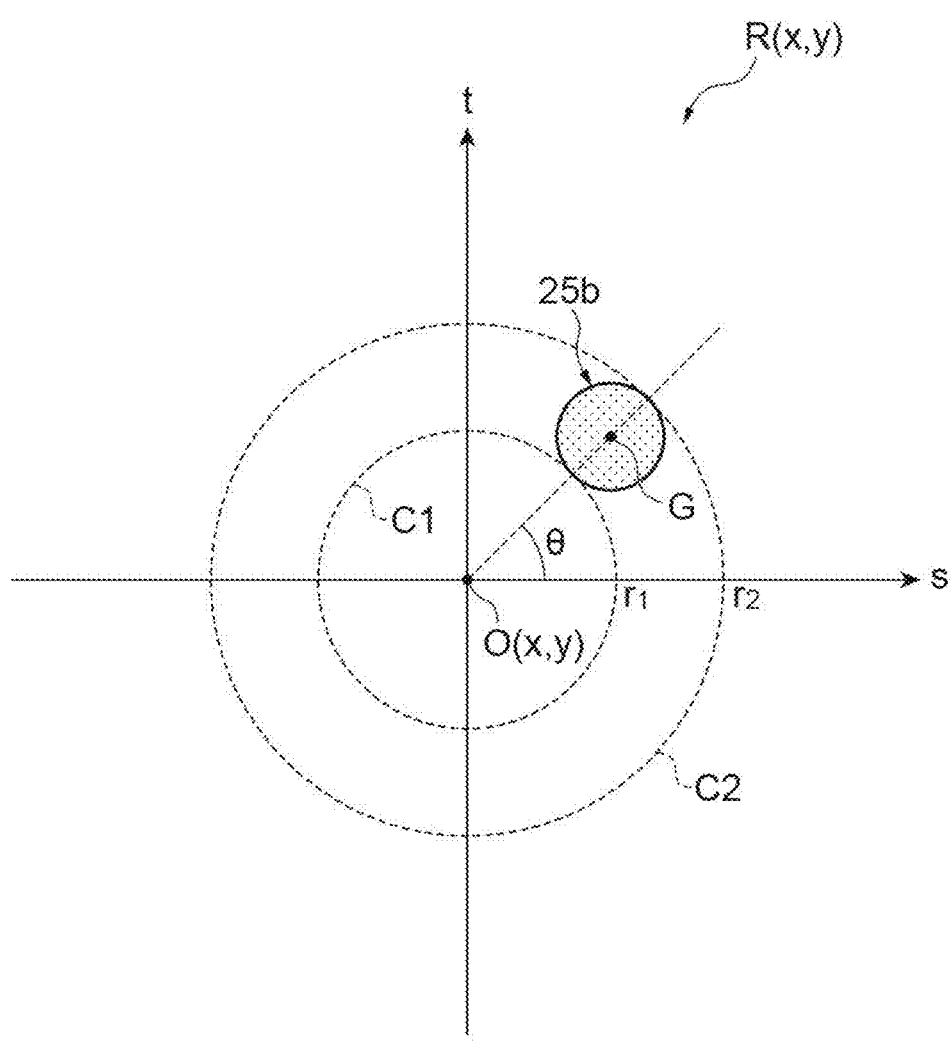
FIG. 16 is a diagram showing an example of the planar shape of the modified refractive index region in the first embodiment.
Figure 17:
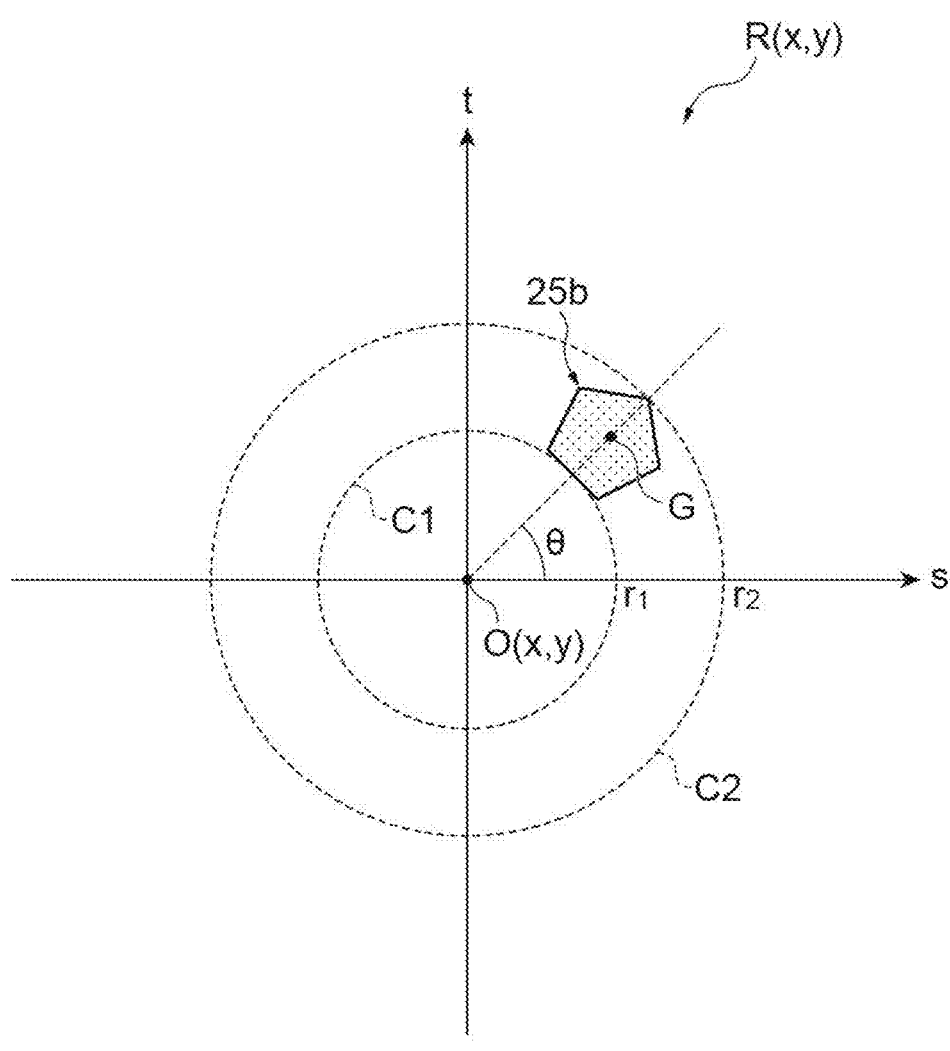
FIG. 17 is a diagram showing an example of the planar shape of the modified refractive index region in the first embodiment.

FIGS. 15, 16, and 17 are diagrams showing other examples of the planar shape of the modified refractive index region 25b in the first embodiment. Coordinates in the unit constituent region R(x, y) shown in FIGS. 15, 16, and 17 are defined by the s-axis parallel to the X-axis and the t-axis parallel to the Y-axis. In the example shown in FIG. 15, in a similar manner to the embodiment describe above, the planar shape of the modified refractive index region 25b is a C shape with the lattice point O(x, y) as the center of the inner and outer arcs. However, in the present modification, the line segment 153 connecting one end of the arc 151 on the inner circumferential side to one end of the arc 152 on the outer circumferential side, and the line segment 154 connecting the other end of the arc 151 to the other end of the arc 152 are parallel to each other. Therefore, the central angle of the arc 152 on the outer circumferential side is slightly larger than the central angle of the arc 151 on the inner circumferential side. Even if the modified refractive index region 25b has such a planar shape, the same effect as in the embodiment described above can be achieved. In particular, the shape shown in FIG. 15, which is slightly different from the annular shape, can suitably suppress one-dimensional diffraction.

In the example shown in FIG. 16, the planar shape of the modified refractive index region 25b is a circular shape with the corresponding lattice point O(x, y) located outside. In the example shown in FIG. 17, the planar shape of the modified refractive index region 25b is a polygon with the corresponding lattice point O(x, y) located outside. Even with these shapes, when the modified refractive index region 25b is virtually rotated by one lap with the lattice point O(x, y) as a rotation center, the annular shape defined by the inner circle C1 and the outer circle C2 is suitably obtained. The phase modulation layer 25A includes a large number of the modified refractive index regions 25b, and the angle θ (angle θ(x, y) set in the unit constituent region R(x, y)) is individually set for each modified refractive index region 25b. Therefore, in considering diffraction action in the phase modulation layer 25A, each modified refractive index region 25b can be approximately regarded as a two-dimensional photonic crystal having this annular shape. Therefore, even if the modified refractive index region 25b has such a planar shape, the same effect as in the embodiment described above can be achieved. Note that in these cases, in the outer circumference of the modified refractive index region 25b, the distance between a point closest to the lattice point O(x, y) and the lattice point O(x, y) agrees with the radius $r_1$ of the inner circle, and in the outer circumference of the modified refractive index region 25b, the distance between a farthest point from the lattice point O(x, y) and the lattice point O(x, y) agrees with the radius $r_2$ of the outer circle.

Second Modification

Figure 18:
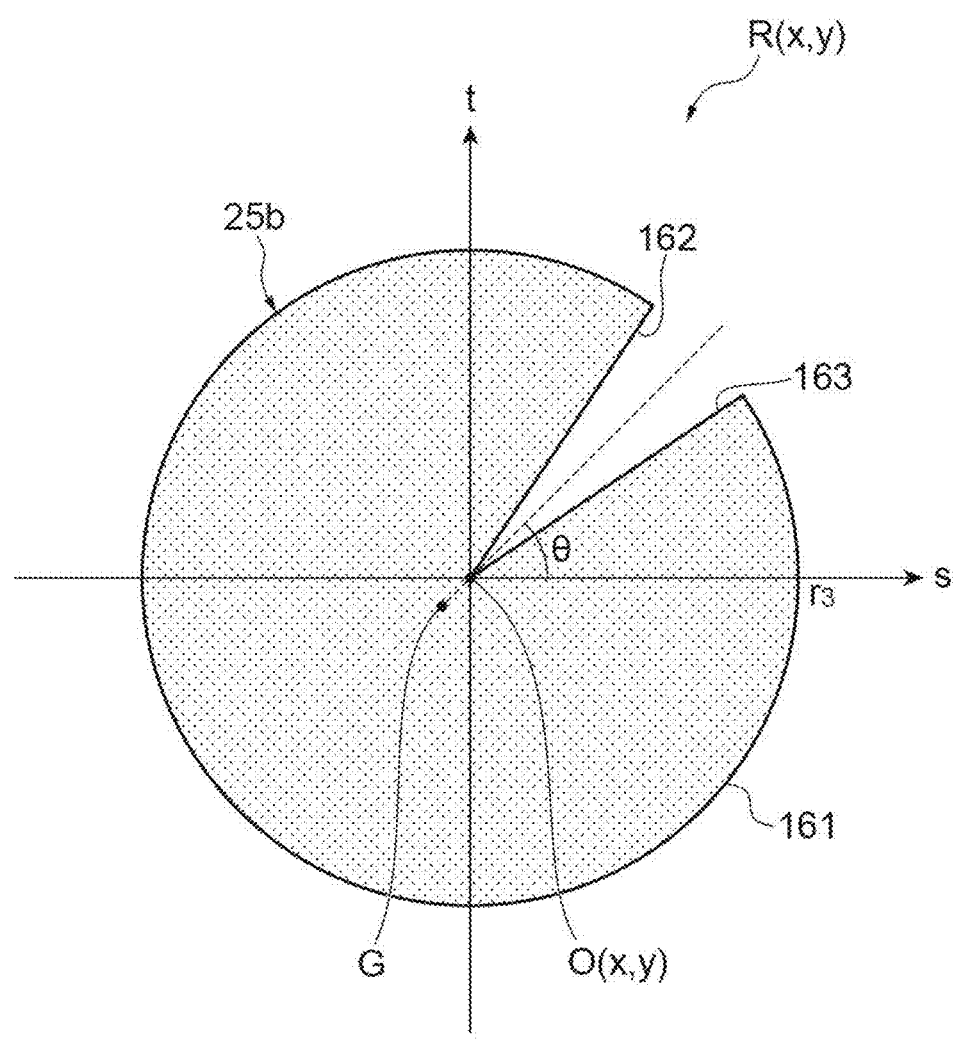
FIG. 18 is a diagram showing an example of the planar shape of the modified refractive index region in the first embodiment.

FIG. 18 is a diagram showing another example of the planar shape of the modified refractive index region 25b in the first embodiment. Coordinates of the unit constituent region R(x, y) shown in FIG. 18 are defined by the s-axis parallel to the X-axis and the t-axis parallel to the Y-axis. In the example shown in FIG. 18, the planar shape of the modified refractive index region 25b is a fan shape with the corresponding lattice point O(x, y) as a center of the arc. Specifically, the planar shape of the modified refractive index region 25b is defined by an arc 161, a line segment 162 connecting one end of the arc 161 to the lattice point O(x, y), and a line segment 163 connecting the other end of the arc 161 to the lattice point O(x, y). The arc 161 is a major arc. In other words, the central angle of the arc 161 is greater than 180°. The central angle of the arc 161 is, for example, 300° or more and less than 360°. The line segments 162 and 163 extend along the radial direction of the arc 161.

In this example, the angle θ formed between the vector starting from the lattice point O(x, y) and along the center of the fan-shaped notch and the X axis is defined. When 180° is added to the angle θ, this angle agrees with the angle formed between the vector from the lattice point O(x, y) to the center of gravity G and the X axis. Therefore, in this example as well, the angle θ can be regarded as an angle corresponding to the angle formed between the vector from the lattice point O(x, y) to the center of gravity G and the X axis. The angle of the vector connecting the center of gravity G of each modified refractive index region 25b to the lattice point O(x, y) can be arbitrarily set by changing the circumferential position of the fan-shaped notch. The distance between the lattice point O(x, y) and the center of gravity G is constant regardless of x and y (across the phase modulation layer 25A). Note that since adding a constant to the phase angle does not change the obtained optical image, the phase angle may be designed without adding 180°.

When this fan shape is virtually rotated by one lap with the lattice point O(x, y) as a rotation center, unlike the embodiment described above, a circle with a radius $r_3$ is obtained. For Γ-point oscillation, the Fourier coefficient of the circular shape is obtained by Formula (12) as described in the embodiment described above. When the (±2, 0)-order and (0,±2)-order Fourier coefficient calculated by Formula (12) is zero or close to zero, the same effect as in the embodiment can be achieved by suppressing one-dimensional diffraction. The preferred range of the (±2,0)-order and (0,±2)-order Fourier coefficient of the modified refractive index region 25b of the present modification is the same as in the embodiment described above. The preferred magnitude of the radius $r_3$ that implements such a Fourier coefficient is shown in FIG. 14. That is, the radius $r_3$ of the circular shape is preferably 0.30 times or more and 0.31 times or less of the lattice spacing a. For Γ-point oscillation, the Fourier coefficient of the circular shape is zero when the radius $r_3$ has a certain value in the range from 0.30 times to 0.31 times the lattice spacing a. Therefore, in this case, the Fourier coefficient of the planar shape of the modified refractive index region 25*b* can be brought close to zero, and one-dimensional local oscillation can be reduced more effectively.

Since the fan shape having a major arc is close to a circular shape, the Fourier coefficient of the planar shape of each modified refractive index region 25*b* can be brought closer to the Fourier coefficient of the circular shape with high precision.

Note that in the present modification, unlike the first embodiment, the modified refractive index region 25*b* has a greater width of the empty hole. Therefore, when the empty hole is covered by the upper cladding layer 26, to prevent the empty hole from being embedded by the material of the upper cladding layer 26, it is preferable to increase the breadth-to-depth ratio of the empty hole (aspect ratio). For that purpose, the base layer 25*a* may be provided inside the modified refractive index region 25*b*, and the empty hole may be narrowed while maintaining the outer shape of the modified refractive index region 25*b*.

Third Modification

Figure 19:
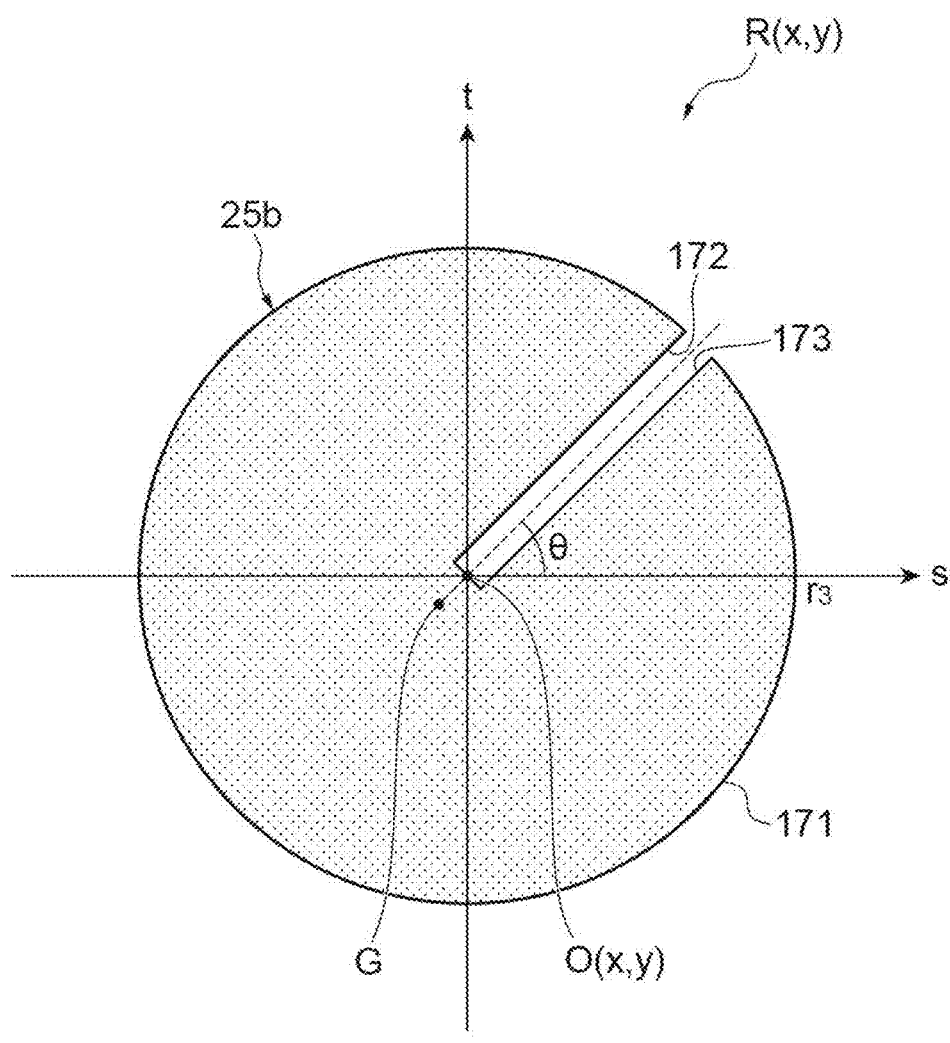
FIG. 19 is a diagram showing an example of the planar shape of the modified refractive index region in the first embodiment.
Figure 20:
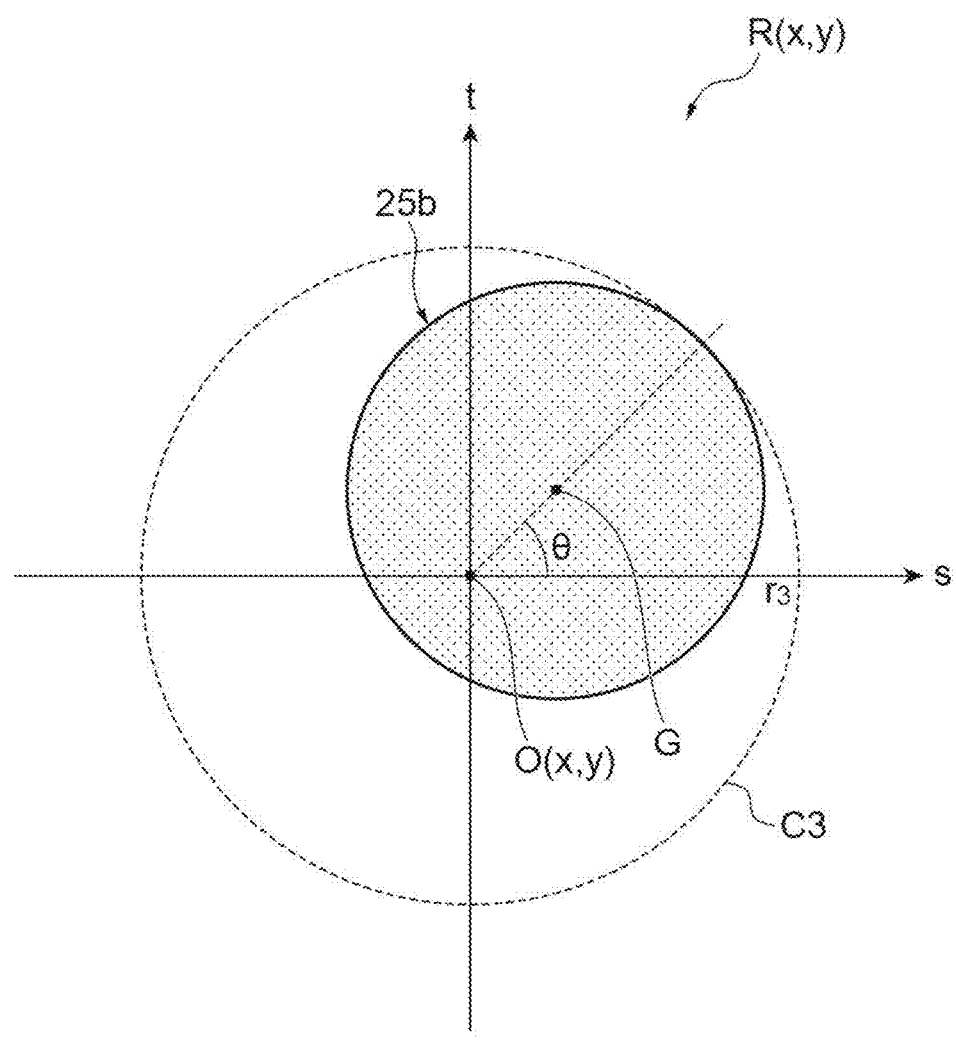
FIG. 20 is a diagram showing an example of the planar shape of the modified refractive index region in the first embodiment.
Figure 21:
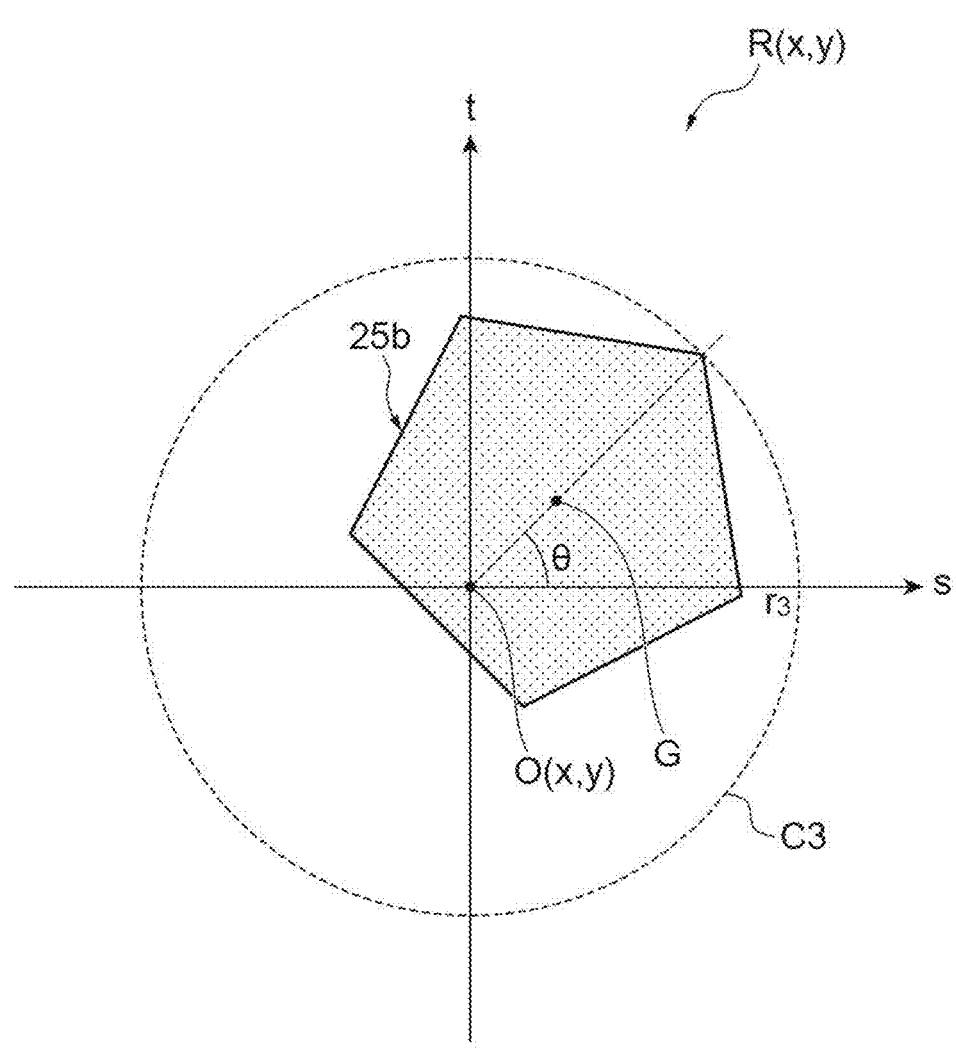
FIG. 21 is a diagram showing an example of the planar shape of the modified refractive index region in the first embodiment.

FIGS. 19, 20, and 21 are diagrams showing other examples of the planar shape of the modified refractive index region 25*b* in the first embodiment. Coordinates in the unit constituent region R(x, y) shown in FIGS. 19, 20, and 21 are defined by the s-axis parallel to the X-axis and the t-axis parallel to the Y-axis. In the example shown in FIG. 19, the planar shape of the modified refractive index region 25*b* is a circular shape with the corresponding lattice point O(x, y) as a center with a straight notch in the radial direction. Specifically, the planar shape of the modified refractive index region 25*b* is defined by an arc 171 and a rectangular recess portion 172 extending from an opening of the arc 171 toward the lattice point O(x, y). The arc 171 is a major arc. In other words, the central angle of the arc 171 is greater than 180°. The central angle of the arc 171 is, for example, 300° or more and less than 360°. One pair of line segments 173 and 174 extending respectively from one end and the other end of the arc 171 and forming the recess portion 172 are parallel to each other.

In the example shown in FIG. 19 as well, the angle θ formed between the vector starting from the lattice point O(x, y) and along the center of the recess portion 172 and the X axis is defined. The angle of the vector connecting the center of gravity G of each modified refractive index region 25*b* to the lattice point O(x, y) can be arbitrarily set by changing the circumferential position of the recess portion 172. When this shape is virtually rotated by one lap with the lattice point O(x, y) as a rotation center, a circle with the radius r₃ is obtained. The preferred magnitude of the radius r₃ is the same as in the second modification.

In the example shown in FIG. 20, the planar shape of the modified refractive index region 25*b* is a circular shape with the corresponding lattice point O(x, y) located inside. In the example shown in FIG. 21, the planar shape of the modified refractive index region 25*b* is a polygon with the corresponding lattice point O(x, y) located inside. Even with these shapes, when the modified refractive index region 25*b* is virtually rotated by one lap with the lattice point O(x, y) as a rotation center, a circular shape C3 is suitably obtained. Since the phase modulation layer 25A includes many modified refractive index regions 25*b* and the angle θ is set individually for each modified refractive index region 25*b*, when examining the diffraction action in the phase modulation layer 25A, each modified refractive index region 25*b* can be approximately regarded as a two-dimensional photonic crystal having this circular shape C3. Therefore, even if the modified refractive index region 25*b* has such a planar shape, the same effect as in the embodiment described above can be achieved. Note that in these cases, the distance between the farthest point from the lattice point O(x, y) in the outer circumference of the modified refractive index region 25*b* and the lattice point O(x, y) agrees with the radius r₃ of the circular shape C3. The preferred magnitude of the radius r₃ is the same as in the second modification.

Second Embodiment

Figure 22:
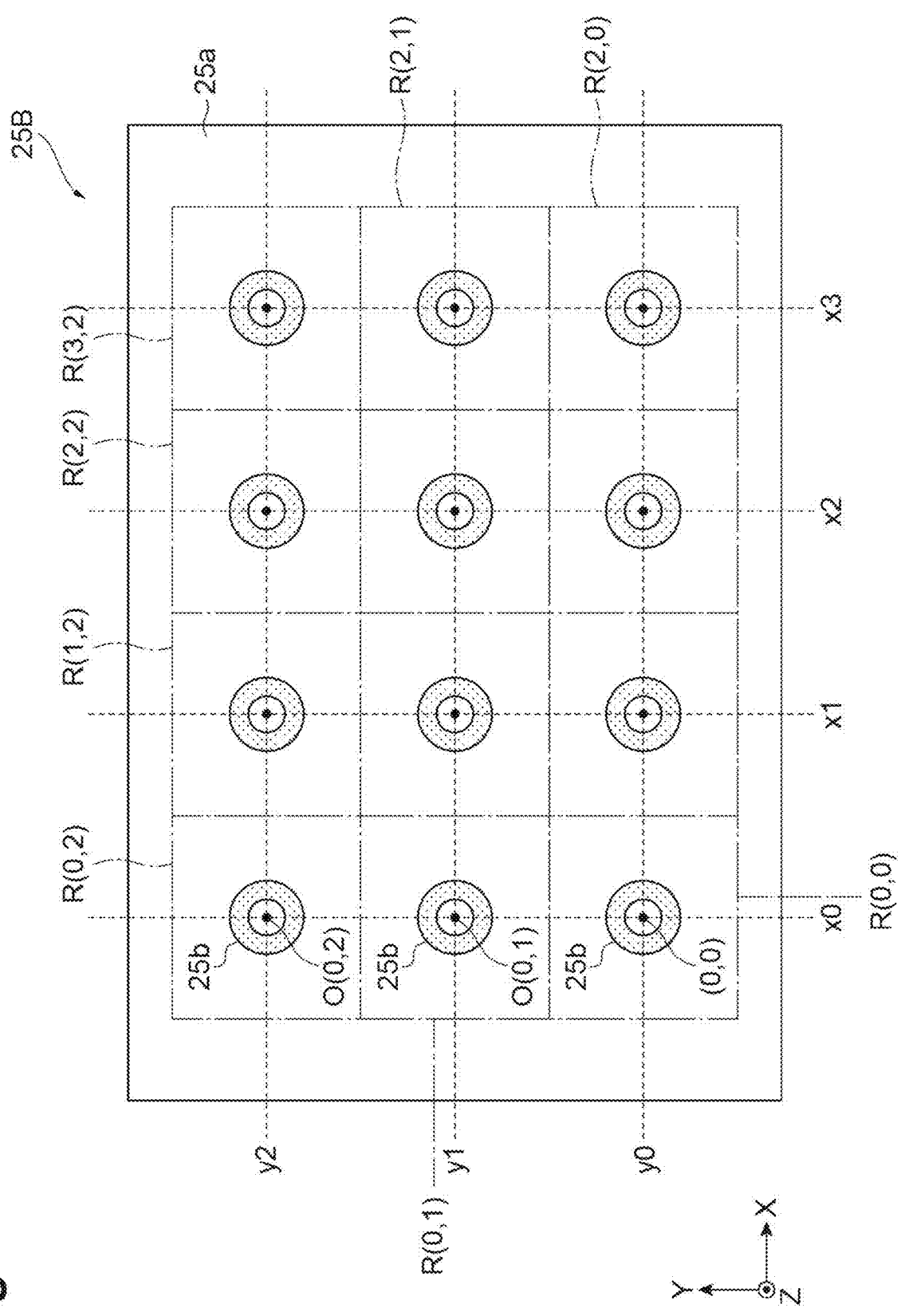
FIG. 22 is a plan view of a photonic crystal layer included in a semiconductor laser element according to a second embodiment of the present disclosure.

FIG. 22 is a plan view of a photonic crystal layer 25B included in a semiconductor laser element according to a second embodiment of the present disclosure. Instead of the phase modulation layer 25A of the first embodiment, the semiconductor laser element of the present embodiment includes the photonic crystal layer 25B. That is, the semiconductor laser element of the present embodiment has a configuration as a photonic crystal laser. Note that the other configuration of the semiconductor laser element except for the photonic crystal layer 25B is the same as in the first embodiment.

The photonic crystal layer 25B also includes a base layer 25*a* comprised of a first refractive index medium, and a plurality of modified refractive index regions 25*b* that are comprised of a second refractive index medium having a refractive index different from a refractive index of the first refractive index medium. Virtual square lattices are set on one surface of the photonic crystal layer 25B (X-Y plane). The intersections of the lines y0 to y2 (y component) parallel to the X axis and the lines x0 to x3 (x component) parallel to the Y axis are lattice points of the square lattices. Square regions with the lattice points as centers are unit constituent regions R(x, y). For example, one of the plurality of modified refractive index regions 25*b* is provided in each unit constituent region R(x, y).

Figure 23:
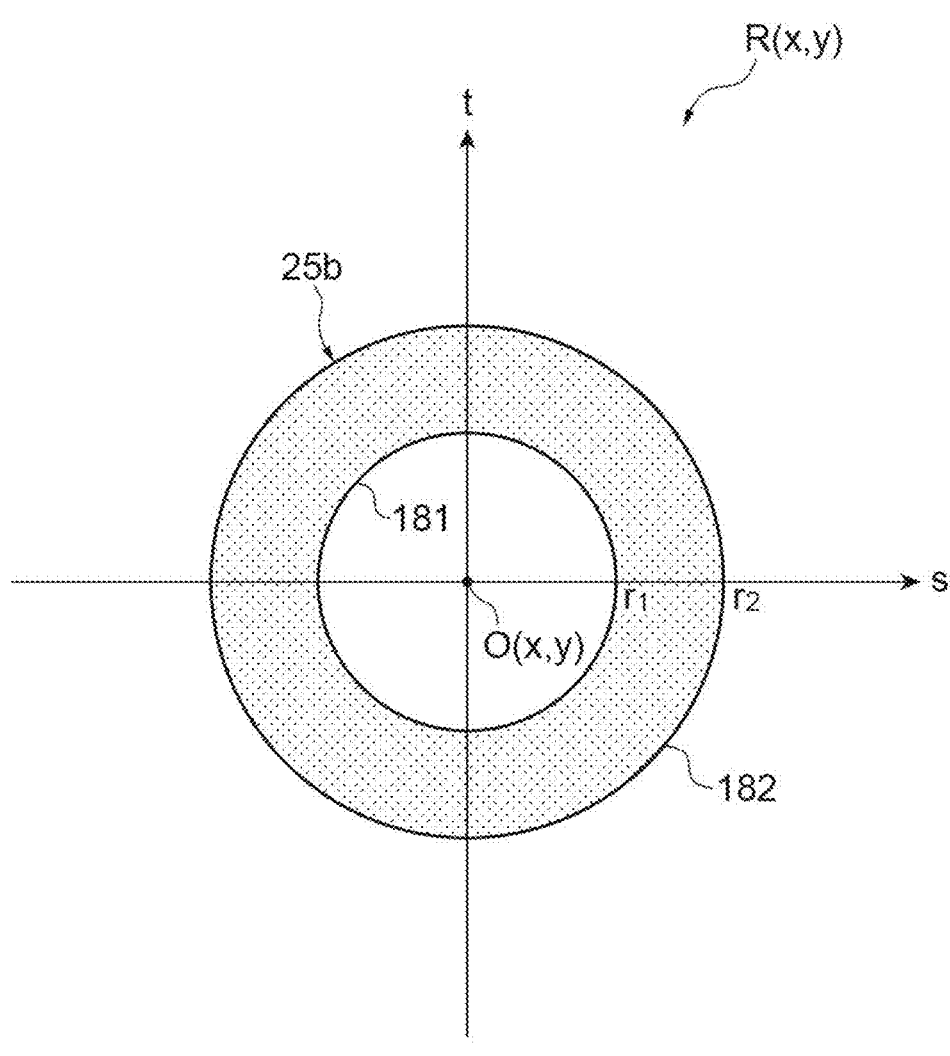
FIG. 23 is an enlarged view of one unit constituent region.

FIG. 23 is an enlarged view of one unit constituent region R(x, y). Coordinates in the R(x, y) are defined by the s-axis parallel to the X-axis and the t-axis parallel to the Y-axis. As shown in FIG. 23, a planar shape of the modified refractive index region 25*b* is, for example, an annular shape with a lattice point O(x, y) as a center of inner and outer circles. Specifically, in the unit constituent region R(x, y), the planar shape of the modified refractive index region 25*b* is defined by an inner circle 181 and an outer circle 182. Centers of the inner circle 181 and outer circle 182 agree with the lattice point O(x, y).

The photonic crystal layer 25B oscillates at a Γ point. That is, a lattice spacing a of the virtual square lattice and a light emission wavelength λ of an active layer 24 satisfy the condition for Γ-point oscillation. The condition for Γ-point oscillation is as described in the first embodiment. Therefore, this semiconductor laser element outputs an optical beam Lout in a direction perpendicular to the plane (Z-axis direction).

The condition for reducing one-dimensional local oscillation in the photonic crystal layer 25B is the same as in the first embodiment. That is, for Γ-point oscillation, as a (±2, 0)-order and (0, ±2)-order Fourier coefficient of the basic wave approaches zero, one-dimensional diffraction in the 180° direction of light incident on the photonic crystal layer 25B is suppressed. The planar shape of the modified refractive index region 25*b* of the present embodiment is an annular shape with the lattice point O(x, y) as a center of inner and outer circles, as shown in FIG. 23. It is assumed that a radius of an inner circle of the annular shape (inner radius) is $r_1$, and a radius of an outer circle (outer radius) is $r_2$. The relationship between the Fourier coefficient and the radius of the circle is represented by above Formula (9). The Fourier coefficient of the annular shape is a value obtained by subtracting the Fourier coefficient of the inner circle from the Fourier coefficient of the outer circle, and is represented by above Formula (11). Here, $R_1$ is the inner radius ($=r_1$), and $R_2$ is the outer radius ($=r_2$). For Γ-point oscillation, the ($\pm2$, 0)-order and (0,$\pm2$)-order Fourier coefficient of the basic wave is calculated by above Formula (12).

For Γ-point oscillation, when the ($\pm2$, 0)-order and (0,$\pm2$)-order Fourier coefficient calculated by above Formula (12) is zero or close to zero, the same effect as in the first embodiment can be achieved by suppressing one-dimensional diffraction. The preferred range of the ($\pm2$,0)-order and (0,$\pm2$)-order Fourier coefficient of the modified refractive index region 25b of the present embodiment is the same as in the embodiment described above.

In a case where the planar shape of the modified refractive index region 25b has an annular shape, when the Fourier coefficient of the inner circle and the Fourier coefficient of the outer circle are equal to each other, the Fourier coefficient of the annular shape is zero. Therefore, in order to make the Fourier coefficient of the annular shape zero, as shown in FIG. 14, two radii corresponding to a certain Fourier coefficient Fb is preferably set to the inner radius $r_1$ and the outer radius $r_2$. In this case, the inner radius $r_1$ is smaller than 0.19 times the lattice spacing a, and the outer radius $r_2$ is larger than 0.19 times the lattice spacing a. Alternatively, two radii corresponding to a certain Fourier coefficient Fc may be set to the inner radius $r_1$ and the outer radius $r_2$. In this case, the inner radius $r_1$ is smaller than 0.44 times the lattice spacing a, and the outer radius $r_2$ is larger than 0.44 times the lattice spacing a.

In the above description, by setting the Fourier coefficient to zero, one-dimensional local oscillation is suppressed, but even if the Fourier coefficient is not strictly zero, it is possible to suppress one-dimensional local oscillation by setting the absolute value to an extremely small value. Specifically, when the absolute value of the ($\pm2$, 0)-order and (0,$\pm2$)-order Fourier coefficient of the annular shape of the modified refractive index region 25b is 0.01 or less, or 20% or less of the maximum peak value of the ($\pm2$, 0)-order and (0,$\pm2$)-order Fourier coefficient of the circular shape, one-dimensional local oscillation can be suppressed effectively. When the ratio ($F_2/F_1$) of the ($\pm2$,0)-order and (0,$\pm2$)-order Fourier coefficient $F_1$ of the inner circle that defines the annular shape to the ($\pm2$,0)-order and (0,$\pm2$)-order Fourier coefficient $F_2$ of the outer circle is 0.99 or more and 1.01 or less, the one-dimensional local oscillation can be suppressed effectively. In one example, the inner radius $r_1$ is 0.085 times the lattice spacing a, and the outer radius $r_2$ is 0.28 times the lattice spacing a. In another example, the inner radius $r_1$ is 0.41 times the lattice spacing a, and the outer radius $r_2$ is 0.47 times the lattice spacing a. Note that since the present embodiment uses a rotationally symmetric hole shape, a large area may suppress vertical diffraction. However, in that case, adopting end face emission enables usage as a large-area coherent light source.

Note that in the present embodiment as well, it is possible to determine the structure of the photonic crystal layer 25B by the scaling law according to the wavelength. The semiconductor laser element of the present embodiment can be manufactured by a method similar to the manufacturing method of the semiconductor laser element 1A of the first embodiment.

Effects obtained by the semiconductor laser element of the present embodiment described above will be described. In this semiconductor laser element, each modified refractive index region 25b has an annular shape with the corresponding lattice point O(x, y) as a center. The absolute value of the ($\pm2$, 0)-order and (0,$\pm2$)-order Fourier coefficient of the annular shape is 0.01 or less, or 20% or less of the maximum peak value of the ($\pm2$, 0)-order and (0,$\pm2$)-order Fourier coefficient of the circular shape. In this way, since the ($\pm2$,0)-order and (0,$\pm2$)-order Fourier coefficient of each modified refractive index region 25b has an extremely small value, one-dimensional local oscillation can be reduced. Therefore, this semiconductor laser element can suppress phenomena such as mode localization due to one-dimensional diffraction and flat band diffraction. Therefore, since it is possible to make the light intensity distribution close to uniform and increase the area of the region where output is possible in a single mode, it is possible to improve the resolution and image quality of the emitted optical image.

Fourth Modification

Figure 24:
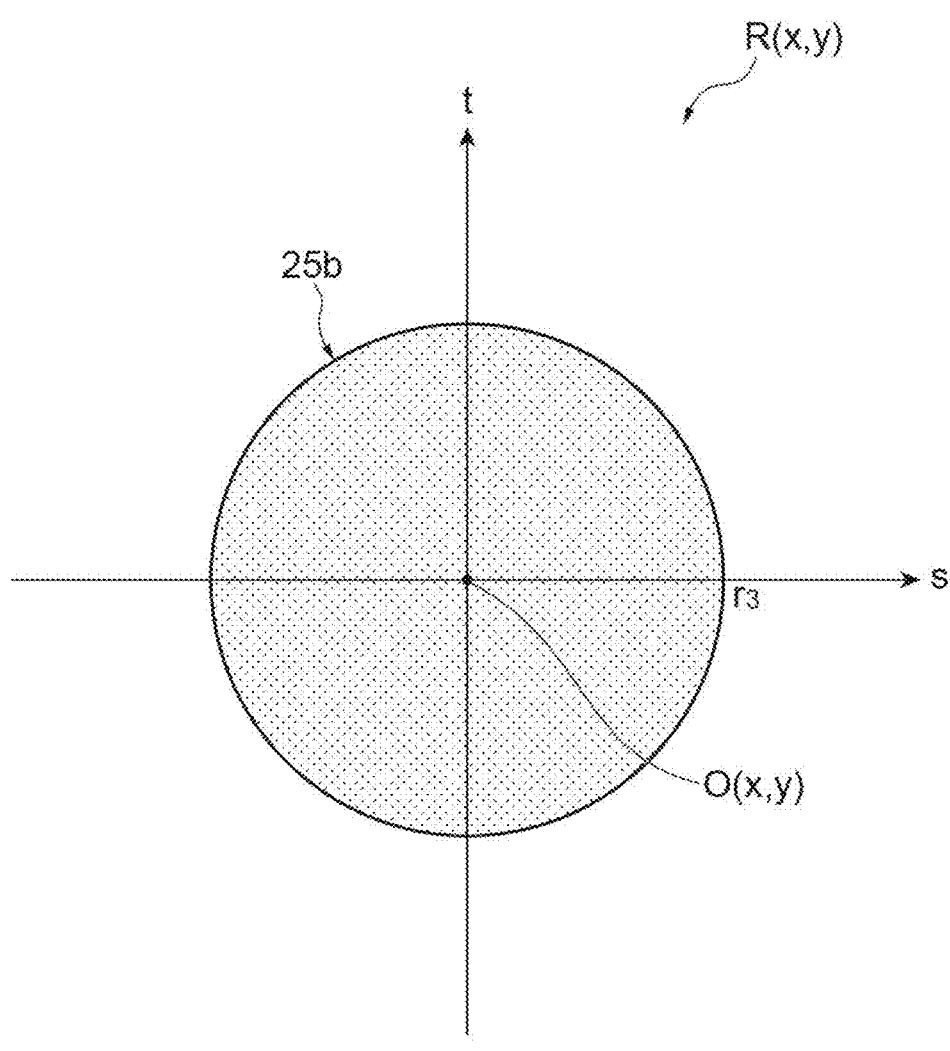
FIG. 24 is a diagram showing an example of a planar shape of a modified refractive index region in the second embodiment.

FIG. 24 is a diagram showing another example of the planar shape of the modified refractive index region 25b in the second embodiment. Coordinates in the unit constituent region R(x, y) shown in FIG. 24 are defined by the s-axis parallel to the X-axis and the t-axis parallel to the Y-axis. In the example shown in FIG. 24, the planar shape of the modified refractive index region 25b is a circular shape with the corresponding lattice point O (x, y) as a center and having a radius of $r_3$. For Γ-point oscillation, the Fourier coefficient of the circular shape is obtained by Formula (12) as described above. When the ($\pm2$, 0)-order and (0,$\pm2$)-order Fourier coefficient calculated by Formula (12) is zero or close to zero, the same effect as in the second embodiment can be achieved by suppressing one-dimensional diffraction. The preferred range of the ($\pm2$,0)-order and (0,$\pm2$)-order Fourier coefficient of the modified refractive index region 25b of the present modification is the same as in the second embodiment. The preferred magnitude of the radius $r_3$ that implements such a Fourier coefficient is shown in FIG. 14. That is, the radius $r_3$ of the circular shape is preferably 0.30 times or more and 0.31 times or less of the lattice spacing a. For Γ-point oscillation, the Fourier coefficient of the circular shape is zero when the radius $r_3$ has a certain value in the range from 0.30 times to 0.31 times the lattice spacing a. Therefore, in this case, the Fourier coefficient of the planar shape of the modified refractive index region 25b can be brought close to zero, and one-dimensional local oscillation can be reduced more effectively.

Fifth Modification

Each of the embodiments has exemplified the case where the phase modulation layer 25A and the photonic crystal layer 25B oscillate at the Γ point, but the phase modulation layer 25A and the photonic crystal layer 25B may oscillate at an M point. In this case, the lattice spacing a of the virtual square lattice and the light emission wavelength λ of the active layer 24 satisfy the condition for M-point oscillation. That is, the lattice spacing a of the virtual square lattice, the light emission wavelength λ of the active layer 24, and the mode equivalent refractive index n satisfy the condition $\lambda=(2^{1/2})n\times a$.

Figure 25:
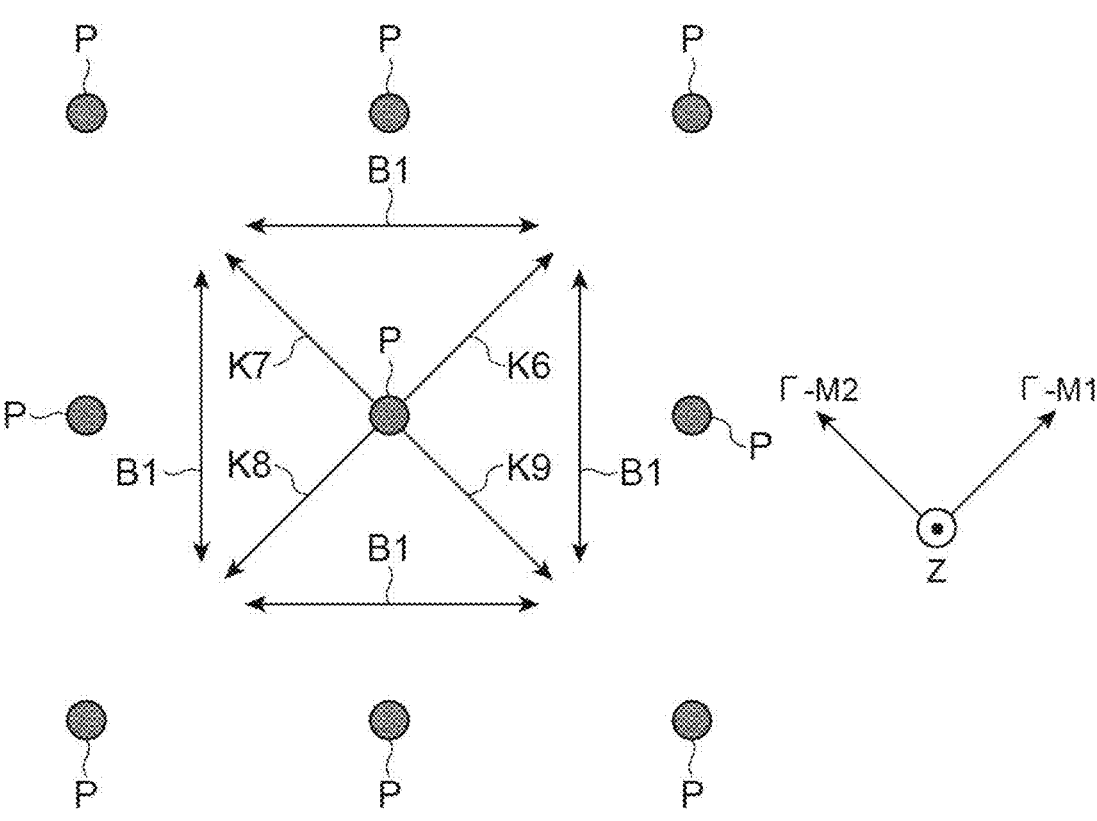
FIG. 25 is a plan view showing a reciprocal lattice space regarding a photonic crystal layer that oscillates at a M point.

FIG. 25 is a plan view showing a reciprocal lattice space regarding the photonic crystal layer 25B that oscillates at the M point. FIG. 25 also shows a case where the plurality of modified refractive index regions is located on the lattice points of the square lattices, and a point P in FIG. 25 represents a reciprocal lattice point. An arrow B1 in FIG. 25 represents the basic reciprocal lattice vector as in FIG. 8, and arrows K6, K7, K8, and K9 represent four in-plane wavenumber vectors. Here, a Γ-M1 axis and a Γ-M2 axis that are orthogonal to each other in the reciprocal lattice space are defined. The Γ-M1 axis is parallel to one orthogonal direction of the square lattice, and the Γ-M2 axis is parallel to the other orthogonal direction of the square lattice. The in-plane wavenumber vectors are vectors obtained by projecting the wavenumber vector onto the Γ-M1-Γ-M2 plane. That is, the in-plane wavenumber vector K6 points in a positive direction on the Γ-M1 axis, the in-plane wavenumber vector K7 points in a positive direction on the Γ-M2 axis, the in-plane wavenumber vector K8 points in a negative direction on the Γ-M1 axis, and the in-plane wavenumber vector K9 points in a negative direction on the Γ-M2 axis. As is apparent from FIG. 25, in the photonic crystal layer 25B oscillating at the M point, the magnitude of the in-plane wavenumber vectors K6 to K9 (that is, magnitude of the standing waves in the in-plane direction) is smaller than the magnitude of the basic reciprocal lattice vector B1. Note that when the magnitude of the in-plane wavenumber vectors K6 to K9 is k, the relationship of the following Formula (13) holds.

$$k = \frac{1}{\sqrt{2}} \frac{2\pi}{a} \tag{13}$$

Diffraction occurs in the wavenumber vectors K6 to K9 in the direction of the vector sum of the reciprocal lattice vector G (=2 m π/a, in is an integer), but for the photonic crystal layer 25B oscillating at the M point, the wavenumber in the in-plane direction cannot become 0 by diffraction, and no diffraction occurs in the direction perpendicular to the plane (Z-axis direction). Therefore, the laser beam is not outputted in the Z-axis direction, but only in the direction along the X-Y plane. That is, the present modification provides the end face emission type semiconductor laser element including the photonic crystal layer 25B.

Figure 26:
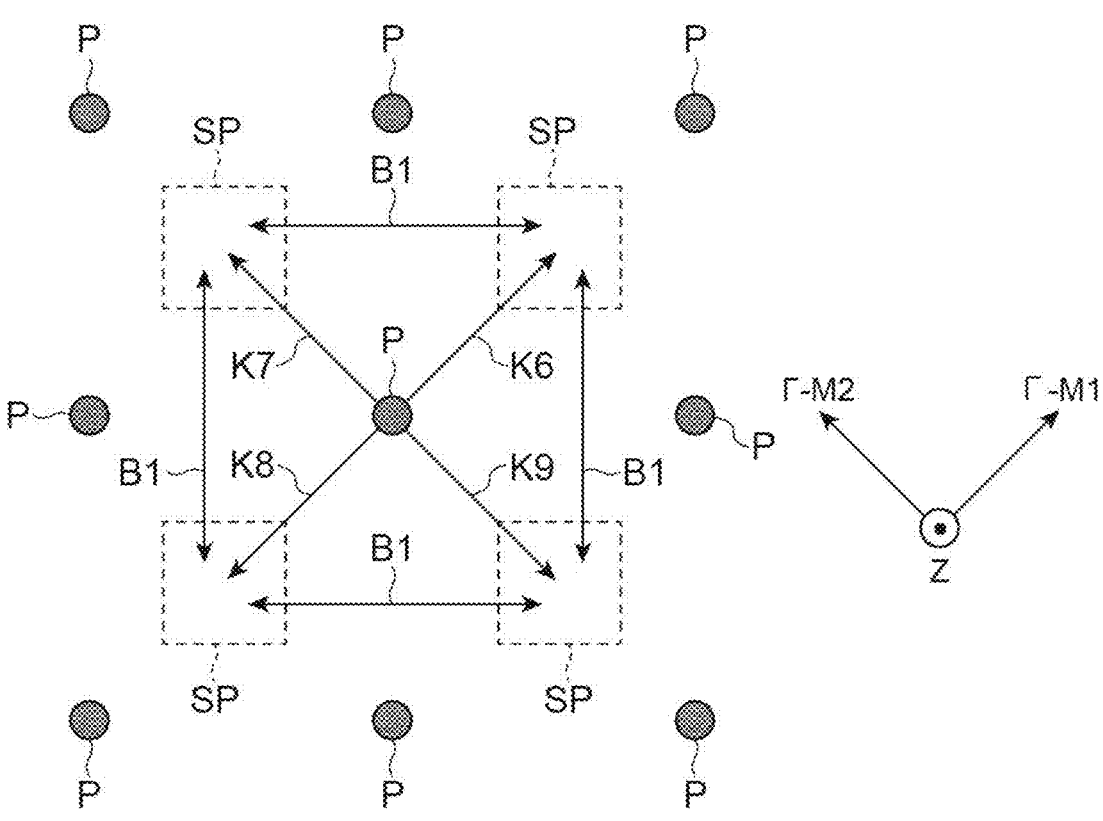
FIG. 26 is a plan view showing a reciprocal lattice space regarding a phase modulation layer that oscillates at the M point.

FIG. 26 is a plan view showing the reciprocal lattice space regarding the phase modulation layer 25A that oscillates at the M point. The basic reciprocal lattice vector B1 is similar to the photonic crystal layer 25B that oscillates at the M point, and the in-plane wavenumber vectors K6 to K9 each have a wavenumber spread SP due to the angular distribution θ(x,y). The shape and magnitude of the wavenumber spread SP are the same as in the case of Γ-point oscillation. Not only in the photonic crystal layer 25B in which the modified refractive index regions 25b are arranged periodically, but also in the phase modulation layer 25A having the substantially periodic structure shown in FIG. 2, for the M-point oscillation, the magnitude of the in-plane wavenumber vectors K6 to K9 (that is, magnitude of the standing wave in the in-plane direction) is smaller than the magnitude of the basic reciprocal lattice vector B1. At this time, the wavenumber in the in-plane direction cannot become 0 due to diffraction, and diffraction in the direction perpendicular to the plane (Z-axis direction) does not occur. Therefore, both the zero-order light in the direction perpendicular to the plane (Z-axis direction) and the +1st-order light and −1st-order light in a direction inclined to the Z-axis direction are not outputted, and the zero-order light, +1st-order light, and −1st-order light are outputted only in the direction along the X-Y plane. That is, the present modification provides the end face emission type semiconductor laser element including the phase modulation layer 25A.

For M-point oscillation as in the present modification, as the (±1, ±1)-order Fourier coefficient of the basic wave approaches zero, one-dimensional diffraction in the 180° direction of the light incident on the phase modulation layer 25A and the photonic crystal layer 25B is suppressed. When the phase modulation layer 25A and the photonic crystal layer 25B are oscillated at the M point, the lattice spacing a is determined such that the wavenumber of the basic wave is $k=2\pi m/\lambda=2\pi/(2^{1/2})a$. Therefore, the Fourier coefficient of the circle shown in Formula (9) is represented by the following Formula (14) because in the case of M-point oscillation, $\rho=2^{1/2}$ for the (±1, ±1)-order that contributes to the one-dimensional diffraction. Here, r is the radius of the circle. Note that the radius r is a value normalized by the lattice spacing a.

$$rJ_1(2\sqrt{2}\pi r)/\sqrt{2} \tag{14}$$

Note that the (±1,±1)-order Fourier coefficient approaching zero means that the (+1, +1)-order, (+1, −1)-order, (−1, +1)-order, and (−1, −1)-order four Fourier coefficients approach zero.

Figure 27:
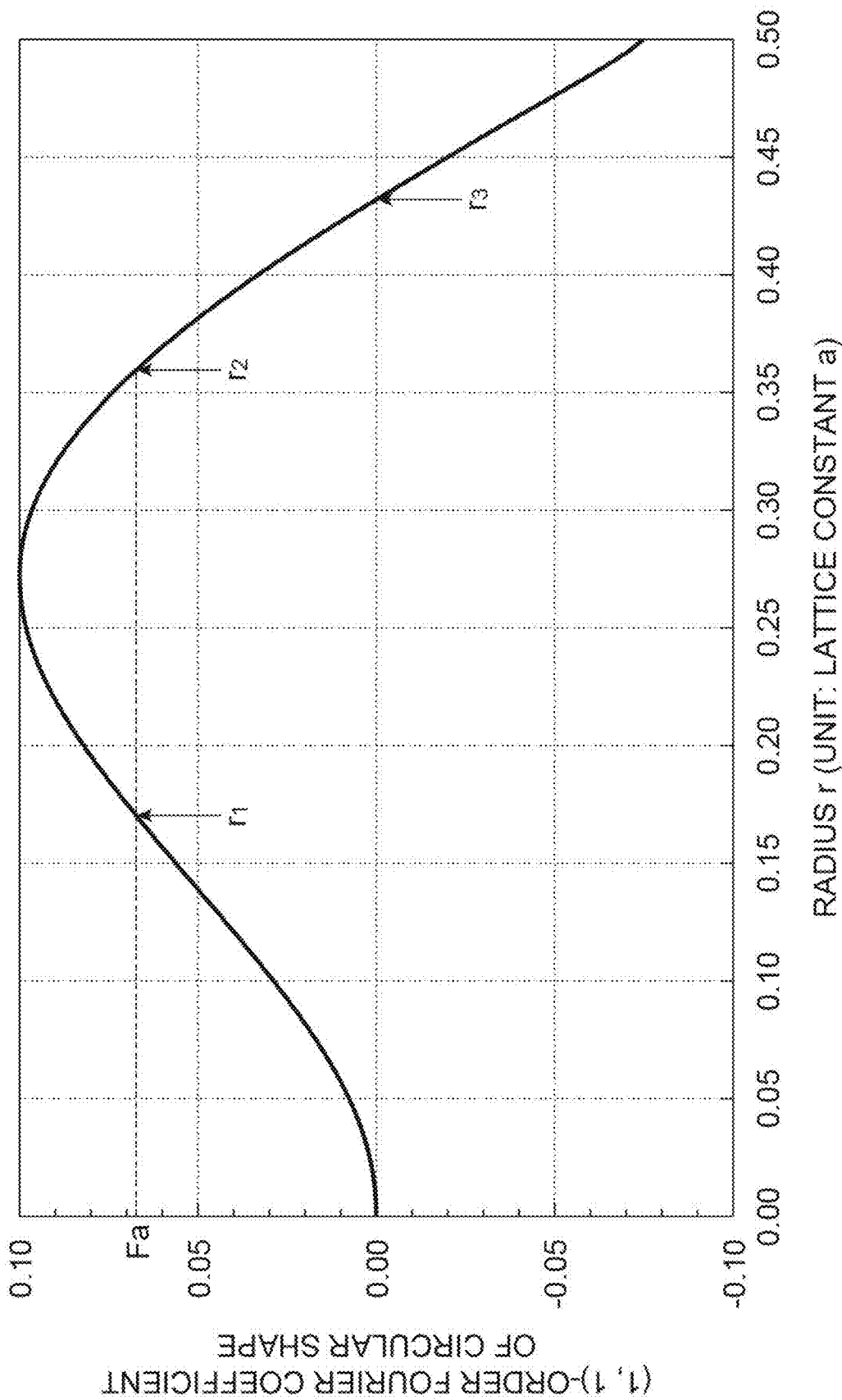
FIG. 27 is a graph showing the relationship of Formula (14).

FIG. 27 is a graph showing the relationship of Formula (14). In FIG. 27, the vertical axis represents the Fourier coefficient, and the horizontal axis represents the magnification of the radius of the circle with respect to the lattice spacing a. As shown in FIG. 27, the (±1, ±1)-order Fourier coefficient in the M-point oscillation has a maximum value (0.10) when the radius of the circle is 0.27 times the lattice spacing a. The Fourier coefficient increases and decreases with almost the same inclination before and after the maximum value. In a case where the planar shape of the modified refractive index region 25b has an annular shape or approximate annular shape, when the Fourier coefficient of the inner circle and the Fourier coefficient of the outer circle are equal to each other, the Fourier coefficient of the annular shape is zero. Therefore, in order to make the Fourier coefficient of the annular shape zero, as shown in FIG. 27, two radii corresponding to a certain Fourier coefficient Fa is preferably set to the radius $r_1$ of the inner circle and the radius $r_2$ of the outer circle. In this case, the radius $r_1$ of the inner circle is smaller than 0.27 times the lattice spacing a, and the radius $r_2$ of the outer circle is greater than 0.27 times the lattice spacing a.

In the above description, by setting the Fourier coefficient to zero, one-dimensional local oscillation is suppressed, but even if the Fourier coefficient is not strictly zero, it is possible to suppress one-dimensional local oscillation by setting the absolute value to an extremely small value. Specifically, when the absolute value of the (±1, ±1)-order Fourier coefficient of the annular shape of the modified refractive index region 25b or the annular shape obtained by virtually rotating the modified refractive index region 25b with the lattice point O(x, y) as a center is 0.01 or less, or 10% or less of the maximum peak value of the (±1, ±1)-order Fourier coefficient of the circular shape (0.10 in the example in FIG. 27), one-dimensional local oscillation can be suppressed effectively. When the ratio $(F_2/F_1)$ of the (±1, ±1)-order Fourier coefficient $F_1$ of the inner circle that defines the annular shape to the (±1, ±1)-order Fourier coefficient $F_2$ of the outer circle is 0.99 or more and 1.01 or less, one-dimensional local oscillation can be suppressed effectively. In one example, the radius $r_1$ is 0.195 times the lattice spacing a, and the radius $r_2$ is 0.34 times the lattice spacing a.

Figure 28A:
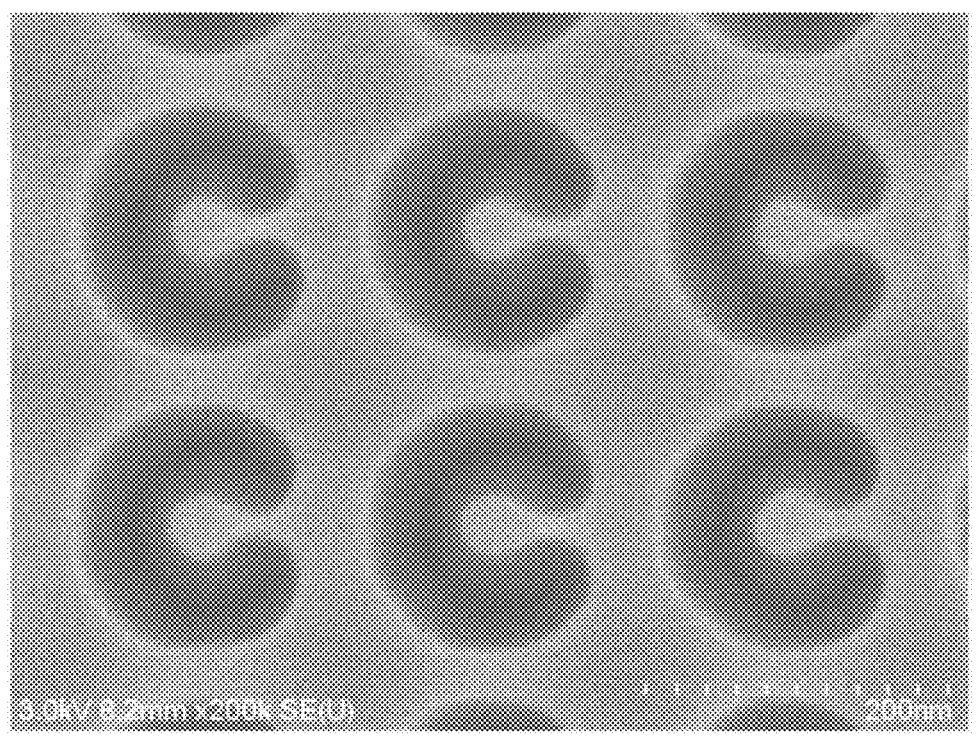
FIG. 28A is a photograph showing a C-shaped modified refractive index region formed by performing dry etching on a GaAs layer as a base layer with a lattice spacing a=200 nm as one example.
Figure 28B:
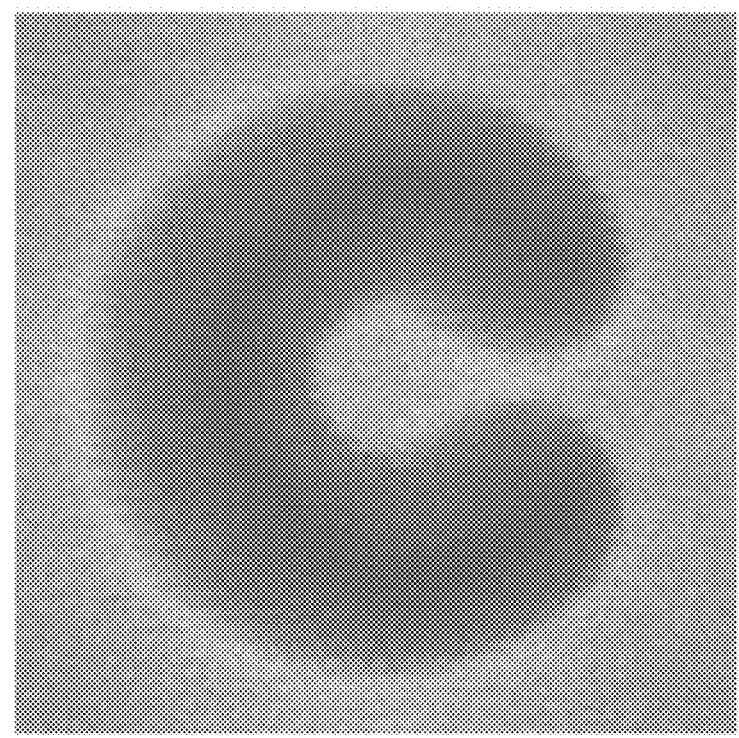
FIG. 28B is an enlarged photograph of part of FIG. 28A.
Figure 29:
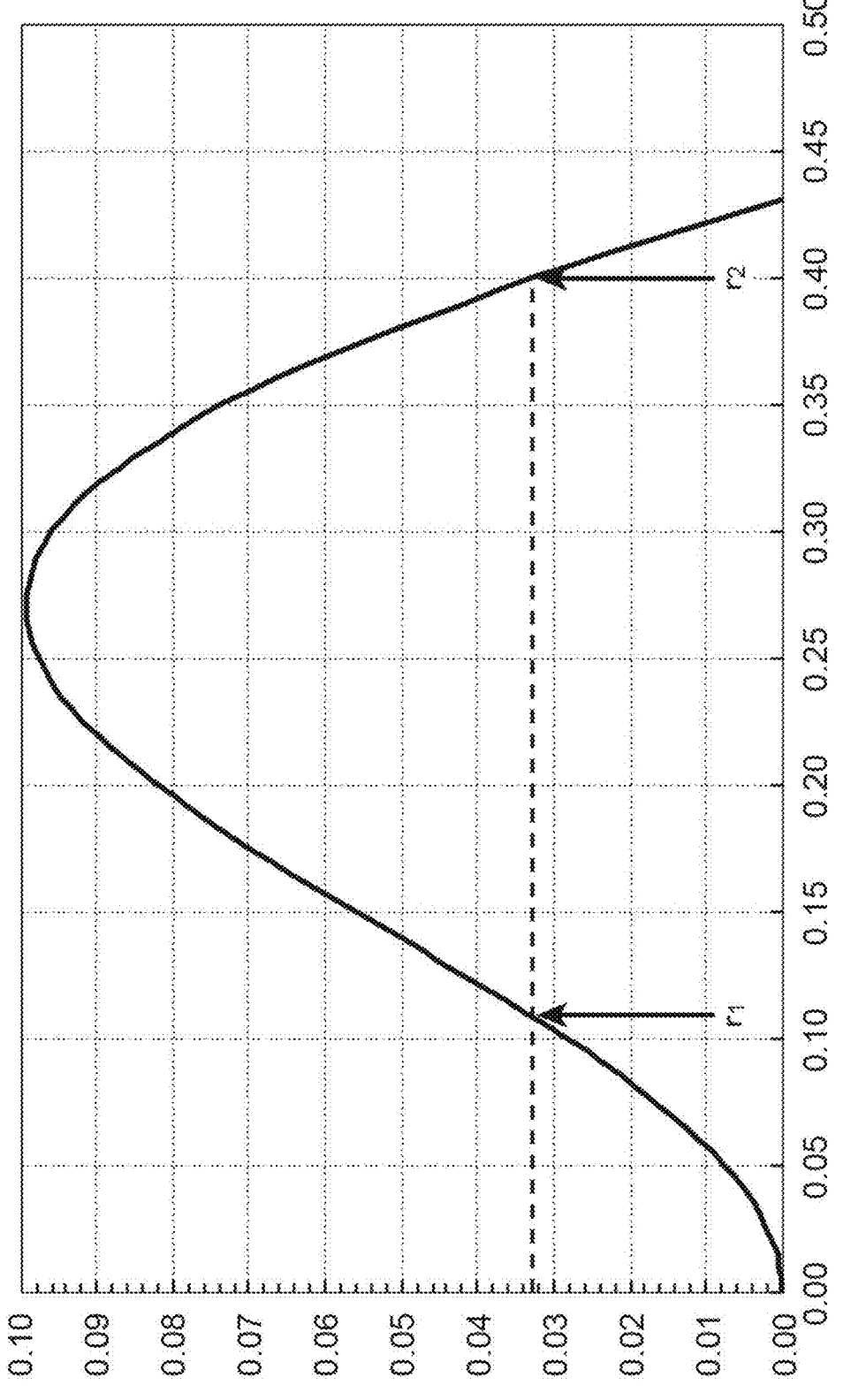
FIG. 29 is a graph showing the relationship of Formula (25).

FIG. 28A is a photograph showing the C-shaped modified refractive index regions 25*b* formed by performing dry etching on a GaAs layer as the base layer 25*a* with the lattice spacing a=200 nm as one example. FIG. 28B is an enlarged photograph of part of FIG. 28A. The diameter of the inner circle of the modified refractive index region 25*b* is 42 nm, and the radius $r_1$ is 0.105 times the lattice spacing a. The diameter of the outer circle is 160 nm, and the radius $r_2$ is 0.40 times the lattice spacing a. At this time, as shown in FIG. 29, since the (±1,±1)-order Fourier coefficient of the circle with the radius $r_1$ and the (±1,±1)-order Fourier coefficient of the circle with the radius $r_2$ are equal to each other and thus cancel each other, the (±1,±1)-order Fourier coefficient of the circle obtained by rotating the C shape is almost zero. Therefore, one-dimensional local oscillation can be suppressed effectively.

In the present modification, the absolute value of the (±1, ±1)-order Fourier coefficient of the annular shape of each modified refractive index region 25*b* of the photonic crystal layer 25B and the annular shape obtained by virtually rotating each modified refractive index region 25*b* of the phase modulation layer 25A by one lap with the lattice point O(x, y) as a rotation center is 0.01 or less, or 10% or less of the maximum peak value of the (±1, ±1)-order Fourier coefficient of the circular shape. In this way, since the (±1, ±1)-order Fourier coefficient of the annular shape has an extremely small value, one-dimensional local oscillation can be reduced. Therefore, the present modification can suppress phenomena such as mode localization due to one-dimensional diffraction and flat band diffraction. Therefore, two-dimensional diffraction makes the light intensity distribution more uniform, and the area of the optical image that is outputted in a single mode can be increased.

As described above, the (±1,±1)-order Fourier coefficient of the annular shape of each modified refractive index region 25*b* of the photonic crystal layer 25B and the annular shape obtained by virtually rotating each modified refractive index region 25*b* of the phase modulation layer 25A by one lap with the lattice point O(x, y) as a rotation center may be zero. In this case, the above effect can be achieved more remarkably.

As described above, the ratio $(F_2/F_1)$ of the (±1, ±1)-order Fourier coefficient $F_1$ of the inner circle that defines the annular shape to the (±1, ±1)-order Fourier coefficient $F_2$ of the outer circle that defines the annular shape may be 0.99 or more and 1.01 or less. In this way, since the Fourier coefficient of the outer circle and the Fourier coefficient of the inner circle are close to each other, the Fourier coefficient of the annular shape can be close to zero, and therefore one-dimensional local oscillation can be reduced effectively.

As described above, the (±1, ±1)-order Fourier coefficient $F_1$ of the inner circle that defines the annular shape and the (±1, ±1)-order Fourier coefficient $F_2$ of the outer circle that defines the annular shape may be equal to each other. In this case, since the Fourier coefficient of the annular shape is sufficiently small, the above effect can be achieved.

As described above, the radius $r_1$ of the inner circle of the annular shape may be smaller than 0.27 times the lattice spacing a, and the radius $r_2$ of the outer circle may be greater than 0.27 times the lattice spacing a. As shown in FIG. 27, in the M-point oscillation structure, the Fourier coefficient of the circular shape has an extreme value when the radius is 0.27 times the lattice spacing a. Therefore, since the radius $r_1$ of the inner circle is smaller than 0.27 times the lattice spacing a, and the radius $r_2$ of the outer circle is greater than 0.27 times the lattice spacing a, it is easy to bring the Fourier coefficient of the inner circle and the Fourier coefficient of the outer circle closer to each other.

Note that in the present modification as well, the planar shape of each modified refractive index region 25*b* of the phase modulation layer 25A may be a C shape with the corresponding lattice point O(x, y) as a center of the inner and outer arcs, and may be a circular shape or a polygon with the corresponding lattice point O(x, y) located outside. In these cases, the same effect as in the first embodiment can be achieved.

Sixth Modification

The above-described fifth modification has shown the case where each modified refractive index region 25*b* of the photonic crystal layer 25B has an annular shape, and virtually rotating each modified refractive index region 25*b* of the phase modulation layer 25A by one lap with the lattice point O(x, y) as a rotation center provides an annular shape. However, the planar shape of each modified refractive index region 25*b* is not limited to this form. Each modified refractive index region 25*b* of the photonic crystal layer 25B may have a circular shape (see FIG. 24), and virtually rotating each modified refractive index region 25*b* of the phase modulation layer 25A by one lap with the lattice point O(x, y) as a rotation center may provide a circular shape. In this case, each modified refractive index region 25*b* of the phase modulation layer 25A may be, for example, a fan shape with the lattice point O(x, y) as a center of the arc (FIG. 18), a circular shape with the lattice point O(x, y) located inside (FIG. 20), or a polygon with the lattice point O(x, y) located inside (FIG. 21).

For M-point oscillation, the Fourier coefficient of the circular shape is obtained by above Formula (14) as described in the fifth modification. When the (±1, ±1)-order Fourier coefficient calculated by Formula (14) is zero or close to zero, the same effect as in each of the embodiments can be achieved by suppressing one-dimensional diffraction. The preferred range of the (±1,±1)-order Fourier coefficient in the present modification is the same as in the fifth modification. The preferred magnitude of the radius $r_3$ that implements such a Fourier coefficient is shown in FIG. 27. That is, the radius $r_3$ of the circular shape is preferably 0.43 times or more and 0.44 times or less of the lattice spacing a. For M-point oscillation, the Fourier coefficient of the circular shape is zero when the radius $r_3$ has a certain value in the range from 0.43 times to 0.44 times the lattice spacing a. Therefore, in this case, the Fourier coefficient of the planar shape of the modified refractive index region 25*b* can be brought close to zero, and one-dimensional local oscillation can be reduced more effectively.

Seventh Modification

The fifth and sixth modifications described above have exemplified the case where the phase modulation layer 25A oscillates at the M point. In this case, distribution of the angle θ may satisfy the condition that the light beam Lout is outputted in a direction intersecting the X-Y plane (reference surface), that is, in the Z-axis direction or a direction inclined to the Z-axis direction. As shown in FIG. 26, when considering the reciprocal lattice space in the phase modulation layer 25A, four-direction in-plane wavenumber vectors K6 to K9 that undergo phase modulation with distribution of the angle θ and each form a standing wave including a wavenumber spread SP corresponding to the angle spread of the output beam pattern are formed. The condition that the light beam Lout is outputted in the direction intersecting the X-Y plane is that, for example, the magnitude of at least one of the four-direction in-plane wavenumber vectors K6 to K9 is smaller than $2\pi/\lambda$ (light line). This point will be described in detail below.

Figure 30:
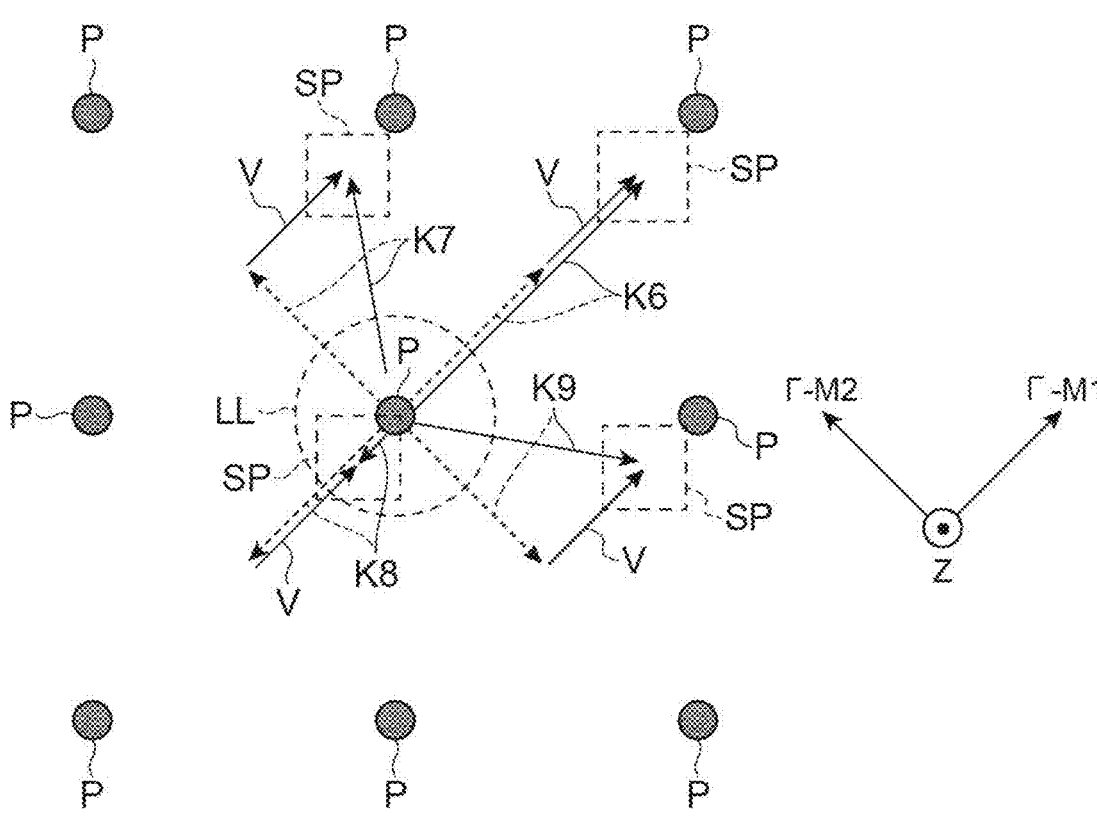
FIG. 30 is a conceptual diagram for describing an operation of adding a diffraction vector having a certain magnitude and orientation to four in-plane wavenumber vectors.

In the present modification, by applying the following ingenious way to the phase modulation layer 25A in a substantially periodic structure that oscillates at the M point, part of the +1st-order light and the −1st-order light is outputted without output of the zero-order light. Specifically, as shown in FIG. 30, by adding a diffraction vector V having a certain magnitude and orientation to the in-plane wavenumber vectors K6 to K9, the magnitude of at least one of the in-plane wavenumber vectors K6 to K9 (in-plane wavenumber vector K8 in the figure) is made smaller than $2\pi/\lambda$. In other words, at least one of the in-plane wavenumber vectors K6 to K9 after the diffraction vector V is added (in-plane wavenumber vector K8) fits within a circular region (light line) LL with a radius of $2\pi/\lambda$. In FIG. 30, the in-plane wavenumber vectors K6 to K9 indicated by dashed lines represent before addition of the diffraction vector V, and the in-plane wavenumber vectors K6 to K9 indicated by solid lines represent after addition of the diffraction vector V. The light line LL corresponds to the total reflection condition, and a wavenumber vector whose magnitude fits within the light line LL has a component of the direction perpendicular to the plane (Z-axis direction). In one example, the direction of the diffraction vector V is along the Γ-M1 axis or the Γ-M2 axis, and the magnitude is in the range from $2\pi/(2^{1/2})a-2\pi/\lambda$, to $2\pi/(2^{1/2})a+2\pi/\lambda$, and is $2\pi/(2^{1/2})a$ as one example.

The magnitude and orientation of the diffraction vector V for keeping at least one of the in-plane wavenumber vectors K6 to K9 within the light line LL will be examined. The following Formula (15) to Formula (18) show the in-plane wavenumber vectors K6 to K9 before the diffraction vector V is added, respectively.

$$K6 = \left(\frac{\pi}{a} + \Delta kx, \frac{\pi}{a} + \Delta ky\right) \tag{15}$$

$$K7 = \left(-\frac{\pi}{a} + \Delta kx, \frac{\pi}{a} + \Delta ky\right) \tag{16}$$

$$K8 = \left(-\frac{\pi}{a} + \Delta kx, -\frac{\pi}{a} + \Delta ky\right) \tag{17}$$

$$K9 = \left(\frac{\pi}{a} + \Delta kx, -\frac{\pi}{a} + \Delta ky\right) \tag{18}$$

Note that spreads $\Delta kx$ and $\Delta ky$ of the wavenumber vector satisfy the following Formula (19) and Formula (20), respectively. The maximum value of the X-axis spread $\Delta kx_{max}$ and the maximum value of the Y-axis spread $\Delta k_{max}$ of the in-plane wavenumber vector are defined by the design angular spread of the output beam pattern.

$$-\Delta kx_{max} \leq \Delta kx \leq \Delta kx_{max} \tag{19}$$

$$-\Delta ky_{max} \leq \Delta ky \leq \Delta ky_{max} \tag{20}$$

Here, when the diffraction vector V is represented by the following Formula (21), the in-plane wavenumber vectors K6 to K9 after the diffraction vector V is added are represented by the following Formula (22) to Formula (25).

$$V = (Vx, Vy) \tag{21}$$

-continued $$K6 = \left(\frac{\pi}{a} + \Delta kx + Vx, \frac{\pi}{a} + \Delta ky + Vy\right) \tag{22}$$

$$K7 = \left(-\frac{\pi}{a} + \Delta kx + Vx, \frac{\pi}{a} + \Delta ky + Vy\right) \tag{23}$$

$$K8 = \left(-\frac{\pi}{a} + \Delta kx + Vx, -\frac{\pi}{a} + \Delta ky + Vy\right) \tag{24}$$

$$K9 = \left(\frac{\pi}{a} + \Delta kx + Vx, -\frac{\pi}{a} + \Delta ky + Vy\right) \tag{25}$$

In the above Formula (22) to Formula (25), when considering that any of the wavenumber vectors K6 to K9 fits within the light line LL, the relationship of the following Formula (26) holds.

$$\left(\pm\frac{\pi}{a} + \Delta kx + Vx\right)^2 + \left(\pm\frac{\pi}{a} + \Delta ky + Vy\right)^2 < \left(\frac{2\pi}{\lambda}\right)^2 \tag{26}$$

That is, by adding the diffraction vector V that satisfies Formula (26), any of the wavenumber vectors K6 to K9 fits within the light line LL, and part of the +1st-order light and the −1st-order light is outputted.

Figure 31:
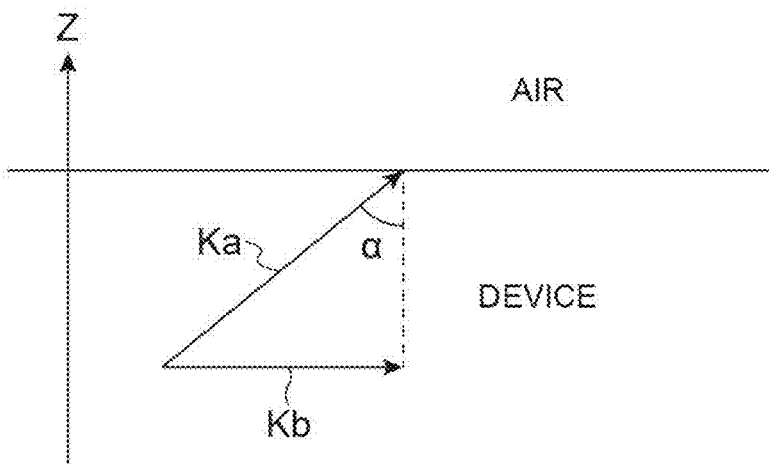
FIG. 31 is a diagram for schematically describing peripheral structure of a light line.

Note that the magnitude (radius) of the light line LL is set to $2\pi/\lambda$ for the following reason. FIG. 31 is a diagram for schematically describing peripheral structure of the light line LL, and shows the boundary between a device and the air as seen from a direction perpendicular to the Z-axis direction. The magnitude of the wavenumber vector of light in vacuum is $2\pi/\lambda$. When light propagates through the device medium as shown in FIG. 31, the magnitude of a wavenumber vector Ka in the medium of the refractive index n is $2\pi/\lambda$. At this time, in order for the light to propagate through the boundary between the device and the air, wavenumber components parallel to the boundary need to be continuous (wavenumber conservation law). When the wavenumber vector Ka and the Z axis form an angle $\alpha$ in FIG. 31, the length of the wavenumber vector (that is, in-plane wavenumber vector) Kb projected onto the plane is $(2\pi n/\lambda)\sin \alpha$. Meanwhile, in general, from the relationship of the refractive index of the medium $n>1$, the wavenumber conservation law does not hold at an angle where the in-plane wavenumber vector Kb in the medium is greater than $2\pi/\lambda$. At this time, the light is totally reflected and cannot be taken out to the air side. The magnitude of the wavenumber vector corresponding to this total reflection condition is the magnitude of the light line LL, which is $2\pi/\lambda$.

As one example of a specific method for adding the diffraction vector V to the in-plane wavenumber vectors K6 to K9, a method for superimposing an angular distribution $\theta_2(x, y)$ unrelated to the output beam pattern on an angular distribution $\theta_1(x, y)$, which is phase distribution according to the output beam pattern, is considered. In this case, the angular distribution $\theta(x, y)$ of the phase modulation layer 25A is represented as the following Formula:

$\theta(x, y)=\theta_1(x, y)+\theta_2(x, y)$. $\theta_1(x, y)$ corresponds to the phase of the complex amplitude when the output beam pattern undergoes Fourier transform, as described above. $\theta_2(x, y)$ is an angular distribution for adding the diffraction vector V that satisfies the above Formula (26). FIG. 32 is a diagram conceptually showing one example of the angular distribution $\theta_2(x, y)$. As shown in FIG. 32, in this example, a first phase value $\varphi_A$ and a second phase value $\varphi_B$ different from the first phase value $\varphi_A$ are arranged in a checkered pattern. In one example, the phase value $\varphi_A$ is 0 (rad) and the phase value $\varphi_B$ is $\pi$ (rad). That is, the first phase value $\varphi_A$ and the second phase value $\varphi_B$ change by $\pi$. By the angular distribution $\theta_2(x,y)$ corresponding to such a phase value, the diffraction vector V along the $\Gamma$-M1 axis or the $\Gamma$-M2 axis can be suitably implemented. When the first phase value (pa and the second phase value $\varphi_B$ are arranged in a checkerboard pattern as described above, as V=($\pm\pi$/a, $\pm\pi$/a), the wavenumber vectors K6 to K9 in FIG. 26 are exactly offset. Note that the angular distribution $\theta_2(x,y)$ of the diffraction vector V is represented by an inner product of the diffraction vector V(Vx,Vy) and the position vector r(x,y), and is given by the following Formula:

$$\theta_2(x,y)=Vxr=Vxx+Vyy.$$

As described above, since the light propagating in the optical diffraction layer is normally totally reflected in the standing wave state of M-point oscillation, light outputted in the direction intersecting the X-Y plane is suppressed. However, in the phase modulation layer 25A of the present modification, the center of gravity G of each of the plurality of modified refractive index regions 25b is placed away from the corresponding lattice point O(x,y) of the virtual square lattice, the angle $\theta$ of the vector connecting the corresponding lattice point O(x,y) to the center of gravity G is set individually for each modified refractive index region 25b, and distribution of the angle $\theta$ satisfies the condition that the light beam Lout is outputted in the direction intersecting the X-Y plane. Such a structure allows output of the laser beam Lout in the direction intersecting the X-Y plane.

As in the present modification, the condition for M-point oscillation may be that the magnitude of at least one of the four-direction in-plane wavenumber vectors K6 to K9 each including the wavenumber spread due to distribution of the angle $\theta$ is smaller than $2\pi/\lambda$ (light line) on the reciprocal lattice space of the phase modulation layer 25A. When the magnitude of at least one in-plane wavenumber vector is smaller than $2\pi/\lambda$ (light line), the in-plane wavenumber vector has a component of the Z-axis direction and total reflection does not occur at the interface with the air, and therefore part of the laser beam can be outputted in the direction intersecting the X-Y plane.

Note that the phase modulation layer 25A of the present modification may emit not only the +1st-order light and the −1st-order light but also higher-order light of second-order or higher. In such a case, by inclining the emission direction of the +1st-order light and the −1st-order light with respect to the direction perpendicular to the plane (Z-axis direction), the emission direction of higher-order light can be different from that of the +1st-order light and the −1st-order light, and the +1st-order light and the −1st-order light can be easily separated from the higher-order light. By setting the angle formed between the emission direction of the higher-order light and the Z-axis direction to be equal to or greater than the angle of total reflection, it is also possible not to output the higher-order light.

Eighth Modification

In the seventh modification described above, when the wavenumber spread based on the distribution of the angle $\theta$ is included in a circle with a radius $\Delta k$ centered on a certain point on the wavenumber space, it is also possible to consider simply as follows. That is, in the seventh modification described above, by adding the diffraction vector V to the four-direction in-plane wavenumber vectors K6 to K9, the magnitude of at least one of the four-direction in-plane wavenumber vectors K6 to K9 is made smaller than $2\pi/\lambda$ (light line LL). This is synonymous with making the magnitude of at least one of the four-direction direction in-plane wavenumber vectors K6 to K9 smaller than a value obtained by subtracting the wavenumber spread $\Delta k$ from $2\pi/\lambda\{(2\pi/\lambda)-\Delta k\}$, by adding the diffraction vector V to the four-direction in-plane wavenumber vectors K6 to K9 excluding the wavenumber spread $\Delta k$ (that is, four-direction in-plane wavenumber vectors in the square lattice PCSEL of M-point oscillation, see FIG. 25).

Figure 33:
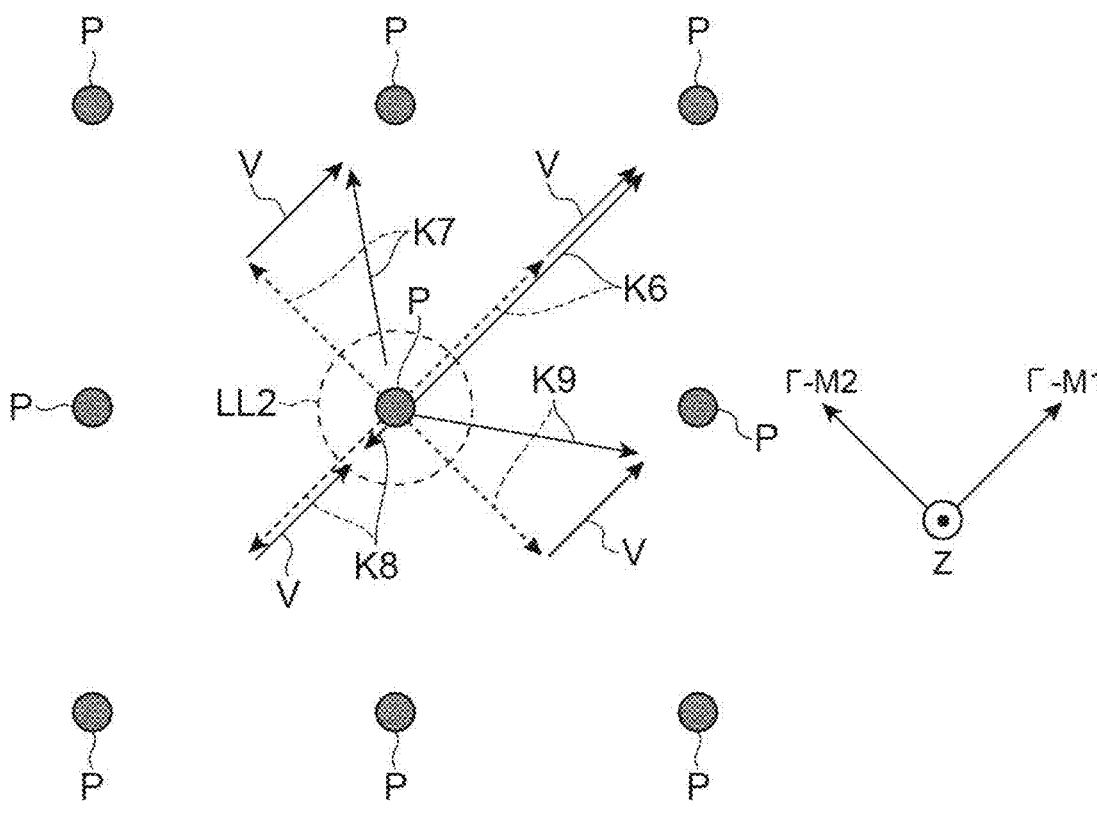
FIG. 33 is a conceptual diagram for describing an operation of adding the diffraction vector to in-plane wavenumber vectors in four directions from which a wavenumber spread is removed.

FIG. 33 is a diagram conceptually showing the above-described operation. As shown in FIG. 33, by adding the diffraction vector V to the in-plane wavenumber vectors K6 to K9 excluding the wavenumber spread $\Delta k$, the magnitude of at least one of the in-plane wavenumber vectors K6 to K9 is made smaller than $\{(2\pi/\lambda)-\Delta k\}$. In the figure, a region LL2 is a circular region with the radius of $\{(2\pi/\lambda)-\Delta k\}$. Note that in FIG. 33, the in-plane wavenumber vectors K6 to K9 indicated by dashed lines represent before addition of the diffraction vector V, and the in-plane wavenumber vectors K6 to K9 indicated by solid lines represent after addition of the diffraction vector V. The region LL2 corresponds to the total reflection condition, and a wavenumber vector whose magnitude fits within the region LL2 propagates in the direction perpendicular to the plane (Z-axis direction) as well.

The present modification describes the magnitude and orientation of the diffraction vector V to fit at least one of the in-plane wavenumber vectors K6 to K9 within the region LL2. The following Formula (27) to Formula (30) show the in-plane wavenumber vectors K6 to K9 before the diffraction vector V is added, respectively.

$$K6 = \left(\frac{\pi}{a}, \frac{\pi}{a}\right) \tag{27}$$

$$K7 = \left(-\frac{\pi}{a}, \frac{\pi}{a}\right) \tag{28}$$

$$K8 = \left(-\frac{\pi}{a}, -\frac{\pi}{a}\right) \tag{29}$$

$$K9 = \left(\frac{\pi}{a}, -\frac{\pi}{a}\right) \tag{30}$$

Here, when the diffraction vector V is represented by above Formula (21), the in-plane wavenumber vectors K6 to K9 after the diffraction vector V is added are represented by the following Formula (31) to Formula (34), respectively.

$$K6 = \left(\frac{\pi}{a} + Vx, \frac{\pi}{a} + Vy\right) \tag{31}$$

$$K7 = \left(-\frac{\pi}{a} + Vx, \frac{\pi}{a} + Vy\right) \tag{32}$$

$$K8 = \left(-\frac{\pi}{a} + Vx, -\frac{\pi}{a} + Vy\right) \tag{33}$$

$$K9 = \left(\frac{\pi}{a} + Vx, -\frac{\pi}{a} + Vy\right) \tag{34}$$

In the above Formula (31) to Formula (34), when considering that any of the in-plane wavenumber vectors K6 to K9 fits within the region LL2, the relationship of the following Formula (35) holds.

$$\left(\pm\frac{\pi}{a} + Vx\right)^2 + \left(\pm\frac{\pi}{a} + Vy\right)^2 < \left(\frac{2\pi}{\lambda} - \Delta k\right)^2 \tag{35}$$

That is, by adding the diffraction vector V that satisfies Formula (35), any of the in-plane wavenumber vectors K6 to K9 excluding the wavenumber spread $\Delta k$ fits within the region LL2. Even in such a case, it is possible to output part of the +1st-order light and the −1st-order light without outputting the zero-order light.

The semiconductor laser element according to the present disclosure is not limited to the embodiments described above, and various modifications are possible. For example, the above-described embodiments have exemplified the semiconductor laser element comprised of GaAs-based, InP-based, and nitride-based (especially GaN-based) compound semiconductors, but the present disclosure can be applied to the semiconductor laser element comprised of various semiconductor materials other than these materials.

REFERENCE SIGNS LIST 1A semiconductor laser element
10 substrate
11 main surface
12 back surface
21 semiconductor laminated part
23 lower cladding layer
24 active layer
25A phase modulation layer
25a base layer
25b modified refractive index region
25B photonic crystal layer
26 upper cladding layer
27 contact layer
28,29 electrode
31 anti-reflective film
32 protective film
151, 152, 161, 171 arc
153, 154, 162, 163, 173, 174 line segment
172 recess portion
181 inner circle
182 outer circle
B1 basic reciprocal lattice vector
FR image region
G center of gravity
K1 to K4, K6 to K9 in-plane wavenumber vector
Ka, Kb wavenumber vector
LL light line
LL2 region
LM beam pattern
Lout laser beam
O lattice point
Q center
R unit constituent region
RIN inner region
ROUT outer region
P wavenumber spread
V diffraction vector

The invention claimed is:

1. A semiconductor laser element comprising:
a substrate having a main surface; and
a light-emitting layer and a phase modulation layer provided on the substrate in a state of being laminated along a normal direction of the main surface, wherein
the phase modulation layer includes: a base layer; and a plurality of modified refractive index regions each having a refractive index different from a refractive index of the base layer and arranged in a two-dimensional shape on a reference surface orthogonal to the normal direction, in a virtual square lattice set on the reference surface, the plurality of modified refractive index regions is associated one-to-one with lattice points of the virtual square lattice,
each of the plurality of modified refractive index regions is arranged in a state where a center of gravity is physically separated from a corresponding lattice point out of the lattice points of the virtual square lattice, and an angle of a vector connecting the corresponding lattice point to the center of gravity with respect to the virtual square lattice is set individually for each of the plurality of modified refractive index regions,
a lattice spacing a of the virtual square lattice and a light emission wavelength $\lambda$ of the light-emitting layer satisfy a condition for $\Gamma$-point oscillation,
a (m1, n1)-order Fourier coefficient of an annular shape or a circular shape depending on a size of the annular shape or the circular shape obtained by virtually rotating each of the plurality of modified refractive index regions by one lap with the corresponding lattice point as a rotation center includes (−2,0)-order, (+2,0)-order, (0,−2)-order, and (0,+2)-order four Fourier coefficients, and
a position of the center of gravity of each of the plurality of modified refractive index regions is set to make an absolute value of the (m1, n1)-order Fourier coefficient of the annular shape or the circular shape 0.01 or less, or 20% or less of a maximum peak value the (m1, n1)-order Fourier coefficient of the circular shape is able to take.

2. The semiconductor laser element according to claim 1, wherein
the (m1, n1)-order Fourier coefficient of the annular shape or the circular shape is zero.

3. The semiconductor laser element according to claim 1, wherein
a ratio ($F_2/F_1$) of a (m1, n1)-order Fourier coefficient $F_1$ of an inner circle that defines the annular shape to a (m1, n1)-order Fourier coefficient $F_2$ of an outer circle that defines the annular shape is 0.99 or more and 1.01 or less.

4. The semiconductor laser element according to claim 3, wherein
the Fourier coefficient $F_1$ and the Fourier coefficient $F_2$ are equal to each other.

5. The semiconductor laser element according to claim 3, wherein
a radius of the inner circle is smaller than 0.19 times the lattice spacing a, and a radius of the outer circle is greater than 0.19 times the lattice spacing a.

6. The semiconductor laser element according to claim 3, wherein
a radius of the inner circle is smaller than 0.44 times the lattice spacing a, and a radius of the outer circle is greater than 0.44 times the lattice spacing a.

7. The semiconductor laser element according to claim 1, wherein
a radius of the circular shape is 0.30 times or more and 0.31 times or less of the lattice spacing a.

8. The semiconductor laser element according to claim 1, wherein
a planar shape of each of the plurality of modified refractive index regions is a C shape with the corresponding lattice point as a center of inner and outer arcs.

9. The semiconductor laser element according to claim 1, wherein a planar shape of each of the modified refractive index regions is a circle with the corresponding lattice point located outside.

10. The semiconductor laser element according to claim 1, wherein a planar shape of each of the plurality of modified refractive index regions is a polygon with the corresponding lattice point located outside.

11. The semiconductor laser element according to claim 1, wherein a planar shape of each of the plurality of modified refractive index regions is a fan shape with the corresponding lattice point as a center of an arc, and the arc is a major arc.

12. The semiconductor laser element according to claim 1, wherein a planar shape of each of the plurality of modified refractive index regions is a circle with the corresponding lattice point located inside.

13. The semiconductor laser element according to claim 1, wherein a planar shape of each of the plurality of modified refractive index regions is a polygon with the corresponding lattice point located inside.

14. A semiconductor laser element comprising:

a substrate having a main surface; and a light-emitting layer and a photonic crystal layer provided on the substrate in a state of being laminated along a normal direction of the main surface, wherein the photonic crystal layer includes: a base layer; and a plurality of modified refractive index regions each having a refractive index different from a refractive index of the base layer and arranged in a two-dimensional shape on a reference surface orthogonal to the normal direction, in a virtual square lattice set on the reference surface, each of the plurality of modified refractive index regions is arranged such that a center of gravity is located on a corresponding lattice point out of lattice points of the virtual square lattice, a lattice spacing a of the virtual square lattice and a light emission wavelength $\lambda$ of the light-emitting layer satisfy a condition for T-point oscillation, each of the plurality of modified refractive index regions has an annular shape or a circular shape with the corresponding lattice point as a center, a (m1, n1)-order Fourier coefficient of the annular shape or the circular shape depending on a size of the annular shape or the circular shape includes (−2,0)-order, (+2,0)-order, (0,−2)-order, and (0,+2)-order four Fourier coefficients, and a position of the center of gravity of each of the plurality of modified refractive index regions is set to make an absolute value of the (m1, n1)-order Fourier coefficient of the annular shape or the circular shape 0.01 or less, or 20% or less of a maximum peak value the (m1, n1)-order Fourier coefficient of the circular shape is able to take.

15. The semiconductor laser element according to claim 14, wherein the (m1, n1)-order Fourier coefficient of the annular shape or the circular shape is zero.

16. The semiconductor laser element according to claim 14, wherein a ratio $(F_2/F_1)$ of a (m1, n1)-order Fourier coefficient $F_1$ of an inner circle that defines the annular shape to a (m1, n1)-order Fourier coefficient $F_2$ of an outer circle that defines the annular shape is 0.99 or more and 1.01 or less.

17. The semiconductor laser element according to claim 16, wherein the Fourier coefficient $F_1$ and the Fourier coefficient $F_2$ are equal to each other.

18. The semiconductor laser element according to claim 16, wherein a radius of the inner circle is smaller than 0.19 times the lattice spacing a, and a radius of the outer circle is greater than 0.19 times the lattice spacing a.

19. The semiconductor laser element according to claim 16, wherein a radius of the inner circle is smaller than 0.44 times the lattice spacing a, and a radius of the outer circle is greater than 0.44 times the lattice spacing a.

20. The semiconductor laser element according to claim 14, wherein a radius of the circular shape is 0.30 times or more and 0.31 times or less of the lattice spacing a.

21. A semiconductor laser element comprising:

a substrate having a main surface; and a light-emitting layer and a phase modulation layer provided on the substrate in a state of being laminated along a normal direction of the main surface, wherein the phase modulation layer includes: a base layer; and a plurality of modified refractive index regions each having a refractive index different from a refractive index of the base layer and arranged in a two-dimensional shape on a reference surface orthogonal to the normal direction, in a virtual square lattice set on the reference surface, the plurality of modified refractive index regions is associated one-to-one with lattice points of the virtual square lattice, each of the plurality of modified refractive index regions is arranged in a state where a center of gravity is physically separated from a corresponding lattice point out of the lattice points of the virtual square lattice, and an angle of a vector connecting the corresponding lattice point to the center of gravity with respect to the virtual square lattice is set individually for each of the plurality of modified refractive index regions, a lattice spacing a of the virtual square lattice and a light emission wavelength $\lambda$ of the light-emitting layer satisfy a condition for M-point oscillation, a (m2, n2)-order Fourier coefficient of an annular shape or a circular shape depending on a size of the annular shape or the circular shape obtained by virtually rotating each of the plurality of modified refractive index regions by one lap with the corresponding lattice point as a rotation center includes (−1,−1)-order, (+1,−1)-order, (−1,+1)-order, and (+1,+1)-order four Fourier coefficients, and a position of the center of gravity of each of the plurality of modified refractive index regions is set to make an absolute value of the (m2, n2)-order Fourier coefficient of the annular shape or the circular shape 0.01 or less, or 10% or less of a maximum peak value the (m2, n2)-order Fourier coefficient of the circular shape is able to take.

22. The semiconductor laser element according to claim 21, wherein angular distribution on the reference surface defined by the angle individually set for the plurality of modified refractive index regions satisfies a condition for light to be outputted in a direction intersecting the reference surface.

23. The semiconductor laser element according to claim 22, wherein the condition is defined by a magnitude of at least one of four-direction in-plane wavenumber vectors each including a wavenumber spread by the angular distribution being smaller than $2\pi/\lambda$ on a reciprocal lattice space of the phase modulation layer.

24. The semiconductor laser element according to claim 21, wherein the (m2, n2)-order Fourier coefficient of the annular shape or the circular shape is zero.

25. The semiconductor laser element according to claim 21, wherein a ratio ($F_2/F_1$) of a (m2, n2)-order Fourier coefficient $F_1$ of an inner circle that defines the annular shape to a (m2, n2)-order Fourier coefficient $F_2$ of an outer circle that defines the annular shape is 0.99 or more and 1.01 or less.

26. The semiconductor laser element according to claim 25, wherein the Fourier coefficient $F_1$ and the Fourier coefficient $F_2$ are equal to each other.

27. The semiconductor laser element according to claim 25, wherein a radius of the inner circle is smaller than 0.27 times the lattice spacing a, and a radius of the outer circle is greater than 0.27 times the lattice spacing a.

28. The semiconductor laser element according to claim 21, wherein a radius of the circular shape is 0.43 times or more and 0.44 times or less of the lattice spacing a.

29. The semiconductor laser element according to claim 21, wherein a planar shape of each of the plurality of modified refractive index regions is a C shape with the corresponding lattice point as a center of inner and outer arcs.

30. The semiconductor laser element according to claim 21, wherein a planar shape of each of the modified refractive index regions is a circle with the corresponding lattice point located outside.

31. The semiconductor laser element according to claim 21, wherein a planar shape of each of the plurality of modified refractive index regions is a polygon with the corresponding lattice point located outside.

32. The semiconductor laser element according to claim 21, wherein a planar shape of each of the plurality of modified refractive index regions is a fan shape with the corresponding lattice point as a center of an arc, and the arc is a major arc.

33. The semiconductor laser element according to claim 21, wherein a planar shape of each of the plurality of modified refractive index regions is a circle with the corresponding lattice point located inside.

34. The semiconductor laser element according to claim 21, wherein a planar shape of each of the plurality of modified refractive index regions is a polygon with the corresponding lattice point located inside.

35. A semiconductor laser element comprising:

a substrate having a main surface; and a light-emitting layer and a photonic crystal layer provided on the substrate in a state of being laminated along a normal direction of the main surface, wherein the photonic crystal layer includes: a base layer; and a plurality of modified refractive index regions each having a refractive index different from a refractive index of the base layer and arranged in a two-dimensional shape on a reference surface orthogonal to the normal direction, in a virtual square lattice set on the reference surface, each of the plurality of modified refractive index regions is arranged such that a center of gravity is placed on a corresponding lattice point out of lattice points of the virtual square lattice, a lattice spacing a of the virtual square lattice and a light emission wavelength $\lambda$ of the light-emitting layer satisfy a condition for M-point oscillation, each of the plurality of modified refractive index regions has an annular shape or a circular shape with the corresponding lattice point as a center, a (m2, n2)-order Fourier coefficient of the annular shape or the circular shape depending on a size of the annular shape or the circular shape includes (−1,−1)-order, (+1,−1)-order, (−1,+1)-order, and (+1,+1)-order four Fourier coefficients, and a position of the center of gravity of each of the plurality of modified refractive index regions is set to make an absolute value of the (m2, n2)-order Fourier coefficient of the annular shape or the circular shape is 0.01 or less, or 10% or less of a maximum peak value the (m2, n2)-order Fourier coefficient of the circular shape is able to take.

36. The semiconductor laser element according to claim 35, wherein the (m2, n2)-order Fourier coefficient of the annular shape or the circular shape is zero.

37. The semiconductor laser element according to claim 35, wherein a ratio ($F_2/F_1$) of a (m2, n2)-order Fourier coefficient $F_1$ of an inner circle that defines the annular shape to a (m2, n2)-order Fourier coefficient $F_2$ of an outer circle that defines the annular shape is 0.99 or more and 1.01 or less.

38. The semiconductor laser element according to claim 37, wherein the Fourier coefficient $F_1$ and the Fourier coefficient $F_2$ are equal to each other.

39. The semiconductor laser element according to claim 37, wherein a radius of the inner circle is smaller than 0.27 times the lattice spacing a, and a radius of the outer circle is greater than 0.27 times the lattice spacing a.

40. The semiconductor laser element according to claim 35, wherein a radius of the circular shape is 0.43 times or more and 0.44 times or less of the lattice spacing a.

* * * * *